US010770673B2

(12) United States Patent
Forrest et al.

(10) Patent No.: US 10,770,673 B2

(45) Date of Patent: Sep. 8, 2020

(54) HIGHLY RELIABLE STACKED WHITE ORGANIC LIGHT EMITTING DEVICE

(71) Applicant: THE REGENTS OF THE UNIVERSITY OF MICHIGAN, Ann Arbor, MI (US)

(72) Inventors: Stephen R. Forrest, Ann Arbor, MI (US); Caleb Coburn, Ypsilanti, MI (US); Changyeong Jeong, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 16/200,895

(22) Filed: Nov. 27, 2018

(65) Prior Publication Data

US 2019/0165294 A1 May 30, 2019

Related U.S. Application Data

(60) Provisional application No. 62/591,262, filed on Nov. 28, 2017.

(51) Int. Cl.

*H01L 51/50* (2006.01)

*H01L 51/52* (2006.01)

(52) U.S. Cl.

CPC ........ *H01L 51/5044* (2013.01); *H01L 51/504* (2013.01); *H01L 51/5068* (2013.01); *H01L 51/5076* (2013.01); *H01L 51/5084* (2013.01); *H01L 51/5278* (2013.01); *H01L 2251/5346* (2013.01)

(58) Field of Classification Search

CPC ............. H01L 51/5044; H01L 51/5068; H01L 51/5076; H01L 51/5084

See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |

(Continued)

FOREIGN PATENT DOCUMENTS

| | | |
|---|---|---|
| EP | 1238981 | 9/2002 |
| JP | 2010135467 | 6/2010 |

(Continued)

OTHER PUBLICATIONS

Baldo et al.Highly efficient phosphorescent emission from organic electroluminescent devices, Nature, vol. 395, pp. 151-154, 1998.

(Continued)

*Primary Examiner* — Ida M Soward

(74) *Attorney, Agent, or Firm* — Morris & Kamlay LLP

(57) ABSTRACT

An organic light emitting device (OLED) is provided that includes a cathode and an anode; a blue emitting layer; and at least two hybrid red/green emitting layers. One of the at least two hybrid red/green emitting layers is a cathode side, red/green emitting layer that is disposed between the cathode and the blue emitting layer. The second of the at least two hybrid red/green emitting layers is an anode side, red/green emitting layer that is disposed between the blue emitting layer and the anode. The OLED emits white light.

21 Claims, 10 Drawing Sheets

(56) References Cited

U.S. PATENT DOCUMENTS

| | | | | |
|---|---|---|---|---|
| 5,707,745 | A | 1/1998 | Forrest | |
| 5,834,893 | A | 11/1998 | Bulovic | |
| 5,844,363 | A | 12/1998 | Gu | |
| 6,013,982 | A | 1/2000 | Thompson | |
| 6,087,196 | A | 7/2000 | Sturm | |
| 6,091,195 | A | 7/2000 | Forrest | |
| 6,097,147 | A | 8/2000 | Baldo | |
| 6,294,398 | B1 | 9/2001 | Kim | |
| 6,303,238 | B1 | 10/2001 | Thompson | |
| 6,337,102 | B1 | 1/2002 | Forrest | |
| 6,468,819 | B1 | 10/2002 | Kim | |
| 7,279,704 | B2 | 10/2007 | Walters | |
| 7,431,968 | B1 | 10/2008 | Shtein | |
| 7,935,963 | B2 * | 5/2011 | Anandan | H01L 27/3209 257/40 |
| 7,968,146 | B2 | 6/2011 | Wagner | |
| 8,288,187 | B2 * | 10/2012 | Cheon | H01L 51/0003 438/46 |
| 8,766,291 | B2 * | 7/2014 | Forrest | H01L 51/5016 257/89 |
| 8,777,291 | B2 | 7/2014 | McNeely | |
| 9,331,299 | B2 * | 5/2016 | Xu | H01L 51/504 |
| 9,887,376 | B2 * | 2/2018 | Park | H01L 51/5036 |
| 9,997,739 | B2 * | 6/2018 | Song | H01L 51/5278 |
| 10,243,023 | B2 * | 3/2019 | Hack | H01L 51/5265 |
| 10,510,973 | B2 * | 12/2019 | Yamamoto | H01L 51/504 |
| 2003/0230980 | A1 | 12/2003 | Forrest | |
| 2004/0174116 | A1 | 9/2004 | Lu | |
| 2006/0006792 | A1 | 1/2006 | Strip | |
| 2006/0279203 | A1 | 12/2006 | Forrest | |
| 2007/0035240 | A1 | 2/2007 | Yang | |
| 2008/0309227 | A1 | 12/2008 | Che | |
| 2009/0146552 | A1 | 6/2009 | Spindler | |
| 2009/0294778 | A1 | 12/2009 | Mitsuya | |
| 2010/0078631 | A1 | 4/2010 | Pieh | |
| 2010/0314612 | A1 | 12/2010 | Lee | |
| 2013/0026452 | A1 | 1/2013 | Kottas | |
| 2013/0119354 | A1 | 5/2013 | Ma | |
| 2013/0320837 | A1 * | 12/2013 | Weaver | H05B 33/14 313/504 |
| 2014/0084269 | A1 * | 3/2014 | Weaver | H01L 27/3209 257/40 |
| 2015/0034923 | A1 * | 2/2015 | Kim | H01L 51/5044 257/40 |
| 2015/0060922 | A1 | 3/2015 | Wilcox | |
| 2015/0102331 | A1 | 4/2015 | Seo | |
| 2015/0188067 | A1 | 7/2015 | Lee | |
| 2015/0280160 | A1 | 10/2015 | Lee | |
| 2015/0357596 | A1 * | 12/2015 | Loebl | H01B 1/04 257/40 |
| 2016/0181560 | A1 | 6/2016 | Yamamoto | |
| 2017/0155070 | A1 * | 6/2017 | Han | H01L 27/3209 |
| 2017/0229663 | A1 | 8/2017 | Tsai | |
| 2019/0165278 | A1 * | 5/2019 | Xia | H01L 51/0061 |

FOREIGN PATENT DOCUMENTS

| | | | |
|---|---|---|---|
| WO | 2004111066 | | 12/2004 |
| WO | 2008044723 | | 4/2008 |
| WO | 2008057394 | A1 | 5/2008 |
| WO | 2010011390 | A2 | 1/2010 |
| WO | 2010111175 | | 9/2010 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Zheng,, T. and Choy, W. C. H. High efficiency blue organic LEDs achieved by an integrated fluorescence-interlayer-phosphorescence emission architecture. Adv. Funct. Mater. 20 (2010) 648-655 (Year 2010).

Sun, S. S. and Dalton, L. R. (eds) Introduction to Organic Electronic and Optoelectronic Materials and Devices. CRC Press, Boca Raton, FL (2008) 366-371.

Yang SH, Shih, PJ, and Wu, WJ. Electroluminescence of fluorescent-phosphorescent organic light-emitting diodes with regular, inverted, and symmetrical structures. Optical Materials, 37 (2014) 376-381.

Lee, YH, et al. Balancing the white emission of OLED by a design of fluorescent blue and phosphorescent green/red emitting layer structures. Synthetic Metals, 159 (2009) 325-330.

* cited by examiner

HIGHLY RELIABLE STACKED WHITE ORGANIC LIGHT EMITTING DEVICE

CROSS-REFERENCE TO RELATED APPLICATIONS

This application claims priority under 35 U.S.C. § 119(e) to U.S. provisional application No. 62/591,262, filed Nov. 28, 2017, the entire contents of which are incorporated herein by reference.

GOVERNMENT RIGHTS

This invention was made with government support under DE-EE0007077 awarded by the U.S. Department of Energy. The government has certain rights in the invention.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The invention relates to organic light emitting devices that emit white light, and lighting applications of such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

More details on OLEDs, and the definitions described above, can be found in U.S. Pat. No. 7,279,704, which is incorporated herein by reference in its entirety.

OLEDs with stacked multiple emissive layers are known and have been reported to produce white light, particularly, for commercial and residential lighting applications. See, for example, U.S. Pub. No. 2006/0006792 to Strip, and U.S. Pat. No. 8,777,291, assigned to Universal Display Corporation. In the UDC '291 patent, calculations showed that the light emitted for a stacked white OLED is a function of both the wavelength and the source position of the individual light emitting layers. Results indicate that R, G, and B subelements, arranged in different orders, have different extraction efficiencies and thus yield different color temperature and color rending indices (CRI) with other parameters staying the same. The emitting layer order of B-G-R (with R adjacent to the ITO anode) is said to lead to an optimal color balance.

U.S. Pub. No. 2007/0035240 to Yang et al. describes a stacked white OLED with a blue emitting layer sandwiched by two symmetric red layers, See, Table 1 of Yang. Tang sought to stabilize color temperature of the light with variation in lighting intensity and seeks to solve this problem by positioning red light-emitting layer on both sides of a blue light-emitting layer. Yang identifies select WOLED with the following emitting layer profiles red-blue-red, red-green-red, red-green-blue-green-red, red-green-blue-red, red-blue-green-red, blue-red-green-red-blue, or blue-green-red-blue. Moreover, Yang finds that if the two outermost emitting layers provide the same or similar color light, the WOLED has greater color stability.

SUMMARY

An organic light emitting device (OLED) comprising: a cathode and an anode; a blue emitting layer; and at least two hybrid red/green emitting layers. One of the at least two hybrid red/green emitting layers is a cathode side, hybrid red/green emitting layer that is disposed between the cathode and the blue emitting layer. The other of the at least two hybrid red/green emitting layers is an anode side, hybrid red/green emitting layer that is disposed between the blue emitting layer and the anode. The OLED emits white light.

The invention is also directed to a stacked white-light emitting OLED comprising an anode, a cathode, and disposed between the anode and the cathode are at least two hybrid red/green emitting layers. Each hybrid red/green emitting layer has a cathode side and an anode side, and includes a mixed red/green emitting sublayer and an adjacent green emitting sublayer, the mixed red/green emitting sublayer proximate to the anode side of the hybrid red/green emitting layer.

The invention is also directed to an organic light emitting device (OLED) comprising: a cathode and an anode; a blue emitting layer; at least three hybrid red/green emitting layers; and at least one red/green charge generating layer. The OLED requires that one of the three hybrid red/green emitting layers is a cathode side, hybrid red/green emitting layer disposed between the cathode and the blue emitting layer, and two of the at least three hybrid red/green emitting layers are anode side, hybrid red/green emitting layers disposed between the blue emitting layer and the anode. The at least one red/green charge generation layer separates the two anode side, hybrid red/green emitting layers. The blue emitting layer includes a gradient blue emitter concentration profile or a manager dopant, or a gradient blue emitter concentration profile and a manager dopant. Again, the OLED emits white light.

BRIEF DESCRIPTION OF THE DRAWINGS

FIG. 11 is a plot of lifetime values of the OLEDs of FIG. 7: FIG. 11A, 3-layer; FIG. 11B, 4-layer, FIG. 11C, 5-layer; each extrapolated to working luminance value of 1000 $cd/m^2$.

DESCRIPTION OF THE INVENTION

Electrophosphorescent white organic light emitting devices (WOLEDs) are of interest because they can be used to provide display backlighting for a flat panel display such as a phone or a TV panel, or provide foundation components for interior or exterior lighting systems, with very significant reductions in energy consumption for equivalent illumination output. WOLEDs have been shown to exceed incandescent bulbs in terms of power efficiencies and lifetimes. However, some present OLED designs can have a low color rendering index (about CRI 75), and some can exhibit significant efficiency roll-off at high brightness. Moreover, present WOLED design can result in a "pile-up" of excitons at the EML, which can cause enhanced triplet-triplet annihilation, and a consequent reduction in the overall power/light-output efficiency of the device.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
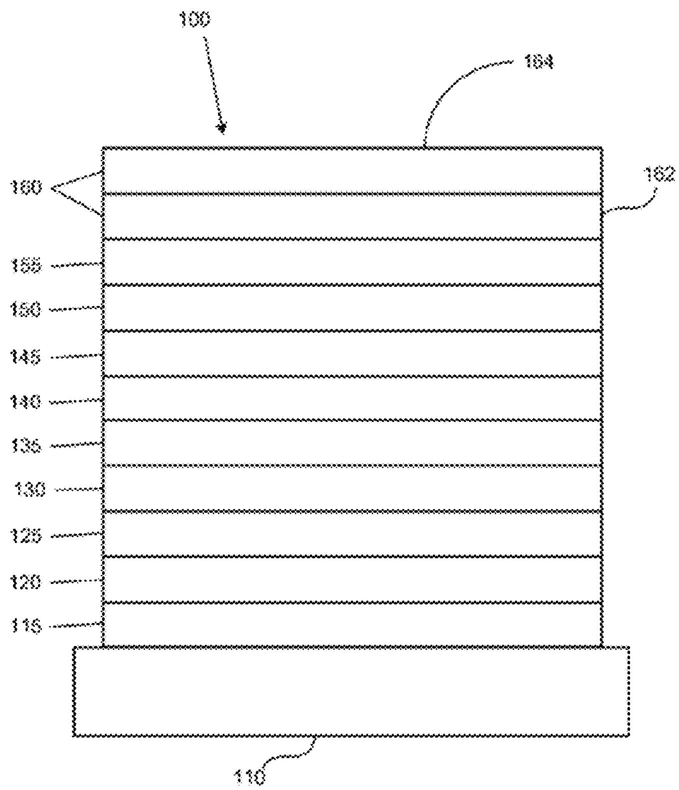
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
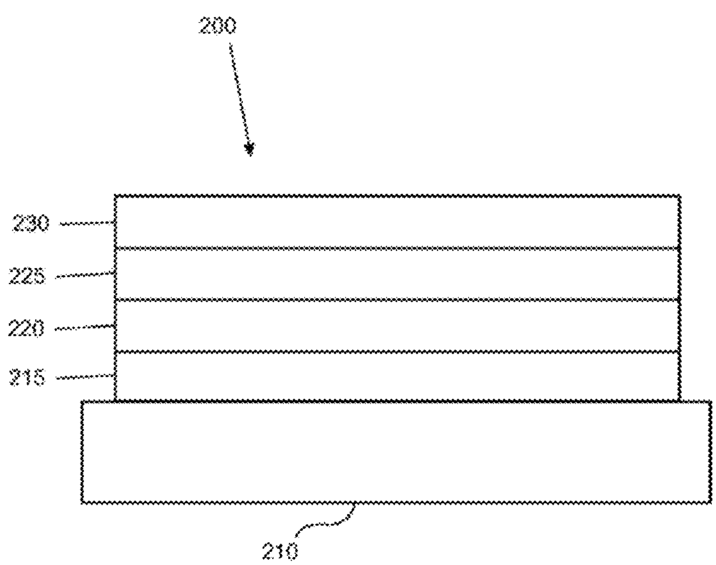
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Figure 3:
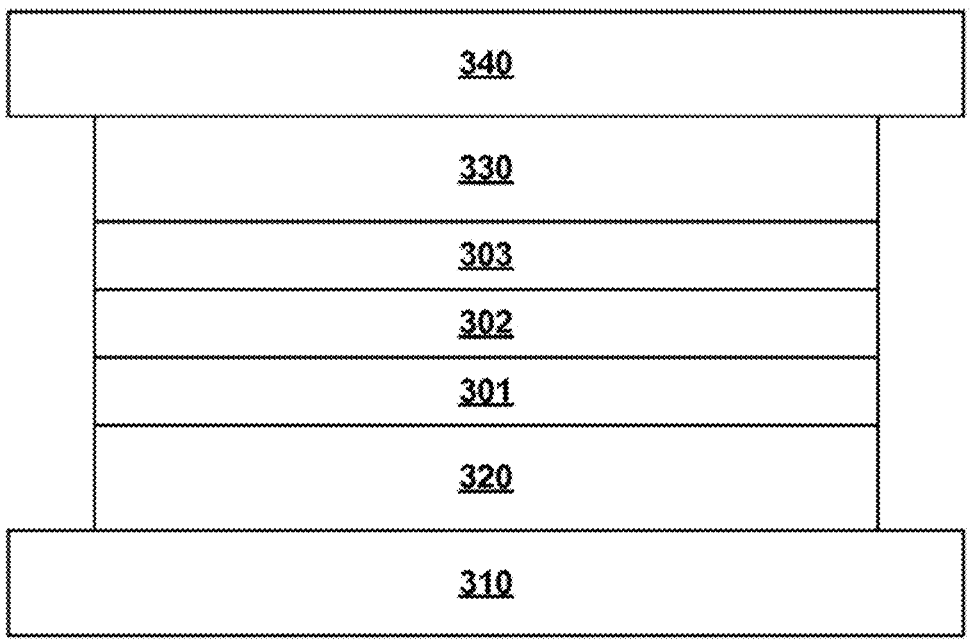
FIG. 3 shows a WOLED of the prior art with three separate emitting layers.

FIG. 3 shows a prior art WOLED with three emissive layers 301, 302, 303 disposed between a cathode 340 and an anode/substrate 310. The device may include other layers, e.g., 320 and 330, e.g., injection layers, blocking layers, and transport layers, and may be fabricated by stacking the layers as shown. Typically, each emissive layer 301, 302, 303 is designed or configured to emit a different wavelengths (color) of the visible spectrum. The three emissive layers 301, 302, 303 can emit, for example, red, green, and blue light, respectively. When viewed, the combined emission from the device will appear white. Moreover, each emissive layer is said to include a host material and a dopant. The host material for each emissive layer may be the same or it may be different. Any combination of dopants may be used in an emissive layer, though most WOLEDs tend to have a single dopant per emissive layer.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

We describe a WOLED that emits light with long device lifetime, preferred color rendering and light efficiency compared to WOLEDs of the art. The WOLED comprises a cathode and an anode, a blue emitting layer, and at least two hybrid red/green emitting layers. One of the at least two hybrid red/green emitting layers is a cathode side, hybrid red/green emitting layer disposed between the cathode and the blue emitting layer. The second of the at least two hybrid red/green emitting layers is an anode side, hybrid red/green emitting layer disposed between the blue emitting layer and the anode.

A "hybrid red/green emitting layer" includes a mixed red/green emitting sublayer and an adjacent green emitting sublayer, and emits light in the green and red regions of the visible spectrum. Each hybrid red/green emitting layer will have a cathode side proximate to or closer in distance to the cathode, and an anode side proximate to or closer in distance to the anode. Moreover, in each hybrid red/green layer the mixed red/green emitting sublayer is proximate to the anode side of the hybrid red/green emitting layer.

In one embodiment, the WOLED will further include an additional one or two anode side, hybrid red/green emitting layers, and a red/green charge generating layer(s) will separate the two or three anode side, hybrid red/green emitting layers. In another embodiment, at least one of the anode side, hybrid red/green emitting layer will include a red dopant blocking sublayer positioned to the cathode side of the green emitting sublayer.

In one embodiment, the WOLED further includes a blue-cathode, charge generating layer positioned between the cathode side, hybrid red/green emitting layer and the blue emitting layer, and adjacent to and in contact with a cathode side of the blue emitting layer. In some instances, it can be advantageous to include a blue-anode, charge generating layer adjacent to and in contact with the anode side of the blue emitting layer.

In one embodiment, the cathode side, hybrid red/green emitting layer has the same functional and compositional sublayers as the at least one anode side, hybrid red/green emitting layer. In another embodiment, each of the anode side, hybrid red/green emitting layers have the same functional and compositional sublayers, and one or more of these can have a red blocking layer.

In another embodiment, the cathode side, hybrid red/green emitting layer has different functional and compositional sublayers as the at least one anode side, hybrid red/green emitting layer. For example, the cathode side, hybrid red/green emitting layer need not have a red blocking layer.

In one embodiment, the green emitting dopant in the mixed red/green emitting sublayer is the same as the green emitting dopant in the green emitting sublayer. In another embodiment, the green emitting dopant in the mixed red/green emitting sublayer is different from the green emitting dopant in the green emitting sublayer.

In one embodiment, the anode side, hybrid red/green emitting layers includes a red dopant blocking sublayer positioned to the cathode side of the green emitting sublayer. Moreover, in some instances it can be advantageous to have one or both of the additional anode side, hybrid red/green emitting layers to include a red dopant blocking sublayer positioned to the cathode side of the green emitting sublayer.

In one embodiment, the WOLED will have two anode side, hybrid red/green emitting layers, and a color rendering index of 78-85. In another embodiment, the WOLED of the invention will have three anode side, hybrid red/green emitting layers, and a color rendering index of 84-91.

In one embodiment, the WOLED includes at least four distinct light emission layers and at least three charge generation layers in a stacked orientation, the charge generating layers positioned between each of the emission layers. The WOLED includes: a cathode and an anode; a blue emitting layer; and at least three hybrid red/green emitting layers. In regard to the at least three hybrid red/green emitting layers, at least one is a cathode side, hybrid red/green emitting layer that is disposed between the cathode and the blue emitting layer, and at least two are anode side, hybrid red/green emitting layers that are disposed between the blue emitting layer and the anode. The WOLED also includes a red/green charge generating layer that separates each of the at least two anode side, hybrid red/green emitting layers, and a cathode side, blue charge generating layer positioned between the cathode side, red/green emitting layer and the blue emitting layer. In select instances, an optional third hybrid anode side, red/green emitting layer is present, which is also separated from an adjacent hybrid red/green emitting layer by a red/green charge generating layer.

In one embodiment, the at least one anode side red/green emitting layer includes a red blocking sublayer to enhance the stability or efficiency of the hybrid red/green emitting layers. The red blocking sublayer is positioned proximate to the cathode side of the hybrid red/green emitting layer. At times, it could be advantageous to include a red blocking sublayer with the cathode-side, red/green emissive layer, however, the presence of such a red-blocking layer is not so important and not always necessary. It can be advantageous for the WOLED to also include a blue emitting layer with a graded dopant profile or a highly excited state manager, or optionally both a gradient profile and an excited state manager, to achieve long-lived blue emission in a WOLED. Another embodiment takes advantage of the optical and device enhancements provided by the first and second embodiments above, by combining the red blocking sublayer of the anode-side red/green emitting layers with the blue emitting layer having a graded dopant profile or excited state manager, each of which is described in greater detail below.

Hybrid Red/Green Emitting Layer

The anode side, hybrid red/green emitting layer(s) play an important role in achieving the observed device lifetime and light efficiency. As stated, the WOLED can have at least one, and preferably two, and more preferably three, hybrid red/green emitting layers with at least one, e.g., one to three, cathode side, hybrid red/green emitting layer(s). As stated, the number of anode side, hybrid red/green emitting layers is preferably at least two, e.g., from two to six. In each anode-side, hybrid red/green emitting layer there are at least two sublayers, i.e., a green emitting sublayer and a mixed red/green emitting sublayer. The two sublayers are adjacent to one another and their respective order in the red/green emitting layer is not so important. However, a preferred orientation of the two sublayers will have the mixed sublayer on the anode side of the hybrid red/green emitting layer and adjacent to the green emitting sublayer. A red blocking sublayer can then be positioned at the cathode side of the green emitting sublayer. Accordingly, the green emitting sublayer would be disposed between the red dopant blocking sublayer and the mixed red/green emitting sublayer.

The green emitting sublayer includes a green phosphorescent dopant, and the mixed red/green emitting sublayer includes a green phosphorescent and red phosphorescent dopant. The green dopants can be the same or different, preferably, the same in the two sublayers.

The at least one cathode-side, hybrid red/green emitting layer can have the same or different functional and compositional sublayers as the at least one anode side, hybrid red/green emitting layer.

As used herein, the term "red phosphorescent dopant" refers to a dopant within a host material with a peak emissive wavelength of from 580 nm to 680 nm, or from 600 nm to 660 nm, or from 615 nm to 635 nm. The term "green phosphorescent dopant" refers to a dopant within a host material with a peak emissive wavelength of 500 nm to 580 nm, or from 510 nm to 550 nm. For example, many compounds based on iridium(phenylpyridine) ligand complexes and iridium(phenylquinoline) ligand complexes and the many known substitutions on such ligands can be used as green and red dopants, respectively. See, Select Phosphorescent Emitter Dopants, infra.

As stated, the anode side, hybrid red/green emissive layer includes at least two emitting sublayers: a mixed red/green sublayer that includes an admixture of a red phosphorescent dopant and a green phosphorescent dopant; and a green sublayer, adjacent to and positioned on the cathode side the red/green sublayer. The red/green sublayer will have a thickness of 5 nm to 25 nm, preferably from 5 nm to 15 nm, and more preferably from 5 nm to 10 nm, and more often than not, will have a thickness that is less than the green sublayer. The green sublayer will have a thickness of 12 nm to 40 nm, preferably from 16 nm to 30 nm, and more preferably from 20 nm to 28 nm. More often than not the green sublayer will be 1.5× to 3.2× the thickness of the red/green sublayer. In total, the thickness of the green and red/green sublayers is from 20 nm to 55 nm, preferably from 25 nm to 45 nm, and more preferably from 30 nm to 40 nm.

The red or green phosphorescent dopants are typically present within the host material at a concentration of from 1% to 20% by weight, from 3% to 15% by weight, or from 3% to 10% by weight. However, there are instances in which the concentration of dopant is outside the above stated ranges depending upon the compound structure of dopant, the type of host material, the desired color temperature of light, and the commercial application for the WOLED. Accordingly, the concertation ranges above are not to further limit the subject matter claimed.

As noted above, one or more of the anode side, hybrid red/green emitting layers can include a red blocking sublayer, which is positioned on the cathode side of the emitting layer. The red blocking sublayer includes a red phosphorescent dopant, preferably the same red phosphorescent dopant that is present in the admixed red/green emissive sublayer. In one embodiment, the red blocking sublayer itself is partitioned into two or three sublayers, and to simplify manufacturing processing each of such sublayer includes the same electron transport-type (hole blocking) compound. Any known hole blocking compound can be used (see below), however, one preferred hole blocking compound for the sublayers is BAlq (aluminum(III)bis(2-methyl-8-hydroxyquinolinato).

One embodiment of a red blocking sublayer has the red dopant mixed into the hole blocking compound, which is then sandwiched on both sides with sublayers of the hole blocking compound. Another embodiment may include simply adjusting the thickness of a single red blocking layer along with the concentration of red dopant. Again, such a single sublayer would simplify the manufacturing process by reducing the number of processing steps and sublayers in the overall device.

Charge Generating Layer

In stacked WOLEDs, the charge generating layer often plays an important role in the performance and lifetime of the device. Charge generating layers include one or more n-doped layers and one or more p-doped layers for injection of electrons and holes, respectively. Consumed electrons and holes in the charge generating layer are refilled by the electrons and holes injected from the cathode and anode, respectively, and eventually the bipolar currents reach a steady state.

The red/green charge generating layers injects charge carriers into the adjacent anode side, hybrid red/green emitting layer—electrons moving from cathode to anode and holes moving from the anode to the cathode across each of the anode side, hybrid red/green emitting layers. Of interest as well, is to position a cathode side, blue charge generating layer between the cathode side, hybrid red/green emitting layer and the blue emitting layer. At times, the term "charge generating layer" is used in the specification and refers to either the red/green or blue charge generating layer. It is preferred that each of the red/green charge-generating layers include the same functional sublayers and material(s) composition, though not required that they do so. Moreover, the blue charge generating layer can include the same functional sublayers and material composition as the red/green charge generating layers. Alternatively, the blue charge generating layer can have different functional sublayers or material composition as the red/green charge generating layers. As will be understood by one skilled in the art, the "anode side" of a layer refers to the side (or interface) of the layer at which holes are expected to enter the layer. Similarly, a "cathode side" refers to the side of the layer to which electrons are expected to enter the layer.

The charge-generating layer can include one or more hole transport materials on the cathode side of the layer and one or more electron transport materials on the anode side of the layer. Accordingly, the charge-generating layer can include at least two sublayers—a hole transport (HT) portion and an electron transport (ET) portion. Moreover, each HT portion and ET portion can include its own sublayers and relative thickness. Generally, the charge-generating layers will have a total thickness not greater than 50 nm, e.g., a total thickness of from 15 nm to 45 nm, or about 20 nm to 25 nm. OLEDs with charge-generating layers with a total thickness greater than 45 nm, and to more extent greater than 50 nm, will result in an undesired drive voltage, particularly, as here, where the described WOLED will have at a minimum two charge-generating layers, and more preferably, three charge-generating layers.

The red/green charge generating layers can optionally have a charge transport functionality disposed between the hole transport functionality and the electron transport functionality. The charge transport functionality in the form of a separate sublayer includes an electron transport material doped with a metal cation selected from Group I or Group II, or $Al^{3+}$. This charge transport sublayer will tend to have a thickness of from 5 nm to 15 nm.

The HT portion of the charge-generating layer can include one or more hole-transport compounds. For example, if the HT portion includes two or more compounds, the HT portion can be present in the form of an admixture (a single sublayer of the two compounds) or as distinct sublayers of the two compounds. There are many hole transport compounds known to those of ordinary skill in the OLED art, and any one of these can be used in a charge-generating layer. Exemplary, hole-transport compounds include, but are not limited to: PSS, (polystyrene sulfonic acid); PEDOT (poly-3,4-ethylenedioxythiophene); m-MTDATA (4,4',4"-tris[phenyl(m-tolyl)amino]triphenylamine); NPD, (N,N-diphenyl-N—N'-di(1-naphthyl)-benzidine); spiro-TAD (2,2',7,7'-tetrakis(N,N-diphenylamino)-9,9-spirobifluorene); DNTPD (4,4'-bis[N-[4-{N,N-bis(3-methyl-phenyl)amino}phenyl]-N-phenylamino]biphenyl); NPNPB (N,N'-diphenyl-N,N'-di-[4-(N,N-diphenyl-amino)phenyl]benzene); MeO-TPD (N,N,N',N'-tetrakis(4-methoxyphenyl)benzene); HATCN, (1,4,5,8,9,11-hexaazatriphenylenhexacarbonitrile); or spiro-NPD (N,N-diphenyl-N,N-bis(1-naphthyl)-9,9'-spirobifluorenes-2,7-diamine). Moreover, the HT portion may have an inorganic or organic dopant in an organic hole-transport compound. Inorganic dopants, for example, include alkali or alkaline earth metals, transition metals, lanthanide metals, or the corresponding oxides thereof, e.g., vanadium oxide, molybdenum or tungsten. Organic dopants, for example, include tetrafluorotetracyano-quinodimethan (F4-TCNQ), or copper-pentafluorobenzoat (Cu(I)pFBz).

The ET portion of the charge-generating layer can include one or more electron-transport compounds. For example, if the ET portion includes two or more compounds, the ET portion can be present in the form of an admixture (a single sublayer of the two compounds) or as distinct sublayers of the two compounds. There are many electron transport compounds known to those of ordinary skill in the OLED art, and any one of these can be used in a charge-generating layer. Exemplary, hole-transport compounds include, but are not limited to: $AlQ_3$; TSPO; BPyTP2, (2,7-di(2,2'-bipyridine-5-yl)triphenyl); and BTB, (4,4'-bis[2-(4,)]6-diphenyl-1,3,5-triazinyl-1,1'-biphenyl). Moreover, the ET portion may have an inorganic dopant in an organic electron-transport compound. Inorganic dopants, for example, include alkali oe alkaline earth metals, transition metals, lanthanide metals, or the corresponding oxides thereof, e.g., lithium, vanadium oxide, molybdenum or tungsten.

One charge-generating layer of interest includes four sublayers in the direction of cathode to anode as follows: NPD/HATCN/BPyTP2(2% Li)/BPyTP2. Another charge-generating layer of interest includes replacing the BPyTP2 above with that of BCP, 2,9-dimethyl-4,7-diphenyl-1,10-phenanthroline, or Li doped BCP.

Blue Emitting Layer

The described WOLED has a blue emitting layer with a blue fluorescent or blue phosphorescent dopant having a peak wavelength between 410 and 490 nm. Typically, a "light blue" component has a peak emission wavelength in the range of 470 to 490 nm, and a "deep blue" component has a peak emission wavelength in the range of 410 to 470 nm, though these ranges may vary for some host emitter combinations. Accordingly, the term "blue emitting layer" refers to a blue phosphorescent dopant, a blue fluorescent dopant, and/or a mix of blue phosphorescent/fluorescent dopants, within a host material with a peak emissive wavelength of from 410 nm to 490 nm, or from 430 nm to 480 nm, or from 440 nm to 475 nm.

For light efficiency reasons, a blue phosphorescent emitting dopant would be advantageous, however, the inventive WOLED also includes a hybrid-WOLED design with a blue fluorescent emitting dopant. As noted above, the blue emitting layer is preferably positioned on the anode side of the cathode side, hybrid red/green emitting layer. Moreover, there is an optional cathode side blue charge-generating layer that separates the blue emitting layer from the cathode side, hybrid red/green emitting layer. Some exemplary blue phosphorescent dopants are indicated below. Of course, the blue emitting layer is not limited to the blue phosphorescent dopants below, and their optionally substituted analogs thereof, as alternative blue phosphorescent dopants can be used as well.

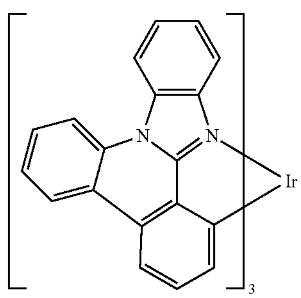

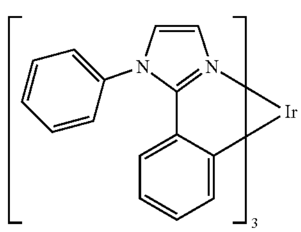

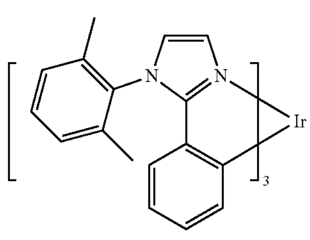

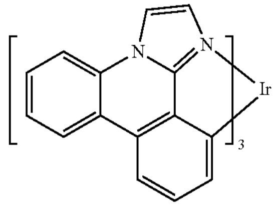

-continued

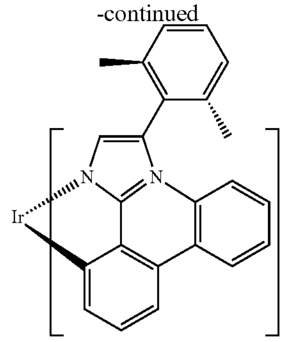

Ir(dmp)$_3$

Unlike that of red or green emitting layers, the relative high triplet energies of blue phosphorescent dopants can cause damage to the blue emitting layer over time. Given the relatively high triplet and/or singlet excited states, blue phosphorescent emitting layers must withstand higher energy excitons and/or charge carriers than corresponding red or green emitting layers. The can result in a reduction of device lifetime, and can also result in a significant change in the "white" color of the device over time as the blue emitting emission degrades to greater extent that red and green emission over a given time period. Moreover, the available list of host compounds available in a blue emitting layer is limited by properties relating to highest occupied molecular orbitals, lowest unoccupied molecular orbitals, or band gap, infra.

The relatively short operational lifetime of blue phosphorescent emitting layers in OLEDs has been attributed to annihilation between excited states (i.e. exciton-exciton or exciton-polaron) resulting in an Auger recombination that produces an energetically "hot" (i.e. multiply excited) triplet state that can lead to molecular dissociation. This hot excited state can have any energy value of at least 6.0 eV. If such high energy is concentrated onto a single molecular bond of an organic host compound or a ligand of the blue phosphorescent dopant, the excess energy can lead to molecular decomposition, or fragmentation, creating a non-radiative trap. One can expect the highest energy (blue) excitons lead to the highest energy polarons with the greatest probability for bond dissociation. The dissociation (bond-broken) products increase with time to reduce the lifetime, luminescence, and/or quantum efficiency of white OLEDs. This is an important technical issue that requires resolution because a white OLED may need to emit approximately 25% of its light in the blue depending upon a desired character of white color.

A blue phosphorescent dopant is typically present within the host material at a concentration of from 1% to 20% by weight, from 3% to 15% by weight, or from 3% to 10% by weight. However, there are instances in which the concentration of blue phosphorescent dopant is outside the above stated ranges depending upon the compound structure of dopant, the type of host material, the desired color temperature of light, and the commercial application for the WOLED. Accordingly, the concertation ranges above are not to further limit the subject matter claimed.

A blue fluorescent dopant, if present, is typically present within the host material at a concentration of from 3% to 30% by weight, from 5% to 20% by weight, or from 5% to 16% by weight. However, there are instances in which the concentration of blue fluorescent dopant is outside the above stated ranges depending upon the compound structure of fluorescent dopant, the type of host material, the desired color temperature of light, and the commercial application for the WOLED. Accordingly, the concertation ranges above are not to further limit the subject matter claimed.

Gradient Concentration of Blue Dopant

To address the above inherent design challenges of blue emitting layers one can provide optional structural modifications and material selection for a blue phosphorescent emitting layer of a WOLED. One possible design choice for a blue emitting layer (BEL) is to use a gradient concentration of a blue phosphorescent dopant in the BEL. The term "gradient concentration" defines an emitting layer that has a non-uniform concentration of phosphorescent dopant in a host material such that the concentration of the dopant, particularly, a blue phosphorescent dopant, varies across the emitting layer. The term gradient concentration encompasses an emitting layer that includes at least two sublayers with the two sublayers doped with varying concentrations of the phosphorescent dopant, e.g., one sublayer with 5% dopant and another sublayer with 10% dopant. The term gradient concentration also encompasses a single emitting layer having a varied (non-constant) concentration profile of emissive dopant across the emitting layer. The varied concentration profile can be an approximate linear function or an approximate parabolic (non-linear) function. In practice, the gradient concentration profile of the dopant can be carried out using a programmed temperature control of both the emitter host compound(s) and the blue phosphorescent dopant. One embodied gradient concentration profile may include a region of low (constant) dopant concentration, a region of high (constant) dopant concentration, and a region of transition concentration of dopant between the low region and the high region. See, U.S. Pat. No. 7,151,339, which is assigned to Universal Display Corporation, and is incorporated herein by reference.

Figure 4:
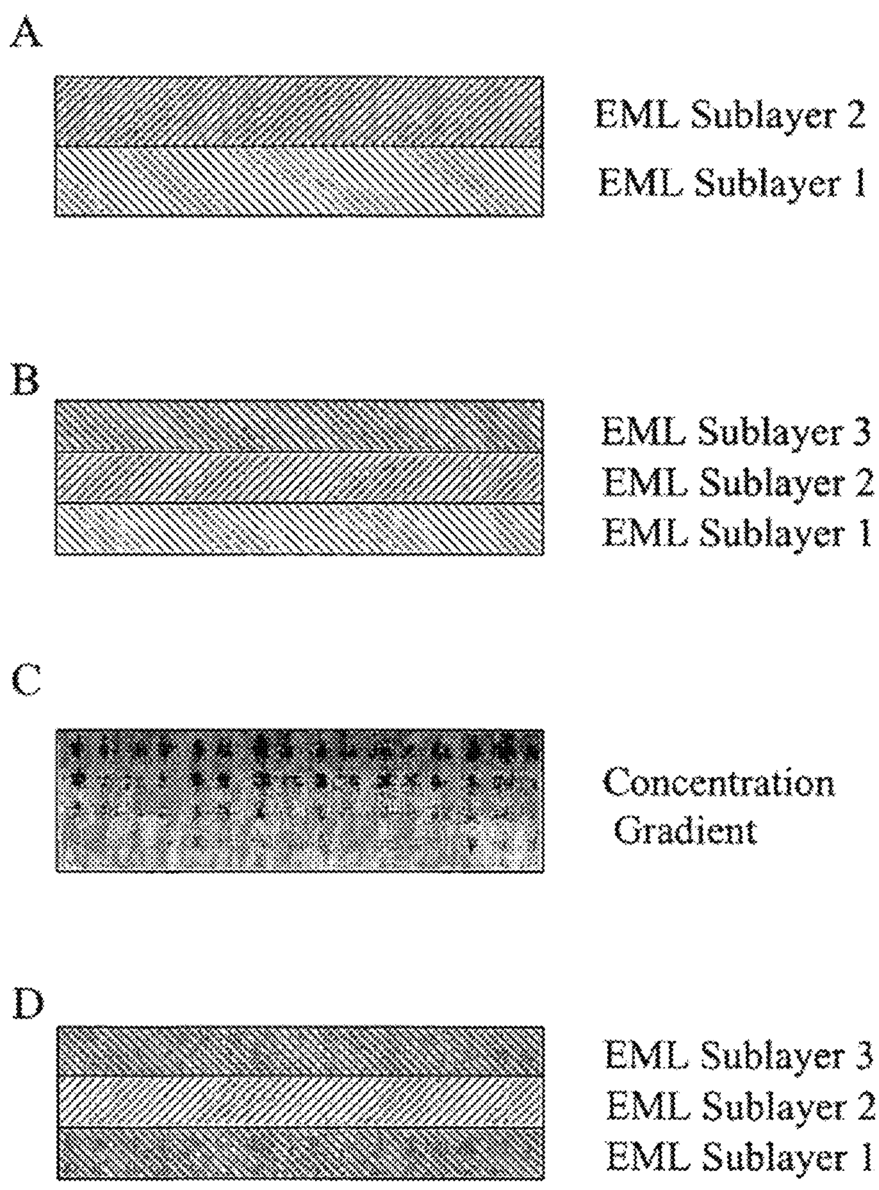
FIG. 4 represents possible gradient concentration profiles of blue dopant in a blue emitting layer; (A) two sublayers with two different dopant concentrations, (B)) three sublayers with three different dopant concentrations, (C) a linear gradient dopant concentration, and (D) three sublayers with the concentration of the blue dopant greater in the first and third sublayers than in the second sublayer.

FIG. 4 provides schematic representations of a BEL with different sublayers. FIG. 4A depicts a BEL with two sublayers, one sublayer having a greater concentration of blue phosphorescent dopant than the other. 4B depicts a BEL with three sublayers, one with high concentration, another with an intermediate concentration, and another with a lower concentration of a blue phosphorescent dopant. FIG. 4C depicts a BEL having a linear (or continuous) concentration gradient of the emissive dopant.

As noted, the concentration of the blue phosphorescent dopant is higher on one side of the BEL, either the anode-side or the cathode-side. The higher concentration of blue dopant on one side of the BEL may facilitate charge injection and recombination efficiency. The lower concentration of blue dopant on the opposite side of the BEL may reduce exciton quenching. In one embodiment, the concentration of blue phosphorescent dopant in a host compound(s) is greater on the cathode side than the anode side of the BEL. The concentration of the blue dopant on the anode side is about 3% to about 10%, the concentration of the blue dopant on the cathode side is about 6% to about 20%, and the difference between the dopant concentrations on the anode side and the cathode side is at least 2%, preferably at least 5%. In this instance, the greater dopant concentration on the cathode side would likely facilitate electron injection, the dopant functioning in-part as a transporter of electrons in the BEL.

In another embodiment, the concentration of blue phosphorescent dopant in a host compound(s) is greater on the anode side than the cathode side of the BEL. The concentration of blue dopant on the anode side is about 6% to about 20%, the concentration of the blue dopant on the cathode side is about 3% to about 10%, and the difference between the dopant concentrations on the anode side and the cathode side is at least 3%, preferably at least 6%. Blue phosphorescent dopants are generally known as good hole transporters, and therefore, can facilitate and perhaps are primarily responsible for hole transport in a blue emissive layer of an OLED. The greater concentration of blue dopant at the anode can facilitate the transfer of holes in the emissive layer, which again, in theory, can lead to a more even distribution of high triplet states in the layer resulting in less BEL damage and greater device stability (lifetime).

The use of at least two sublayers of different concentration of blue phosphorescent dopant provides for a greater probability of charge recombination and exciton formation closer to the middle of the BEL (for example, at the interface of two sublayers). In contrast, a uniform concentration of blue dopant in a BEL will likely result in charge recombination at the interface between the BEL and an adjacent organic layer, e.g., a hole transport layer, a blocking layer, or a electron transport layer. As a result, the number of excitons which may diffuse to the emissive layer/adjacent layer interface in a gradient concentration layer is much lower due to distribution of the exciton density around the exciton formation zone.

Manager Blue Dopant

Alternatively, or in combination, one can minimize bond breaking or molecular dissociation in a phosphorescent BEL, and thereby increase blue lifetime of a WOLED, by managing the hot triplet states. This can be accomplished by reducing bimolecular annihilations, or by "bypassing" the dissociative processes altogether. One option to reduce bimolecular annihilation is with a gradient concentration profile of blue phosphorescent dopant as described above. A second option is based on a strategy to thermalize the hot triplet states. One can add an ancillary dopant called an excited state "manager" into the BEL. The manager dopant has a triplet exciton energy that is intermediate between that of the lowest energy triplets of the BEL host compounds and the excited hot triplet states. By facilitating a rapid exothermic energy transfer from the hot states to the manager dopant, the probability of direct dissociative reactions in the BEL is reduced, which leads to a significant improvement in the device lifetime and blue efficiency.

One known manager dopant is mer-Ir(pmp)$_3$, the structure of which is shown.

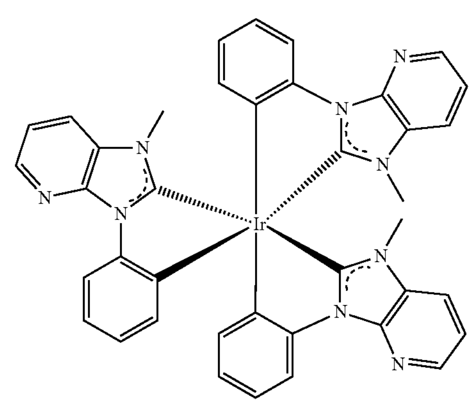

The dopant, mer-Ir(pmp)3, is characterized by a relatively strong metal-ligand bond and a high glass transition temperature Tg of 136° C. $T_M$, the lowest triplet state energy of the manager mer-Ir(pmp)$_3$ is approximately 2.8 eV calculated from its peak phosphorescence spectrum (λ=454 nm), while the onset of the manager's phosphorescence spectrum starts at λ=400 nm corresponding to 3.1 eV. Thus, mer-Ir $(pmp)_3$ meets the energy requirement of a manager dopant. See, U.S. Pub. No. 2017/0155061 assigned to the University of Michigan, which is incorporated by reference in its entirety.

To optimize the non-destructive relaxation of the hot triplet states, the manager dopant is preferably positioned in the BE in a region of greatest triplet density, i.e., where bimolecular annihilation is statistically most probable. A managed BEL in a white OLED can achieve an approximately 75% to 300% increase in device lifetime. We have developed a triplet-triplet annihilation-based model that accurately predicts the lifetime characteristics of managed PHOLEDs for several different device configurations.

Figure 5:
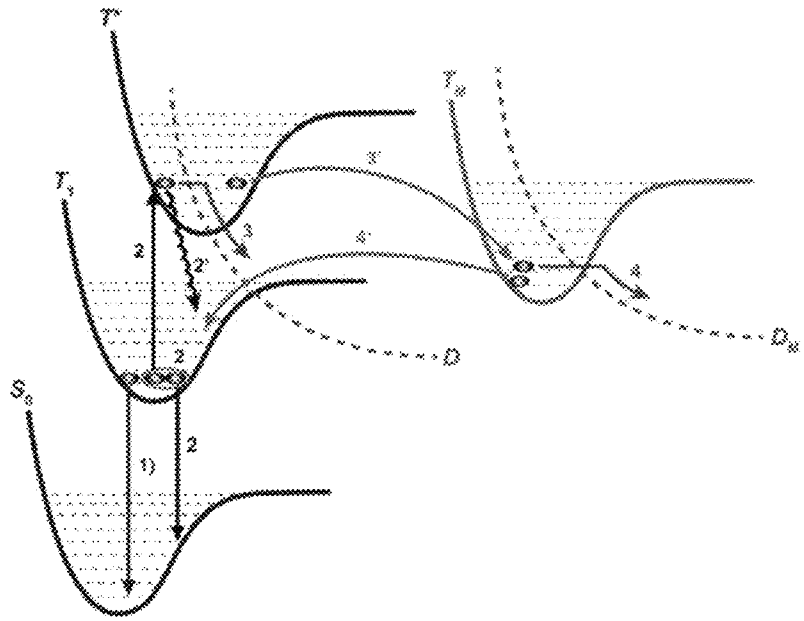
FIG. 5 shows the Jablonski diagram of an EML containing an excited state manager and the possible relaxation pathways for triplet excitons.

FIG. 5 is a Jablonski diagram of a BEL containing an excited state manager dopant and the possible relaxation pathways for triplet excitons. The diagram is a schematic illustration showing the qualitative relationship among the different energy levels between the manager dopant, and the host or the blue phosphorescent dopant, in a BEL. In other words, the $S_0$, $T_1$, and T* energy levels shown on the left side of FIG. 5 and their relationship to $T_M$ shown on the right side of FIG. 5 is applicable to both the host and the blue dopant in the EML. $S_0$ is the ground state of the blue dopant or the host. $T_1$ is the lowest triplet state energy of the blue dopant or the host. T* is the higher-energy triplet electronic manifold of the blue dopant or the host referred to herein as the excited hot triplet state energy. D represents the dissociative reactions via pre-dissociative potential of the EML materials. $T_M$ is the lowest triplet state energy of the manager dopant. Possible energy-transfer pathways are numbered as follow: 1) radiative recombination, 2) triplet-triplet annihilation TTA, 2') internal conversion and vibrational relaxation, 3) and 4) dissociative reactions rupturing the molecules, 3') and 4') Exothermic Dexter energy transfer referred to the hot excited state management process.

Referring to FIG. 4, by introducing a manager dopant whose lowest triplet state energy level $T_M$ is greater than the lowest triplet state energy levels of both the host and the blue phosphorescent dopant, a transfer from T* to $T_M$ (process 3') is spin-symmetry allowed, and damage to these molecules (the host and the blue dopant) via dissociative reactions (process 3) is minimized provided that the rate for $T^* \rightarrow T_M$, is greater than for T*→D, where D is the dissociative state for the dopant or the host in the BEL. The excited states of $T_M$ then transfer back to the blue dopant or host ($T_M \rightarrow T_1$) via process 4' leading to radiative recombination (process 1)), or recycle back to T* by additional collisions with a neighboring triplet (or polaron) state, TTA (process 2). Processes 3' and 4' most probably occur via rapid, exothermic Dexter transfer. It is also possible that the hot triplet states to $T_M$ can result in dissociation of the manager dopant itself via $T_M \rightarrow D_M$ (process 4), i.e. where the manager dopant serves as a sacrificial additive to the BEL.

Alternatively, an effective manager dopant would be such that the rate of the energy transfer from the blue phosphorescent dopant to the manager $T^* \rightarrow T_M$ is comparable to or greater than the rate of dissociation of the blue dopant to the dissociative state, T*→D (process 3), where D is the dissociative state for the blue dopant or the host in the BEL. Additionally, it would be preferable that the manager dopant be sufficiently stable material such that the degradation of the manager via dissociation reaction (process 4) does not happen sooner than the degradation of the hosts or the blue dopant (via process 3) in unmanaged devices.

The blue emitting layer will preferably have a thickness greater that any one red/green emitting layers in the WOLED. Regardless as to whether the BEL is a single or multiple layer structure, the total thickness of the BEL is at least 50 nm, preferably at least 70 nm, and up to about 100 nm, though at times, up to 130 nm.

In one embodiment, the BEL is a "hybrid" blue emitting layer, which includes both a blue fluorescent dopant, or a blue fluorescent and a blue phosphorescent dopant. This hybrid layer can be a single layer where both fluorescent and phosphorescent dopants are present. Alternatively, and more preferred, the BEL will include two sublayers, each with a fluorescent and phosphorescent dopant, the relative order with respect to the cathode is not important.

Exemplary WOLEDs

A stacked white-light emitting OLED comprises an anode, a cathode, and disposed between the anode and the cathode are at least two hybrid red/green emitting layers. As already stated, each hybrid red/green emitting layer has a cathode side and an anode side, and includes a mixed red/green emitting sublayer, and a green emitting sublayer that is adjacent to and positioned on the cathode side of the mixed red/green emitting sublayer. In many instances, the green emitting dopant is the same in the mixed red/green emitting sublayer and the green emitting sublayer. The WOLED will also include a blue emitting layer positioned between the two hybrid red/green emitting layers. Moreover, it can be advantageous for the blue emitting layer to be separated from the two hybrid red/green emitting layers by a charge generation layer. Also, it can be advantageous to have the blue emitting layer include a gradient blue emitter concentration profile or a manager dopant, or a gradient blue emitter concentration profile and a manager dopant.

Another stacked white-light emitting OLED comprises an anode, a cathode, and a blue emitting layer. The WOLED will also have at least three hybrid red/green emitting layers, where one of the three hybrid red/green emitting layers is a cathode side, hybrid red/green emitting layer that is disposed between the cathode and the blue emitting layer, and two of the three hybrid red/green emitting layers are anode side, hybrid red/green emitting layers that are disposed between the blue emitting layer and the anode. There are also red/green charge generating layers that separate each of the at least two anode side, hybrid red/green emitting layers. The blue emitting layer will include a gradient blue emitter concentration profile or a manager dopant, or a gradient blue emitter concentration profile and a manager dopant.

In many prior art WOLED architectures, the recombination zone will tend to shift from one side of the emissive stack to the other, which can result in higher color shift when currents are varied. The significantly improved structure of the WOLED described is believed in part to derive from a balancing of the recombination zone within the emissive layers. Accordingly, one observes little, if any, change in the emission characteristics of the device as driving conditions (applied current or voltage) is varied. Accordingly, the described WOLED is a very color-stable multiple-layer structure that can be used in bottom emission, bottom emission microcavity, and top emission microcavity structures.

The described WOLED exhibits better color stability compared to many known WOLEDs, particularly, if the driving current of a device is increased or decreased. In one embodiment, the color of the WOLED is stable within a driving current density range of about 2 $mA/cm^2$ to about 80 $mA/cm^2$ or luminance changes from 800 $cd/m^2$ to 30,000 $cd/m^2$. In many of the WOLED described herein, each of the 1931 CIE x and 1931 CIE y coordinates of the OLED will change less than 0.02, preferably less than 0.01, within the above current density or above luminance range. In many of the WOLEDs described herein, as current density is varied from 10 mA/cm$^2$ to 50 mA/cm$^2$, or luminance is varied from 4,000 cd/m$^2$ to 20,000 cd/m$^2$, each of the 1931 CIE x and 1931 CIE y coordinates of the OLED will change less than 0.02, preferably less than 0.01.

The efficiency of the described WOLED is improved in-part by balancing charge injection across each emitting layer. In a preferred embodiment, the charge balance factor γ is from 0.70 to 1 for each emitting layer. In preferred embodiments, the device is capable of emitting light having CIE coordinates of X=0.37.+−0.0.08, and Y=0.37.+−0.0.08. More preferably, the device is capable of emitting light having CIE coordinates of X=0.33.+−0.0.02, and Y=0.33.+−0.0.02. Moreover, the devices of present invention are preferably capable of producing a white emission having CRI of at least about 70. More preferably, the CRI is higher than about 75, and still more preferably the CRI is higher than about 80.

The WOLED optical cavity may be selected to increase or maximize the output of all photons. The optical cavity has specific layer thicknesses, emitter concentrations, charge balance and recombination location. A relatively thin device with one reflective electrode may have only one antinode per wavelength, and that antinode will be closer to the reflective electrode for lower wavelengths. In this situation, the highest outcoupling efficiency is obtained when the distance between the emitter and the reflective electrode increases as the emitter emission wavelength increases. Thus, in a device having a reflective electrode and a transmissive electrode, and where a blue emitter is the lowest wavelength emitter, it is advantageous to locate the blue emitter closest to the reflective electrode. However, for thicker devices, there may be multiple antinodes per wavelength, and there may be antinodes for various wavelengths at different positions such that good outcoupling efficiency may be obtained by locating emitters at antinodes for the wavelength of light emitted, and the different emitters may be in any order.

Select Phosphorescent Emitter Dopants

In one embodiment, the light-emitting dopant has at least one ligand selected from the group consisting of

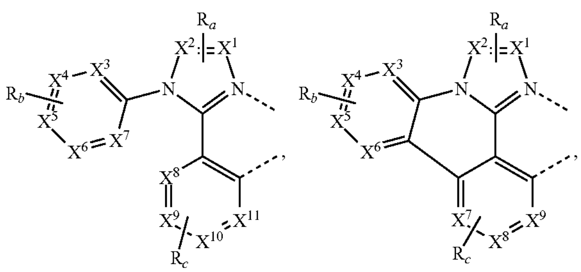

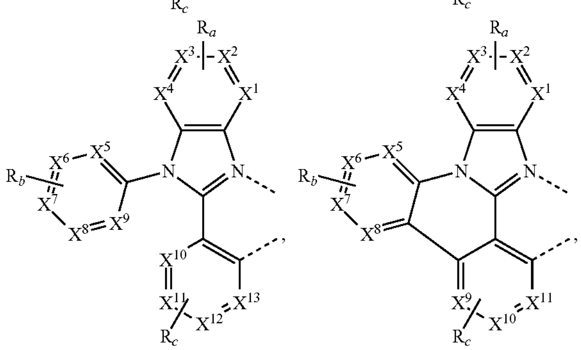

-continued

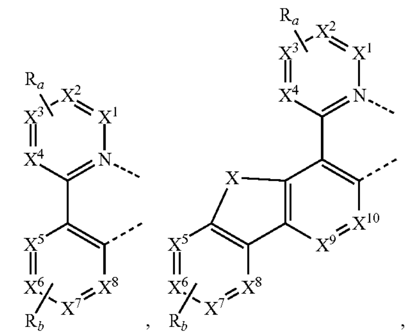

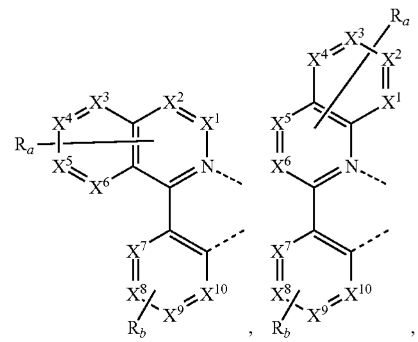

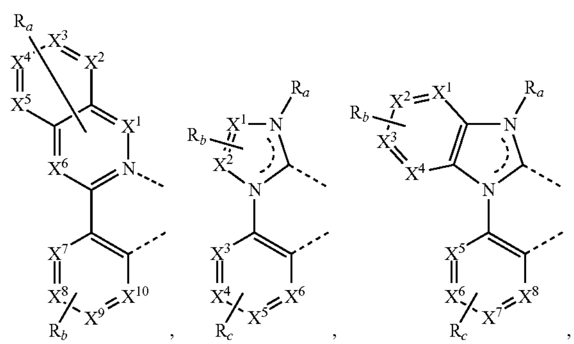

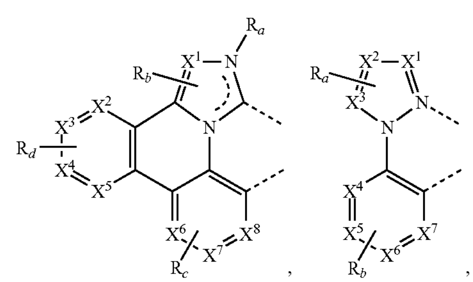

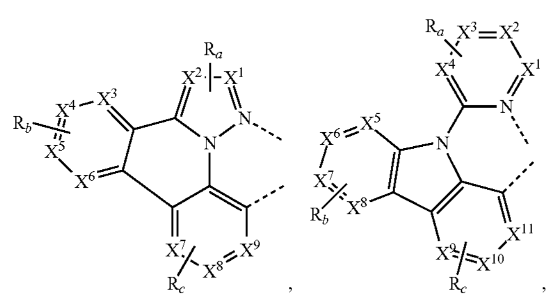

-continued

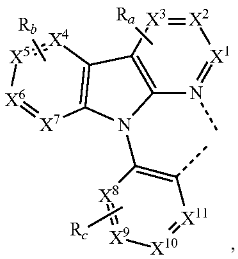

, and

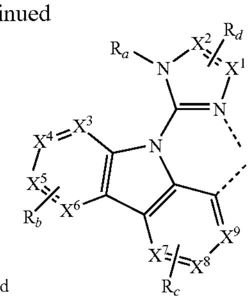

;

wherein $X^1$ to $X^{13}$ are independently selected from the group consisting of carbon and nitrogen;

X is selected from the group consisting of BR', NR', PR', O, S, Se, C═O, S═O, $SO_2$, CR'R", SiR'R", and GeR'R"; and R' and R" are optionally join to form a ring;

$R_a$, $R_b$, $R_c$, and $R_d$ may represent from mono substitution to the possible maximum number of substitution, or no substitution;

R', R", and each $R_a$, $R_b$, $R_c$, and $R_d$, are independently hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; or optionally, any two adjacent substituents of $R_a$, $R_b$, R, and $R_d$ optionally join to form a ring. In some select embodiments, each $R_a$, $R_b$, $R_c$, and $R_d$, are independently hydrogen or a substituent selected from the group consisting of deuterium, halide, alkyl, cycloalkyl, heteroalkyl, amino, silyl, cycloalkenyl, aryl, heteroaryl, nitrile, isonitrile, sulfanyl, and combinations thereof; or optionally, any two adjacent substituents of $R_a$, $R_b$, $R_c$, and $R_d$ optionally join to form an aromatic or heteroaromatic ring.

In another embodiment, the light-emitting dopant has at least one ligand selected from the group consisting of

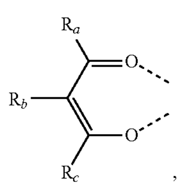

,

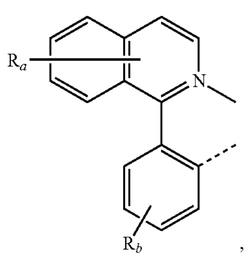

,

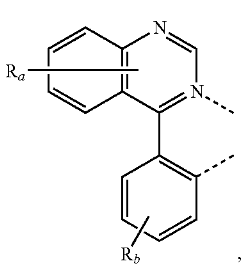

,

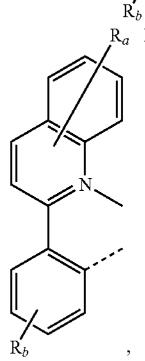

,

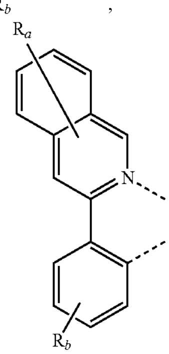

,

-continued

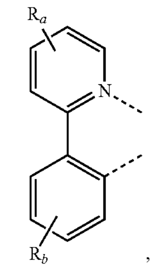

,

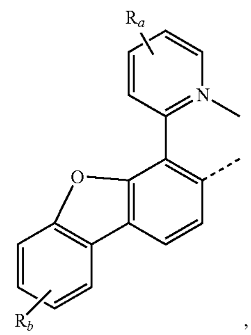

,

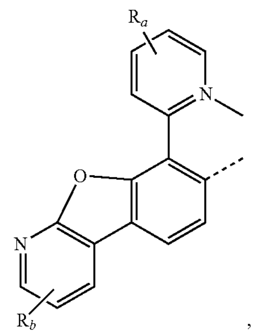

,

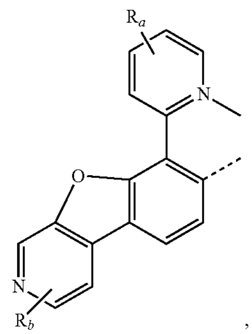

,

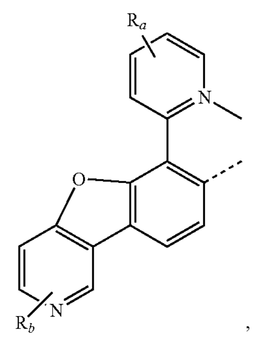

,

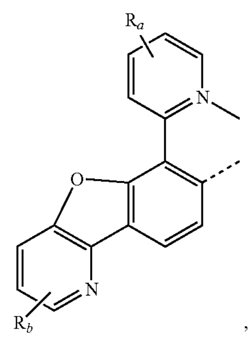

,

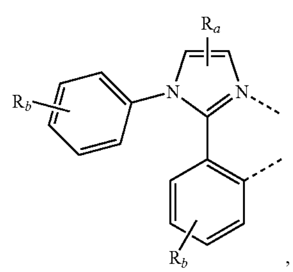

,

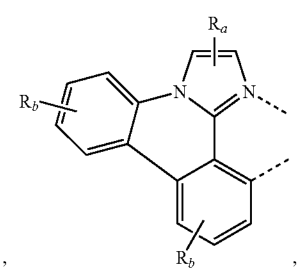

,

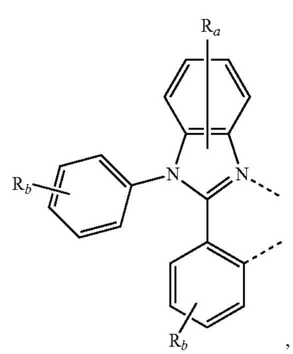

,

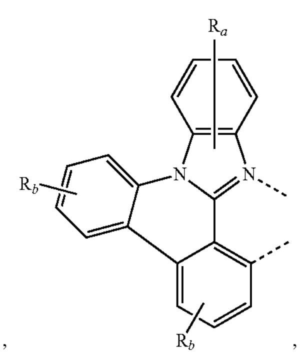

,

-continued

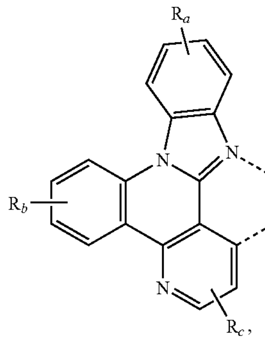

,

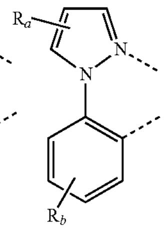

,

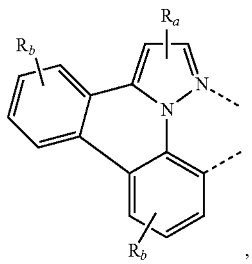

,

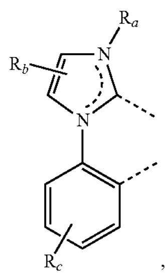

,

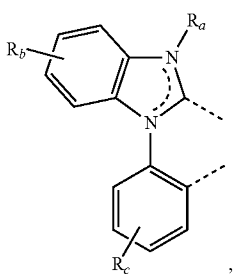

,

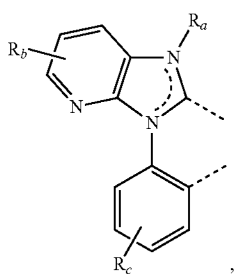

,

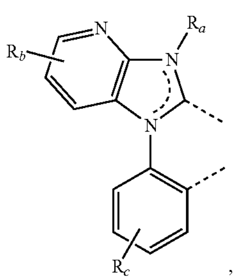

,

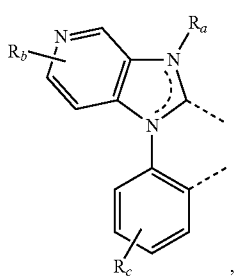

,

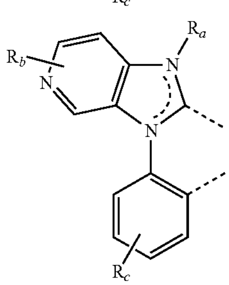

,

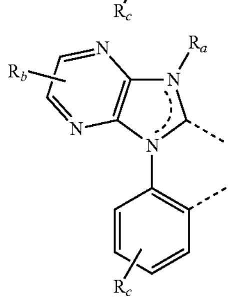

,

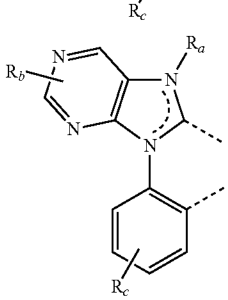

,

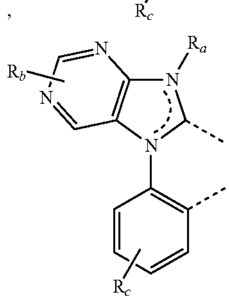

, and

-continued

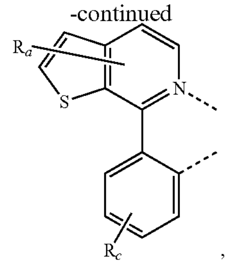

, wherein $R_a$, $R_b$, and $R_c$ are as defined above. Again, in some select embodiments, each $R_a$, $R_b$, and $R_c$ are independently hydrogen or a substituent selected from the group consisting of deuterium, halide, alkyl, cycloalkyl, heteroalkyl, amino, silyl, cycloalkenyl, aryl, heteroaryl, nitrile, isonitrile, sulfanyl, and combinations thereof; or optionally, any two adjacent substituents of $R_a$, $R_b$, $R_c$, and $R_d$ optionally join to form an aromatic or heteroaromatic ring.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfanyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Emitter Host Materials

Each of the light emissive layers will include a phosphorescent dopant, or in the case of a blue-emitting layer a blue-fluorescent as well, as described above with a concentration of from 4% to 20% by weight, preferably from 6% to 12%, by weight in an organic host matrix. More often than not, the organic host matrix will include one host compound, or at times, an admixture of two host compounds. At concentrations greater than 20% by weight, concentration quenching could become an issue. At concentrations less than 4%, hole transport could become inhibited in the emissive host layer resulting in an unwanted build-up of holes in such a layer and consequent loss of efficiency in the downstream (cathode side) emissive layers.

Again, to maintain simplicity of manufacturing processing there is an important advantage to use the same organic host compound for each respective in the OLED. Accordingly, for the red/green emitting layers (preferably, both anode-side as well as cathode-side), and for each sublayer in the red/green emitting layers, the same host compound is used. Likewise, each of the charge-generating layers will have the same functional and compositional sublayers. Again, the blue emitting layer will likely require a host compound different from the red/green emitting layers because of the demand for the high energy triplets of the host and dopant. The selection of which host compound is based in-part on one or more device properties selected from device lifetime (norm. intensity vs. time), external quantum efficiency vs. current density, drive voltage, and luminescence (luminescence efficiency vs. luminescence).

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

According to another aspect, an emissive region in an OLED (e.g., the organic layer described herein) is disclosed. The emissive region comprises a first compound as described herein. In some embodiments, the first compound in the emissive region is an emissive dopant or a non-emissive dopant. In some embodiments, the emissive dopant further comprises a host, wherein the host comprises at least one selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene. In some embodiments, the emissive region further comprises a host, wherein the host is selected from the group consisting of

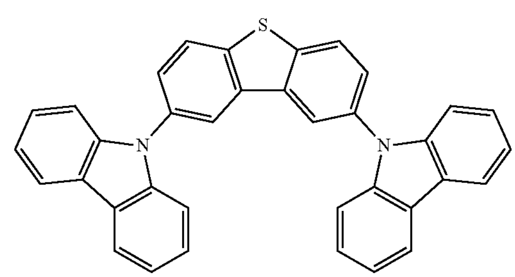

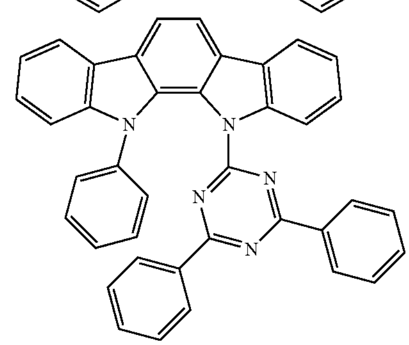

-continued
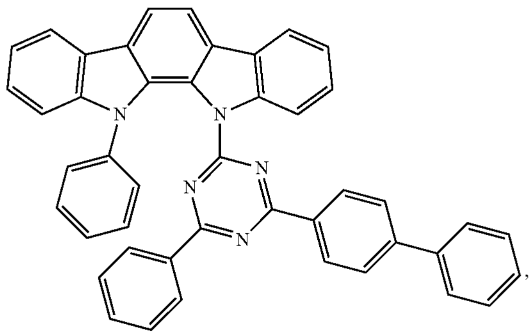
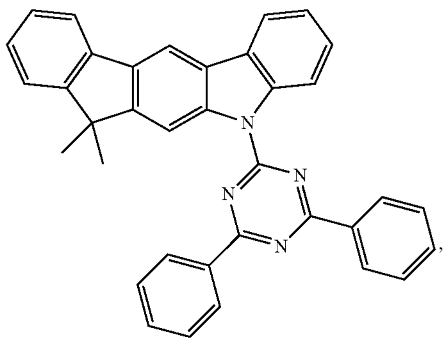
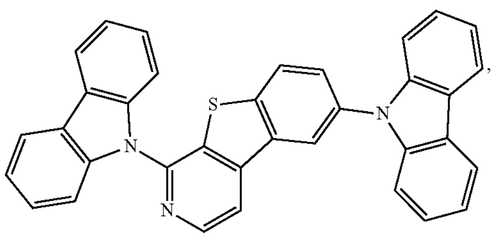
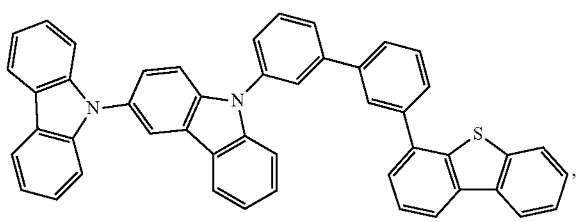
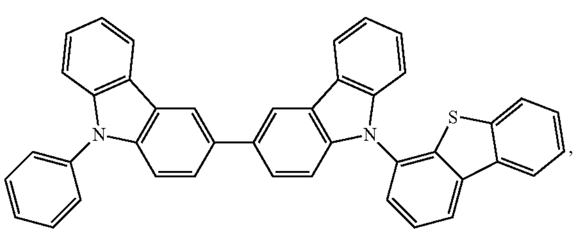
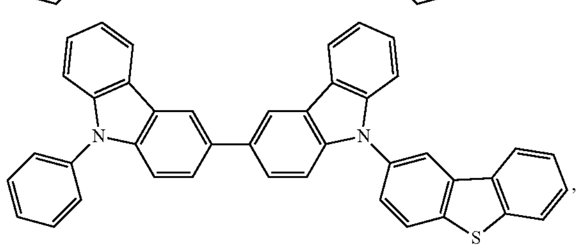
-continued
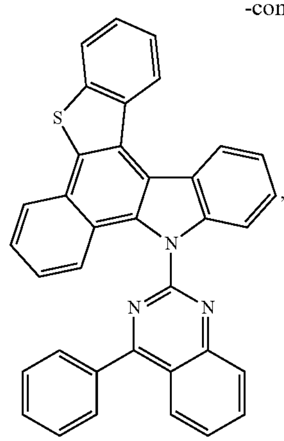
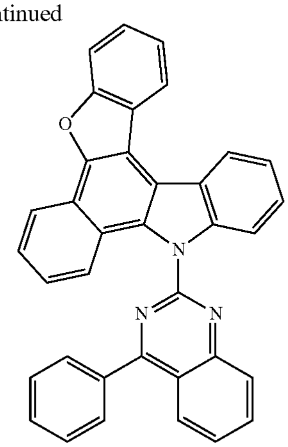
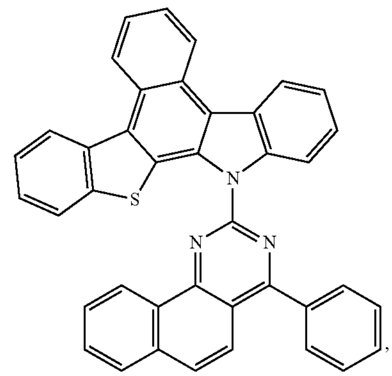
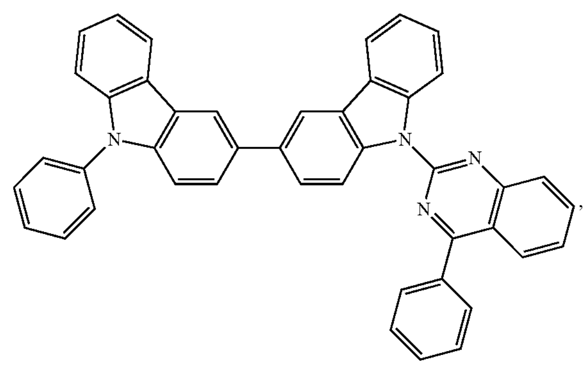
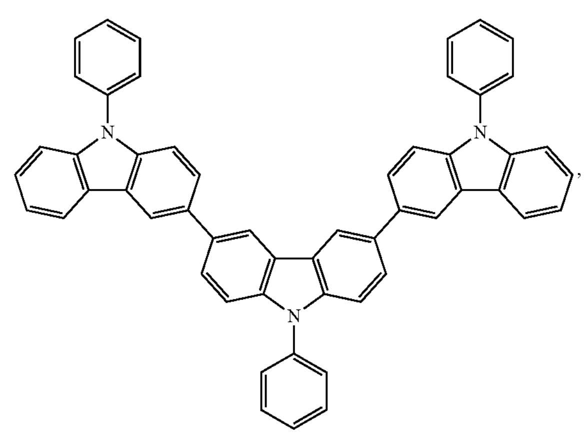

-continued
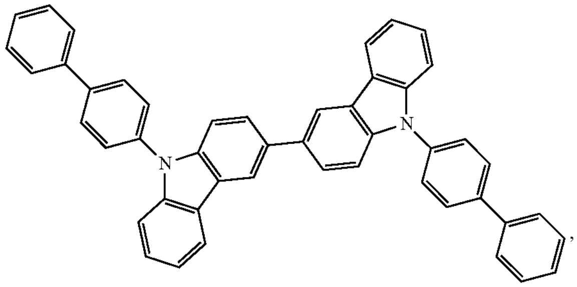
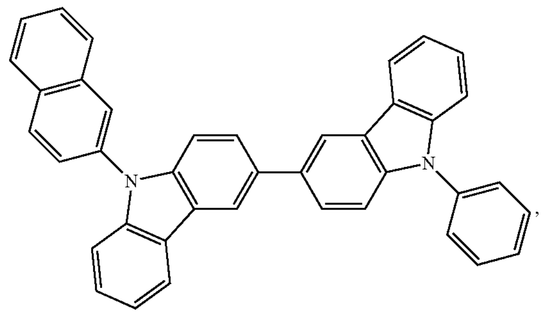
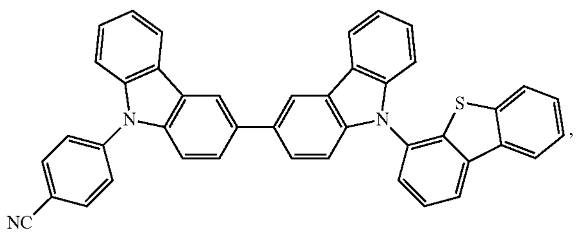
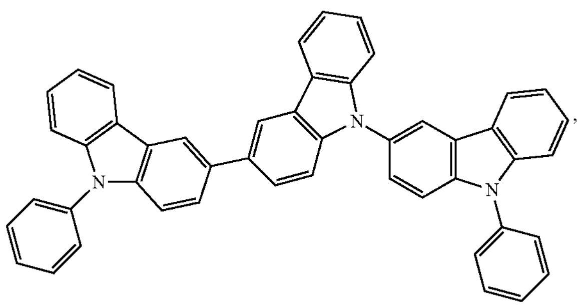
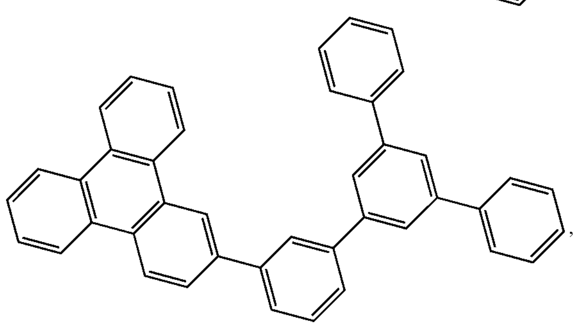
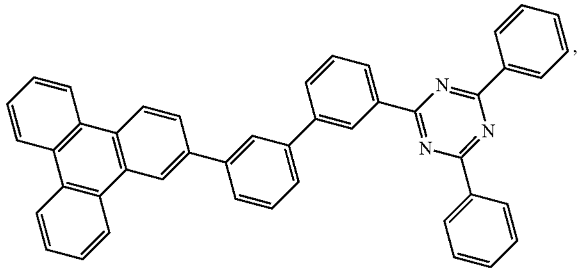
-continued
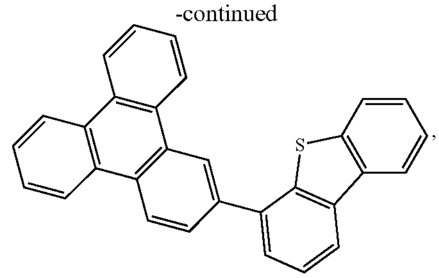
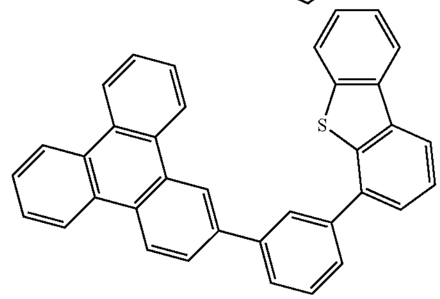
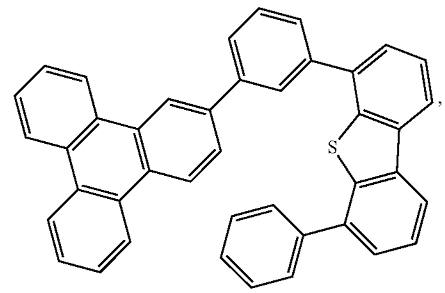
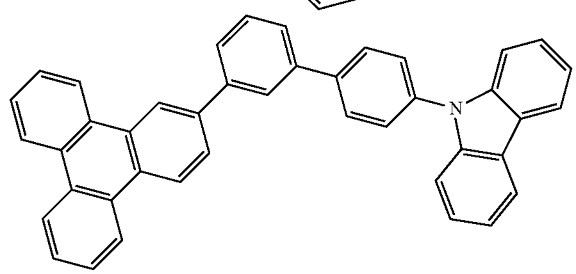
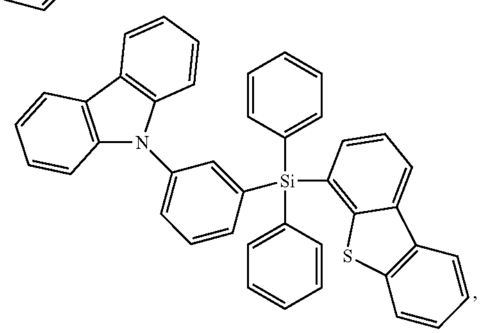
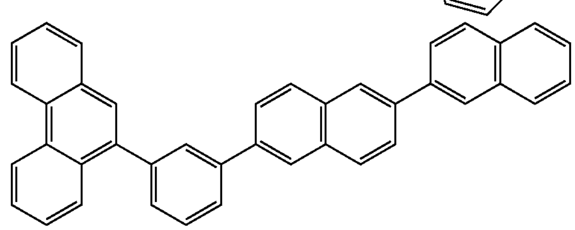
and combinations thereof.
The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

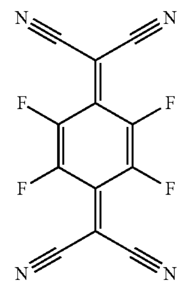

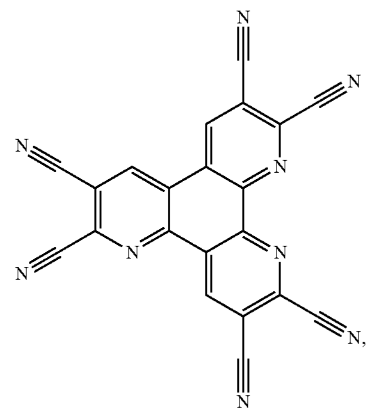

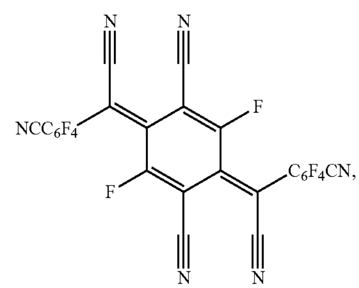

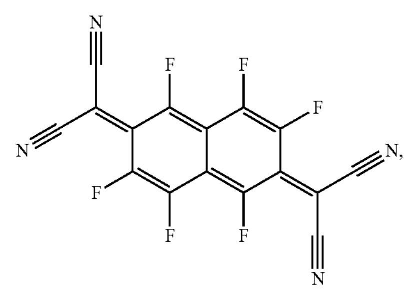

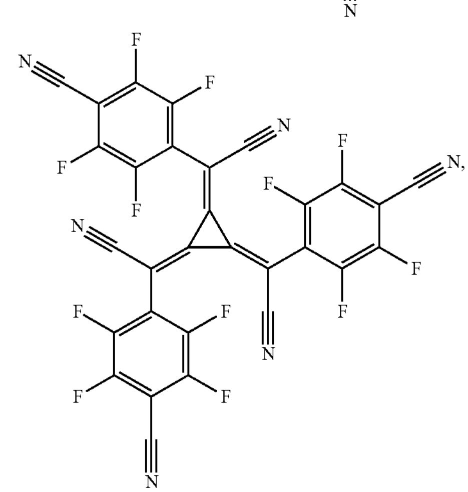

-continued

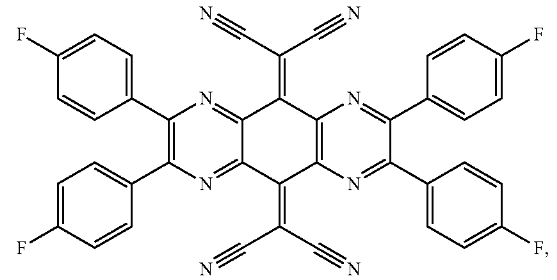

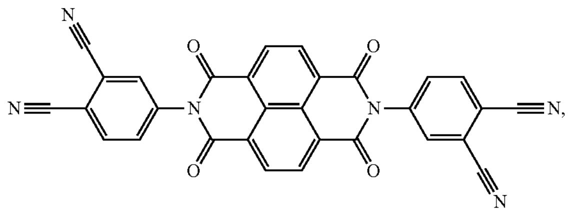

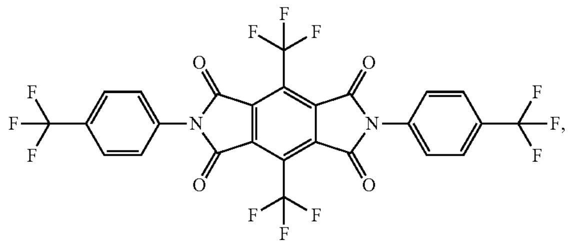

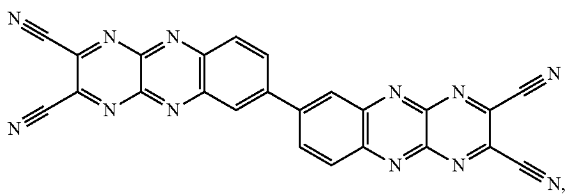

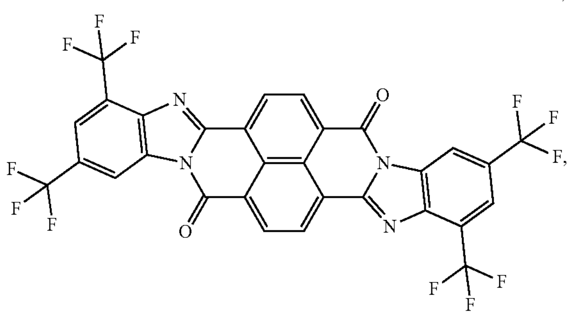

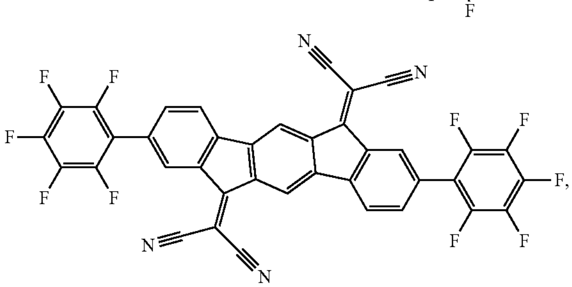

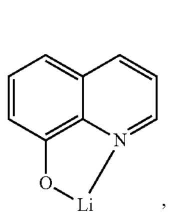

, and

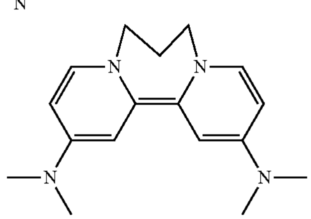

-continued

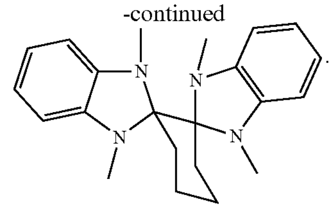

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

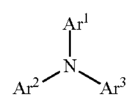

,

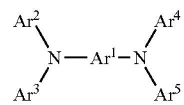

,

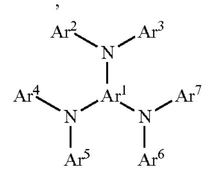

,

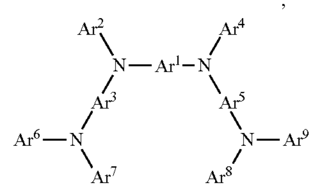

, and

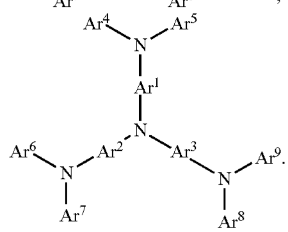

Each of $ar^1$ to $ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $ar^1$ to $ar^9$ is independently selected from the group consisting of:

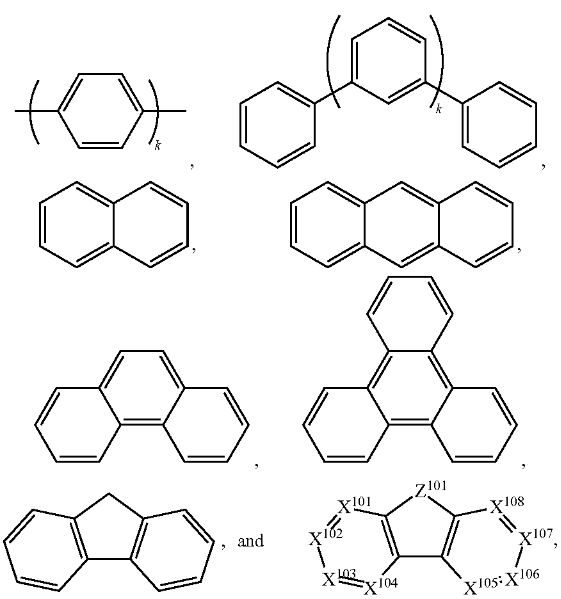

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in hil or htl include, but are not limited to the following general formula:

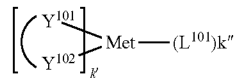

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($y^{101}$-$y^{102}$) is a carbene ligand. In another aspect, met is selected from Ir, Pt, Os, and Zn. In a further aspect, the metal complex has a smallest oxidation potential in solution vs. $Fc^+/Fc$ couple less than about 0.6 v.

Non-limiting examples of the hil and htl materials that may be used in an oled in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

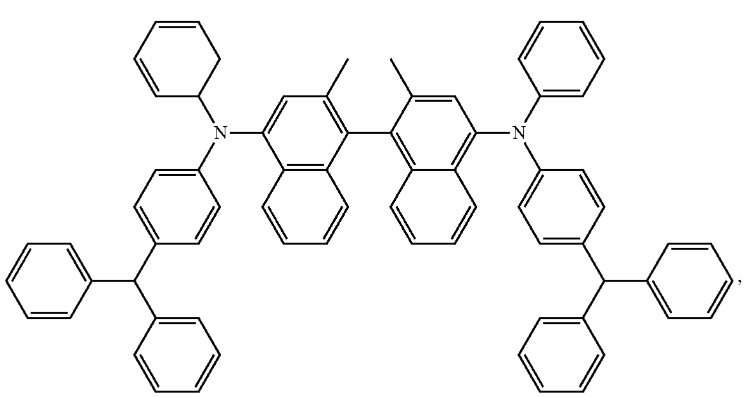

-continued
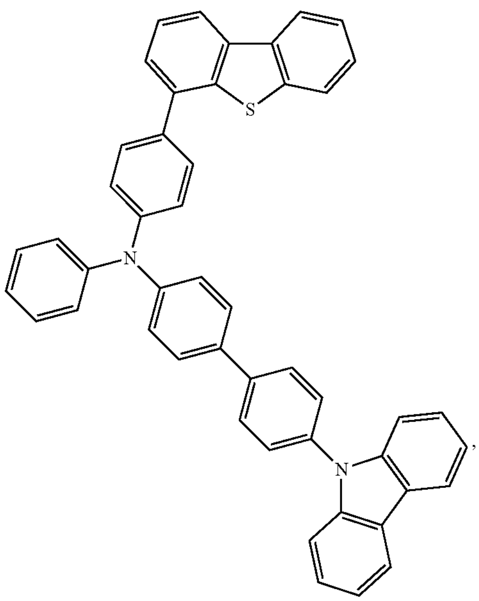
,
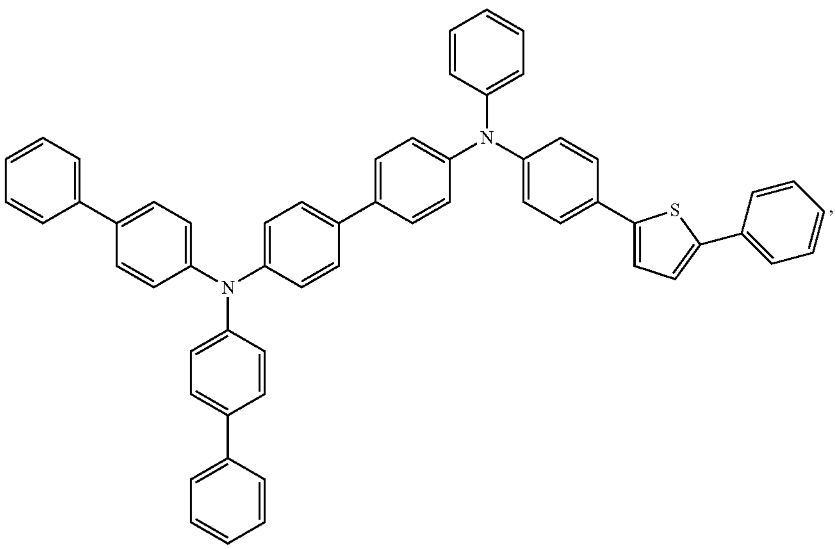
,
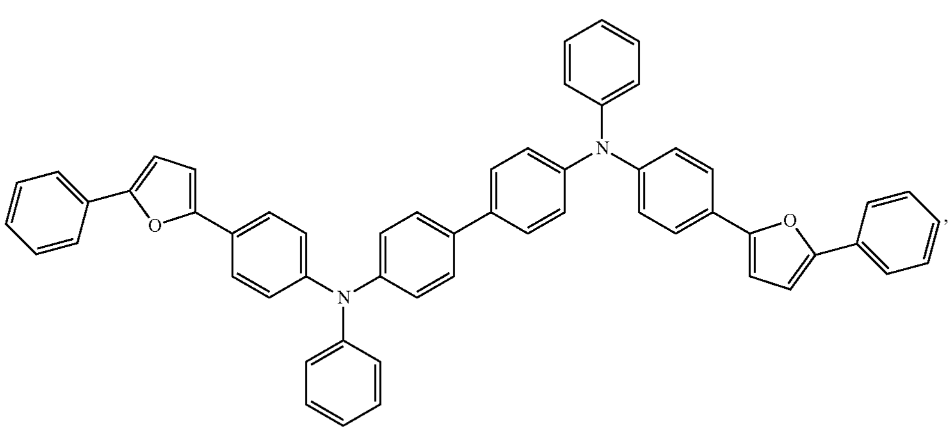
,

-continued
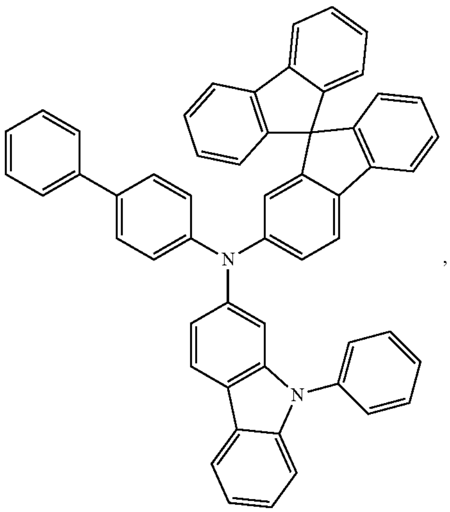
,
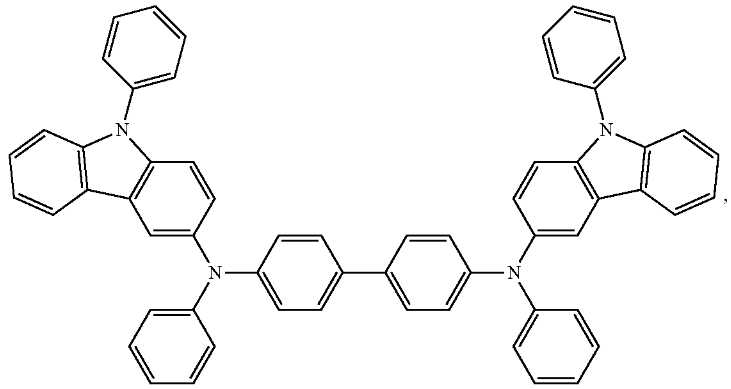
,
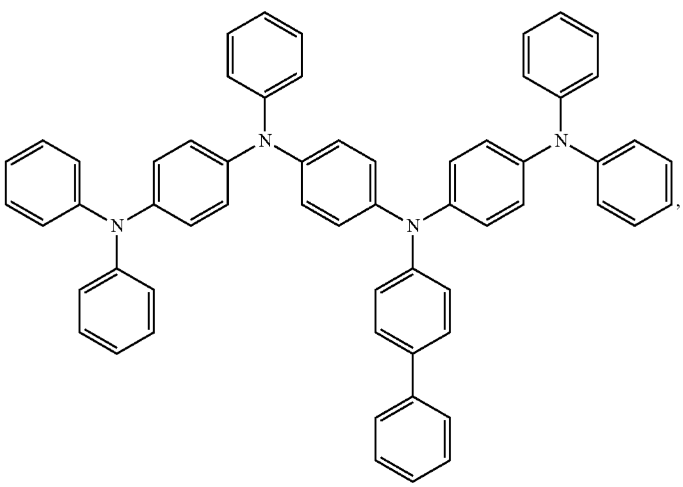
,
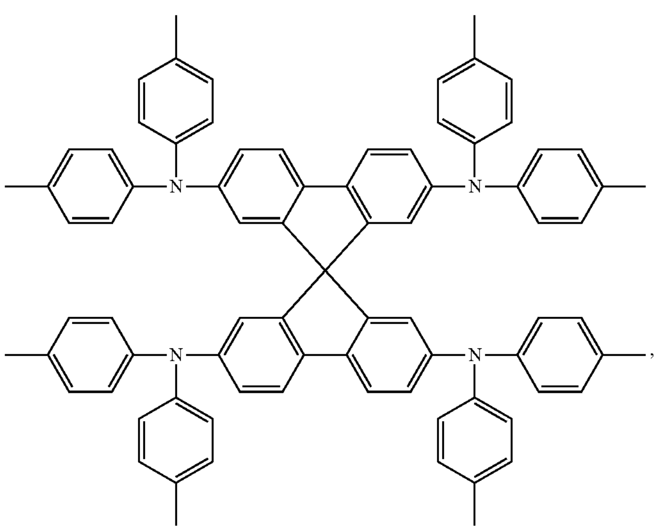
,

-continued
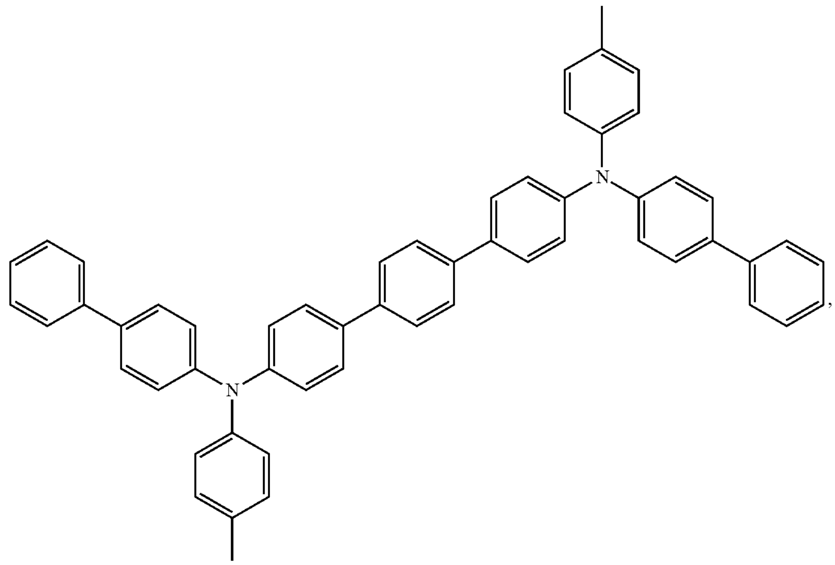
,
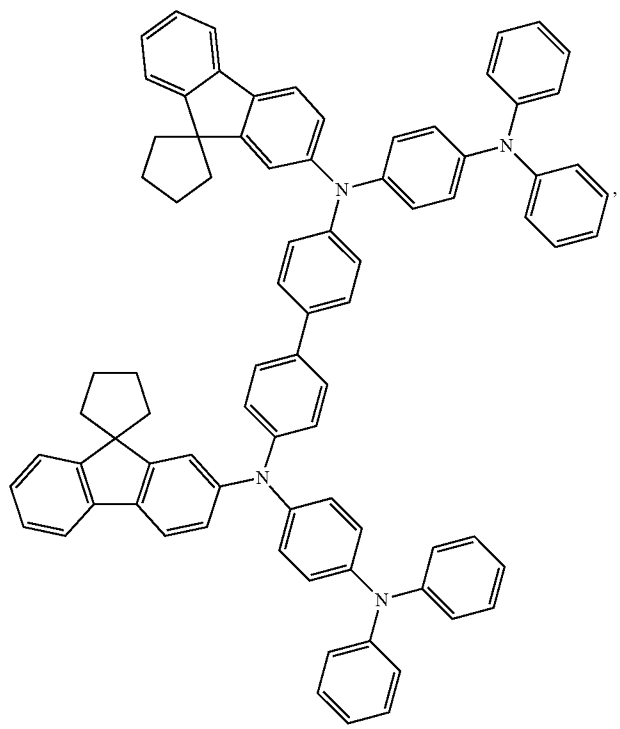
,
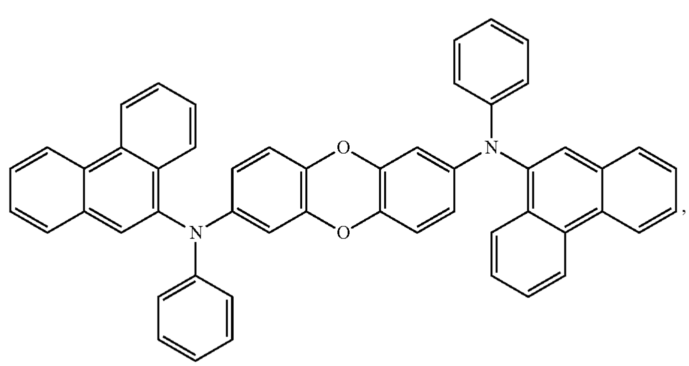
,

-continued
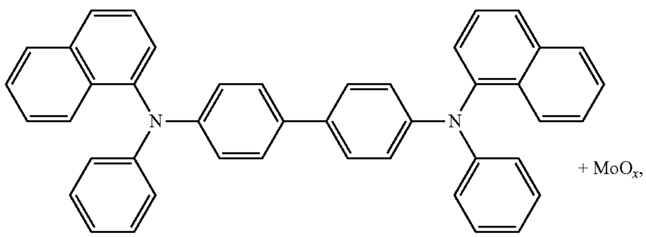
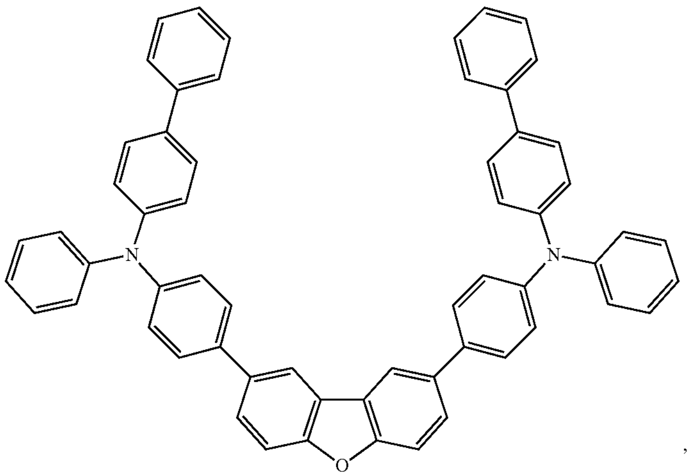
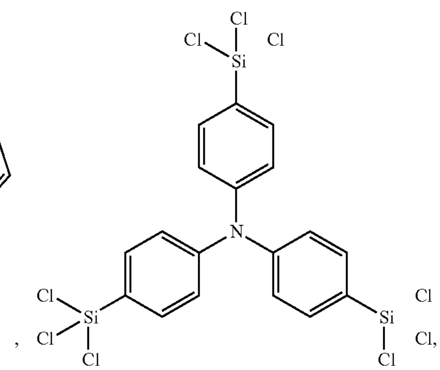
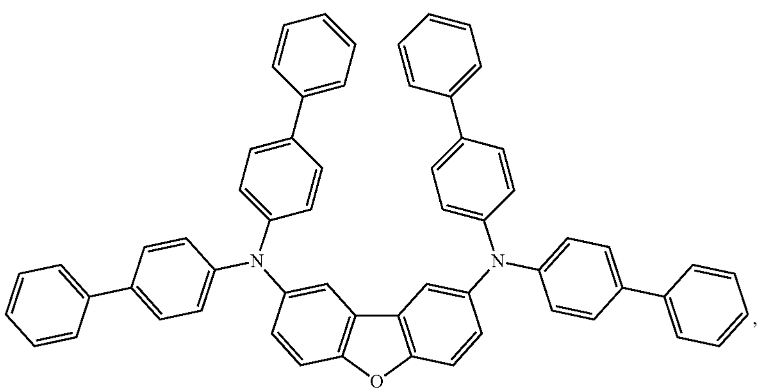
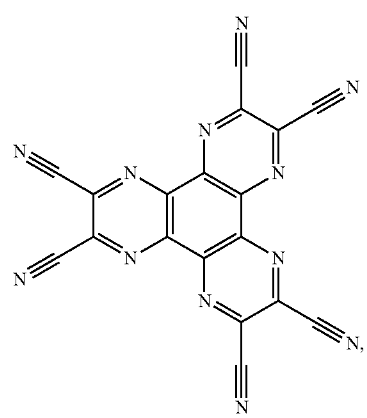
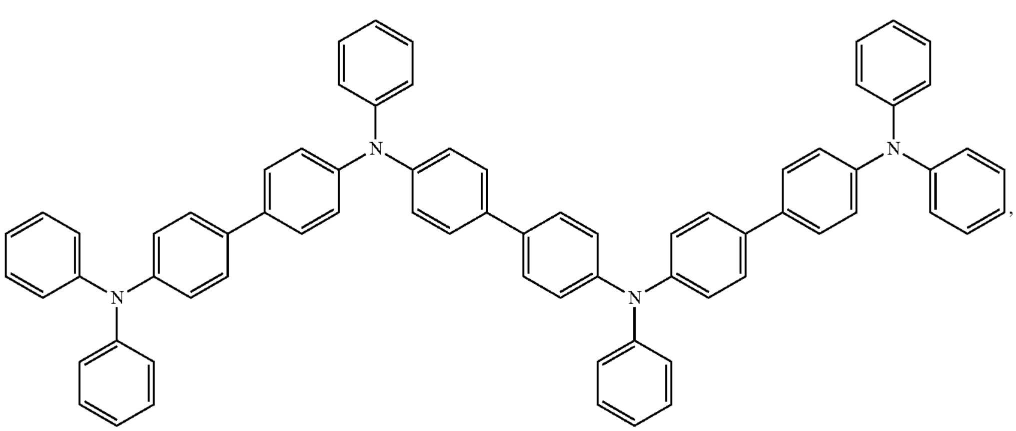

-continued
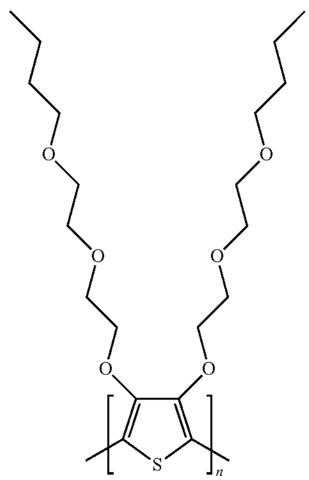
,
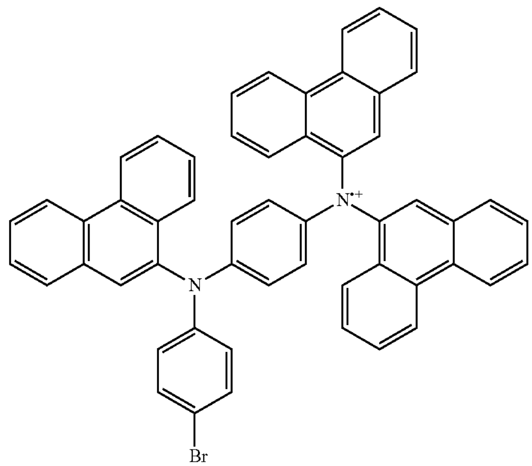
,
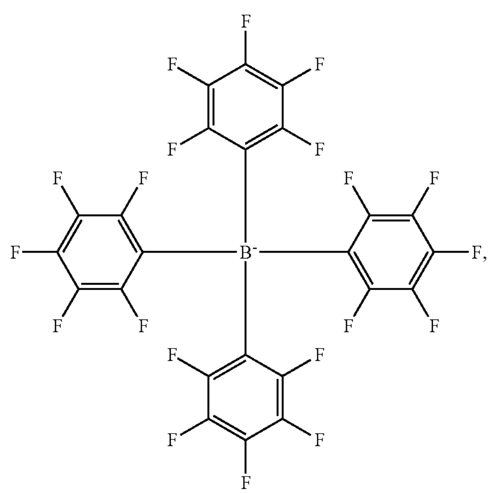
,
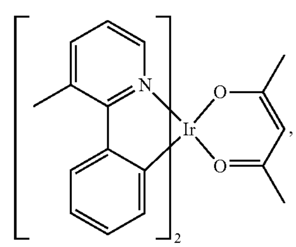
,
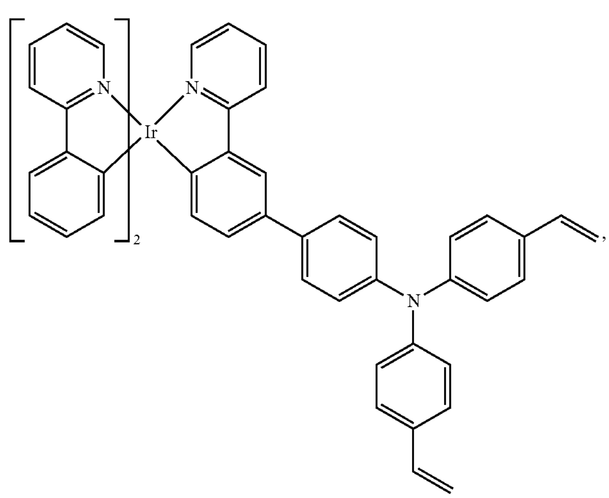
, -continued
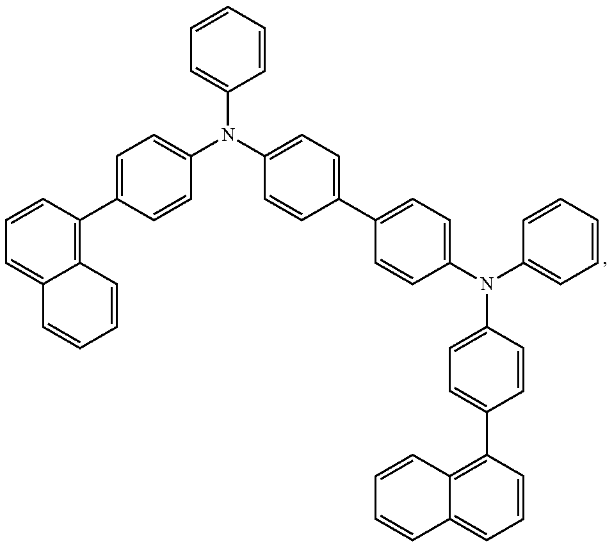
,
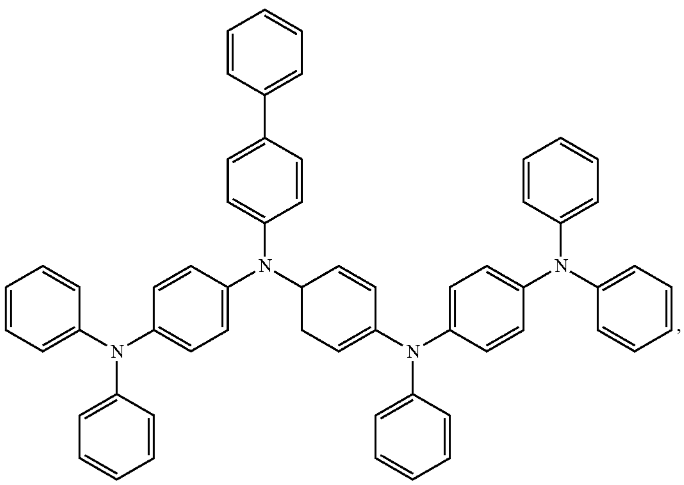
,
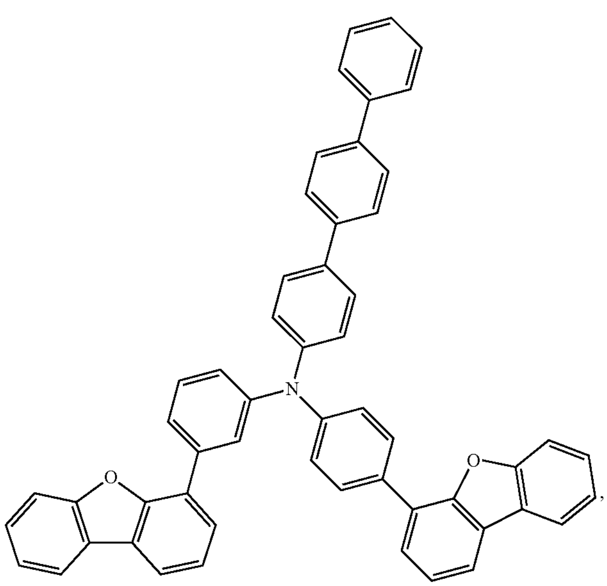
, -continued
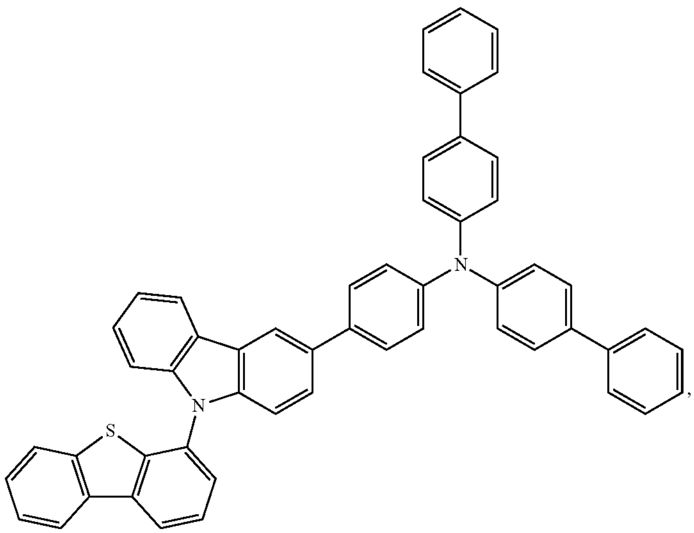
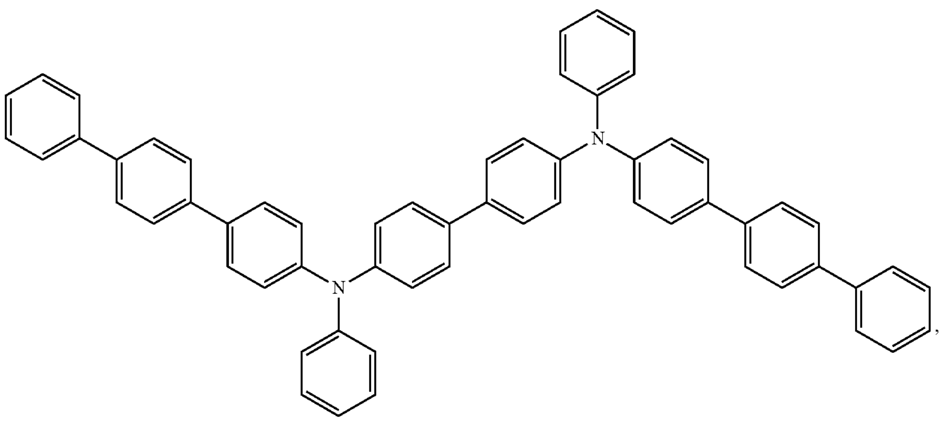
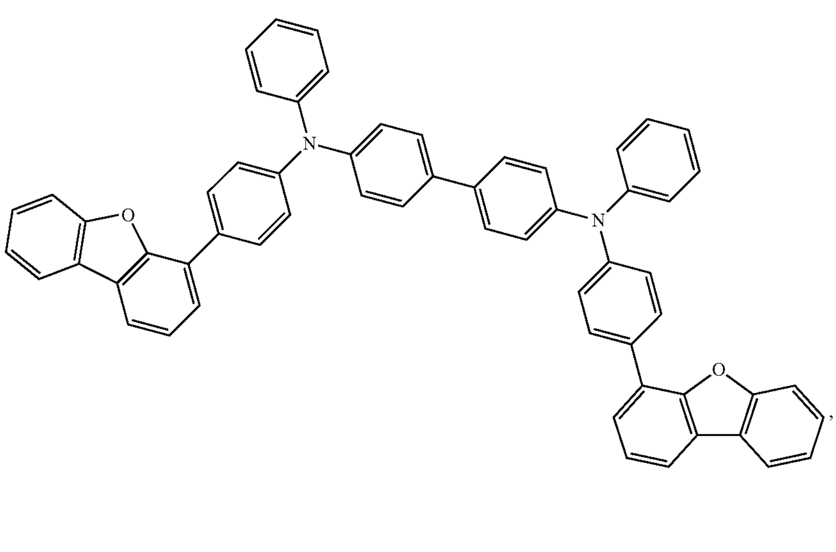

-continued
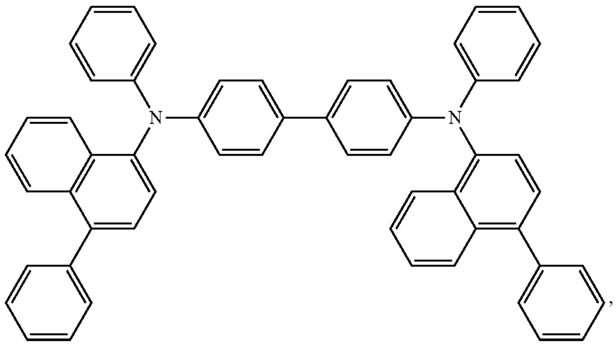
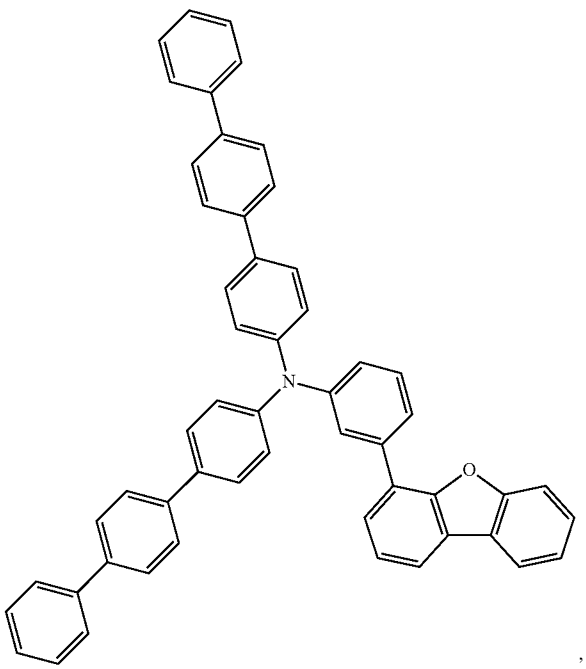
,
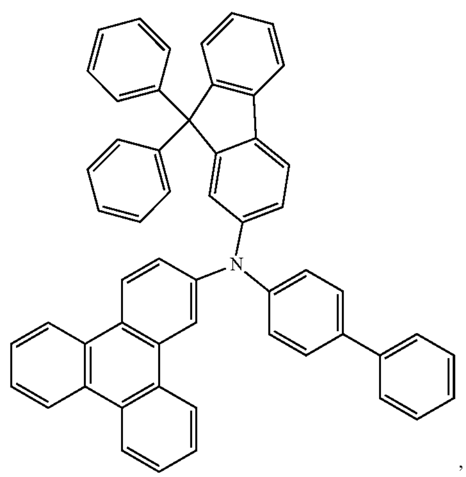
,
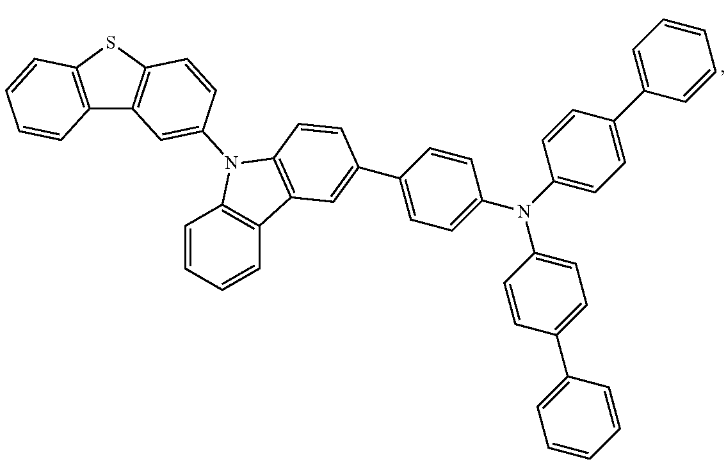

-continued
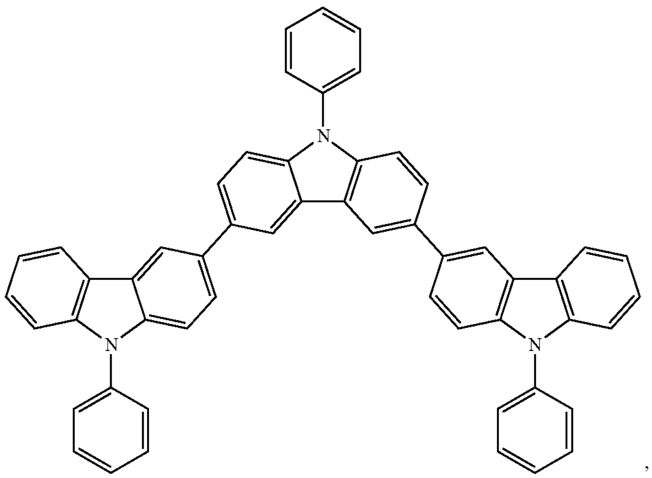
,
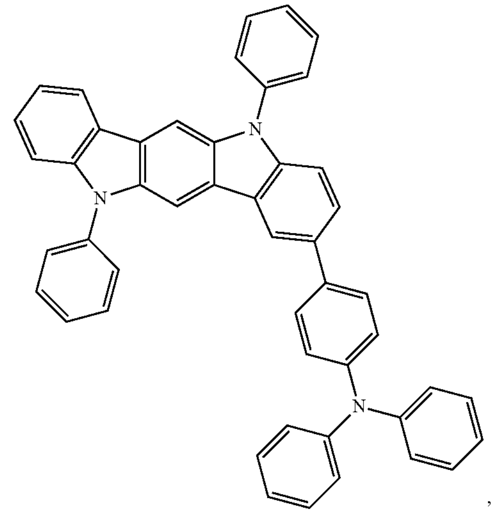
,
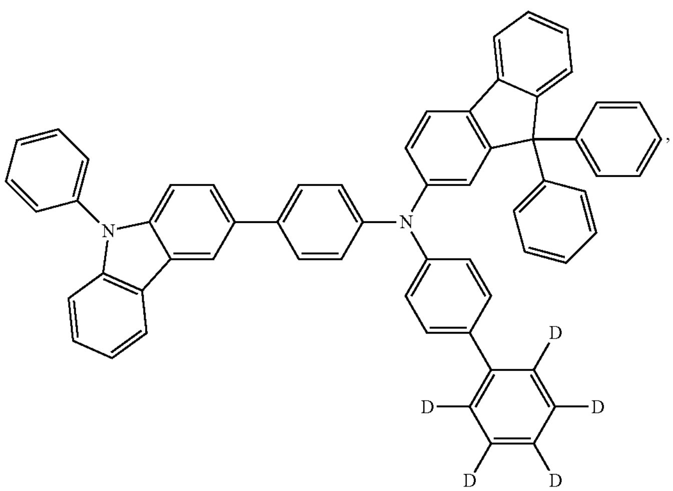
,
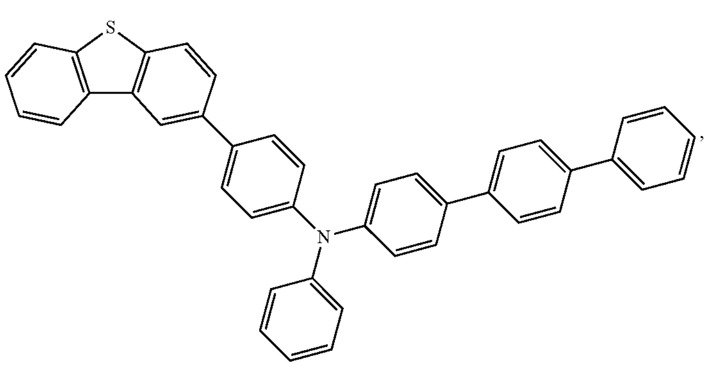
,

-continued
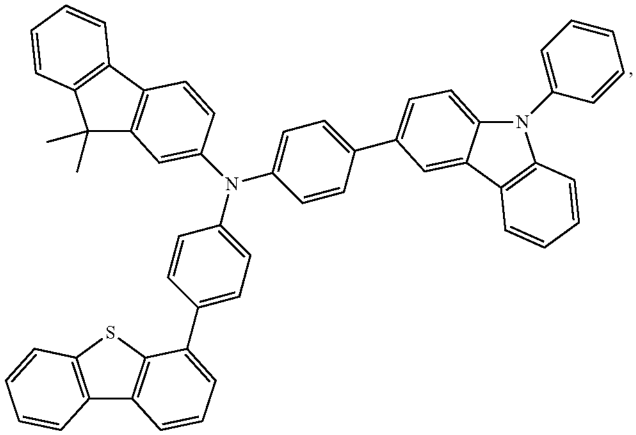
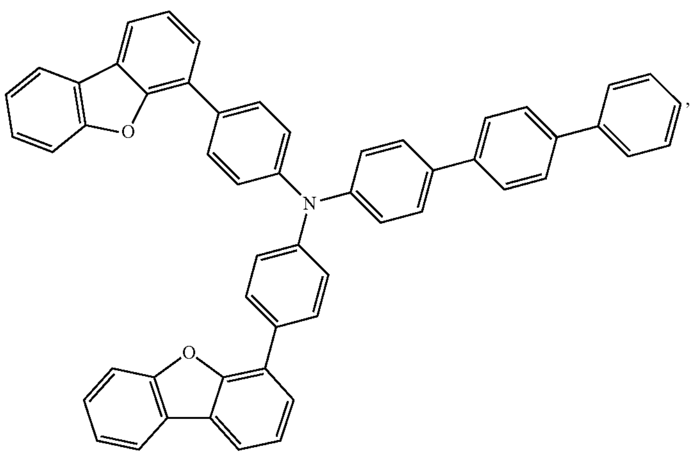
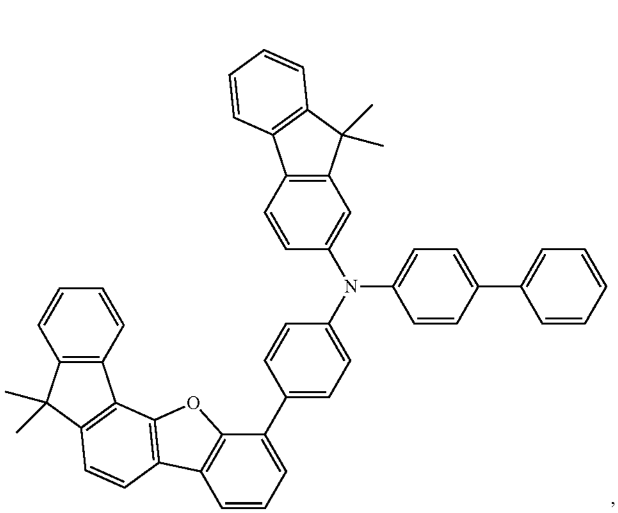
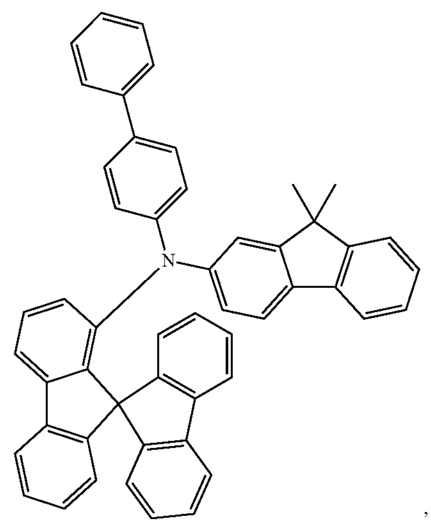

-continued
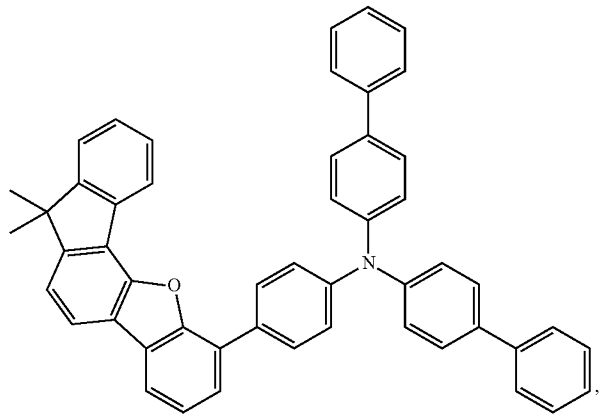
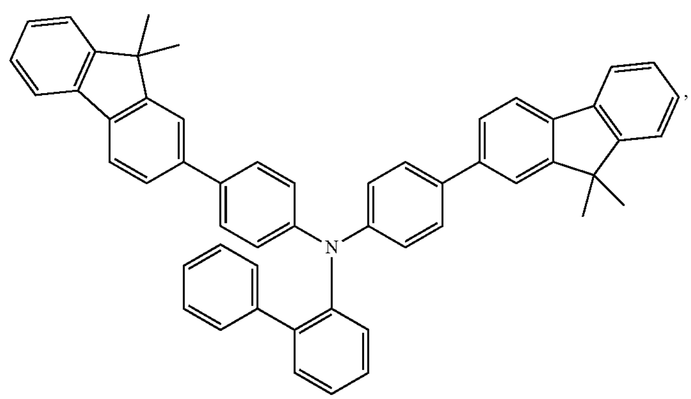
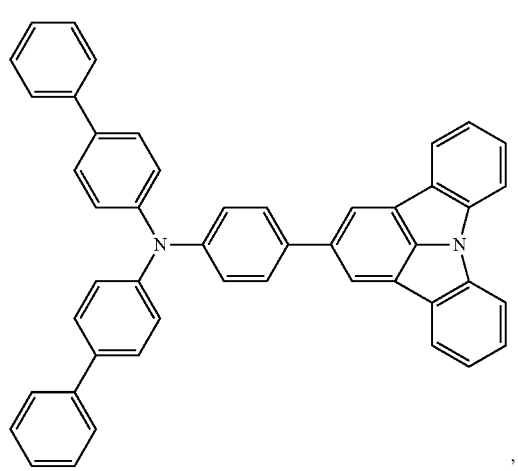
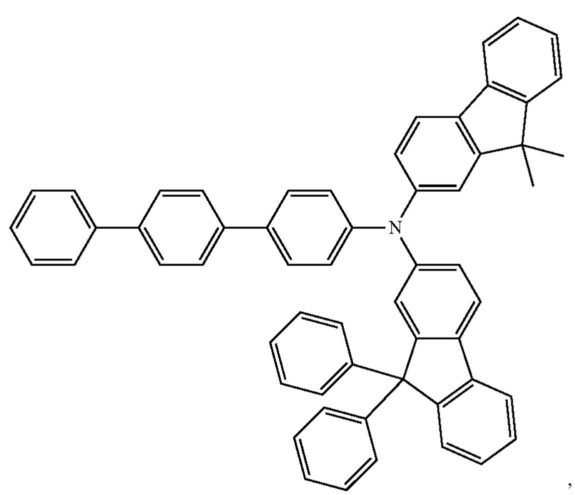

-continued
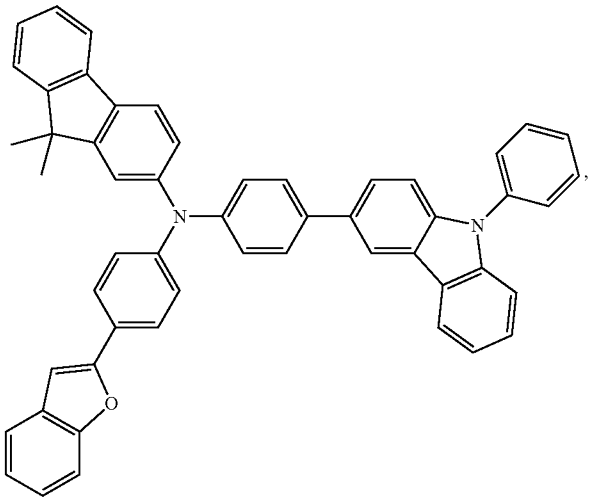
,
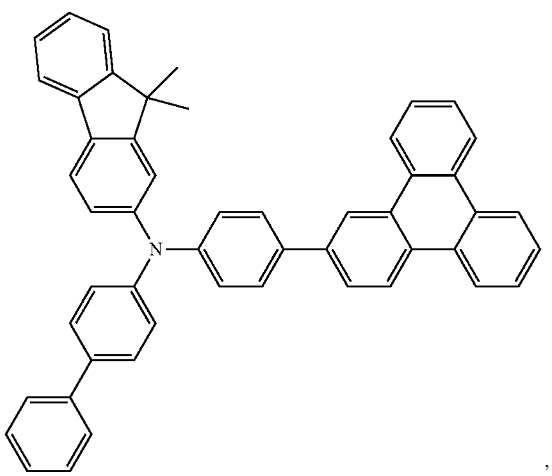
,
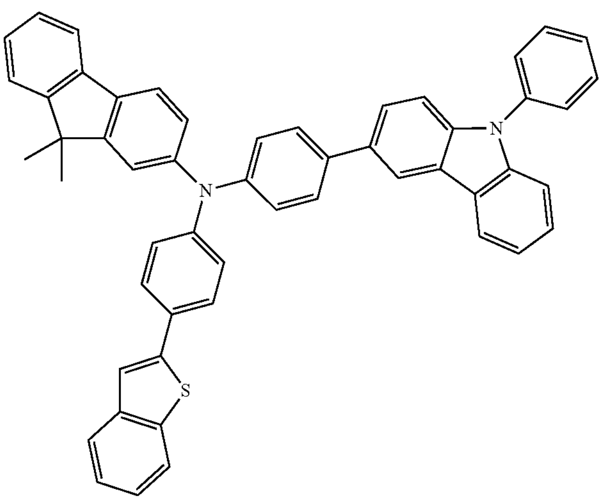
,
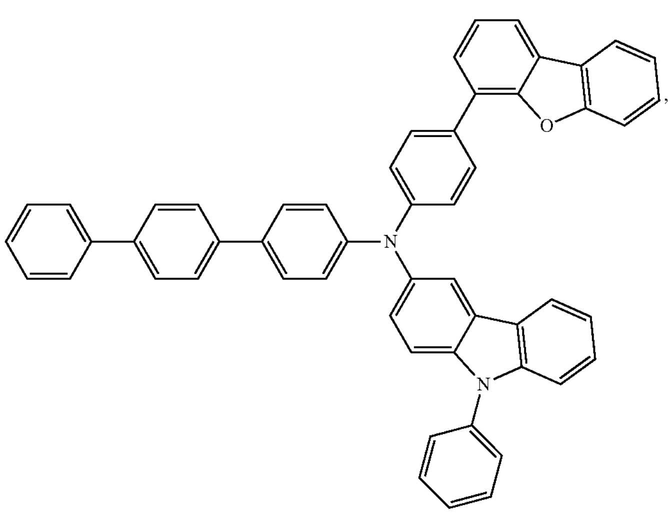
,

-continued
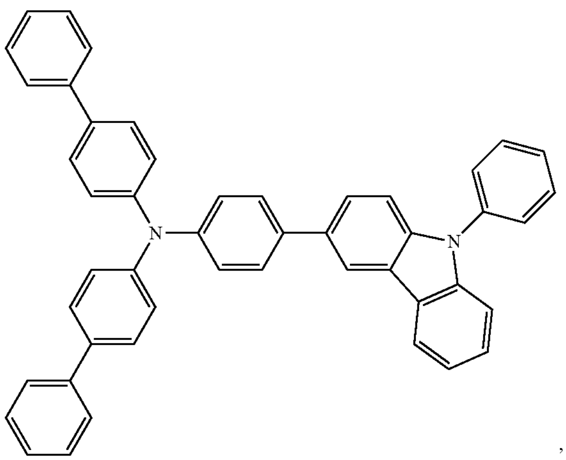
,
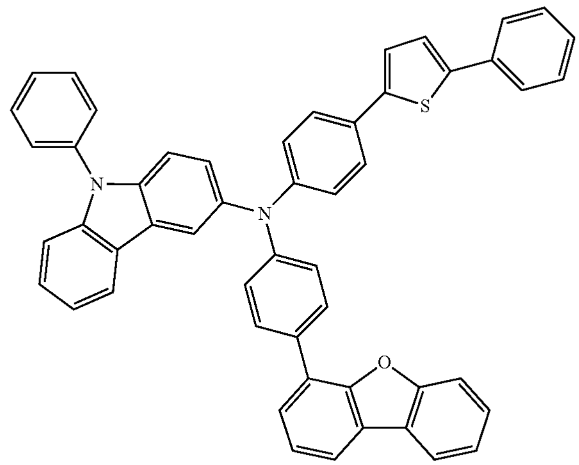
,
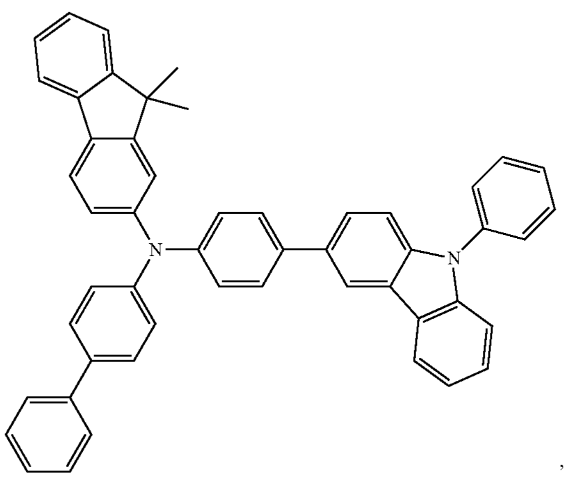
,
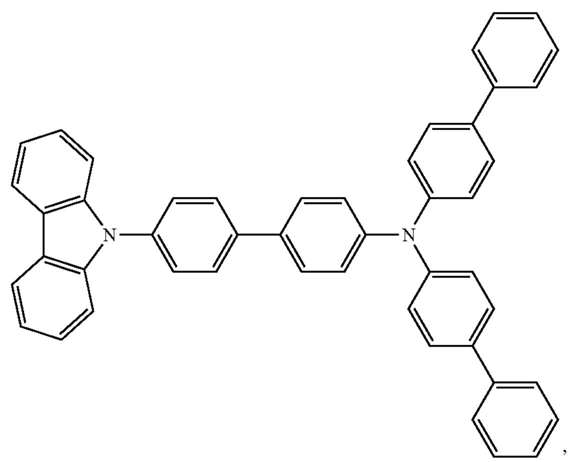
,
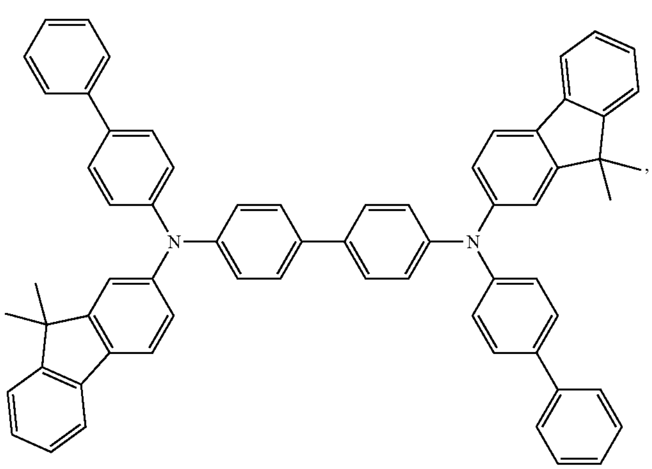
, -continued
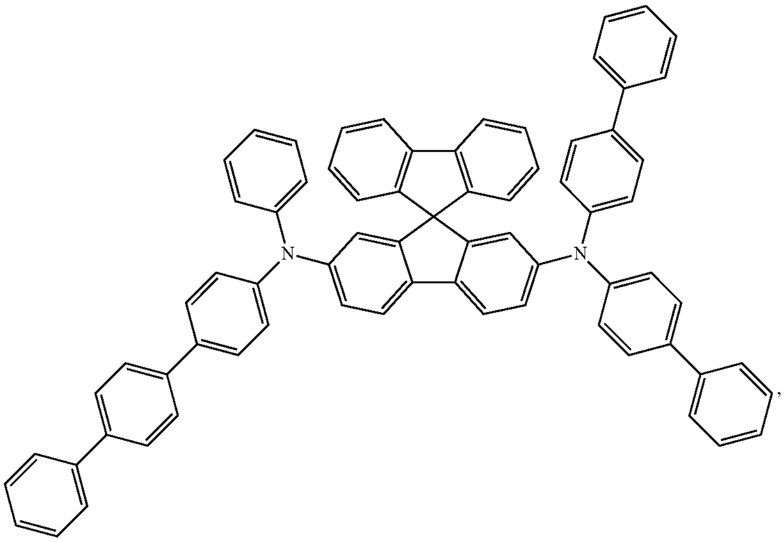
,
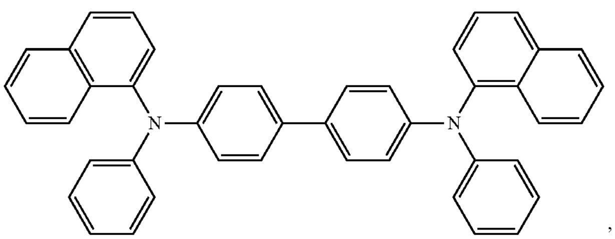
,
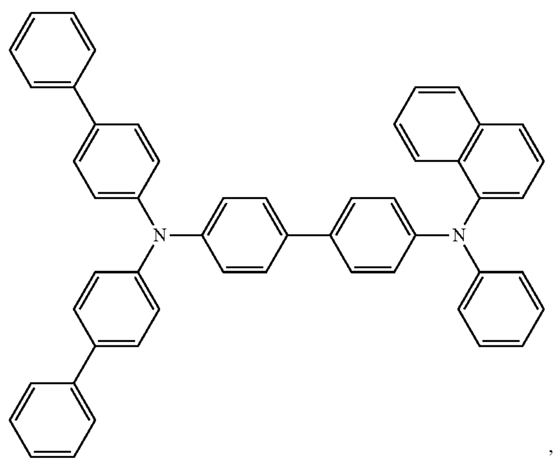
,
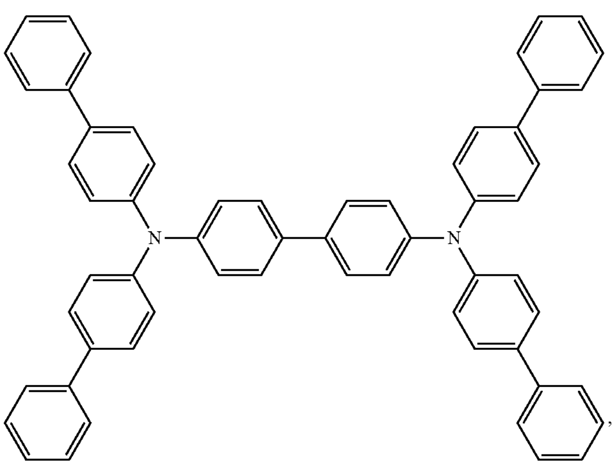
, -continued
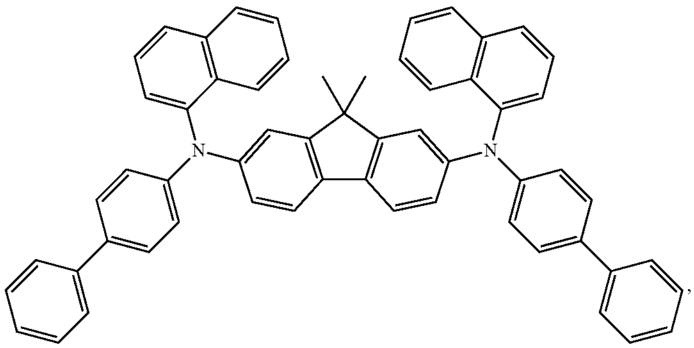
,
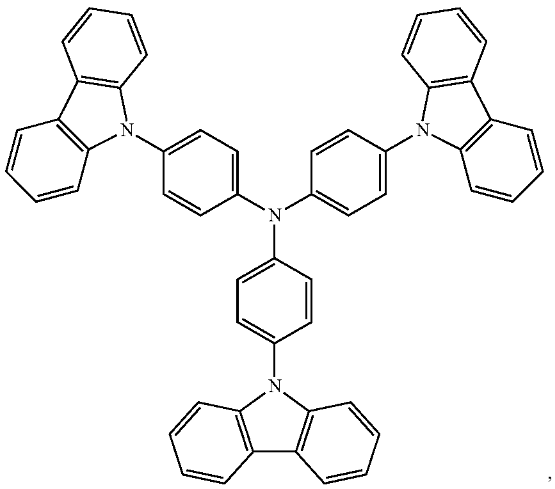
,
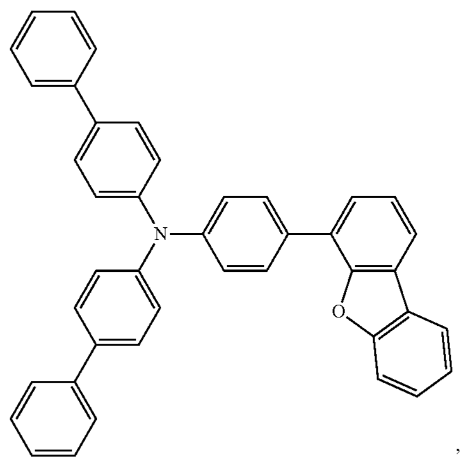
,
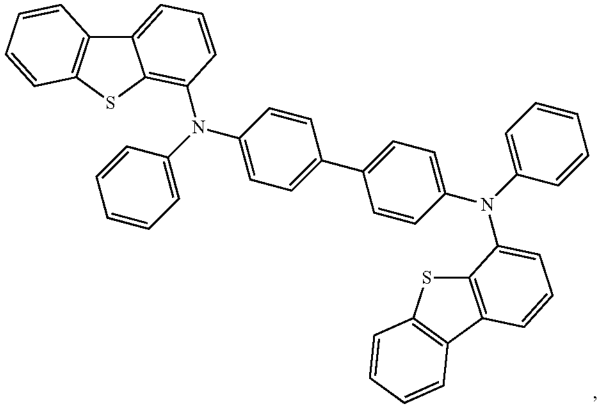
,
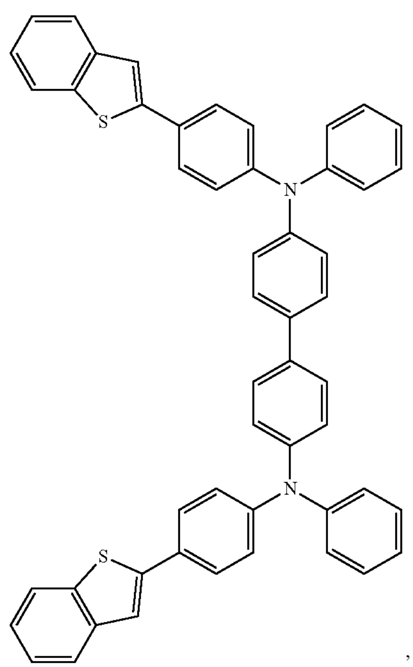
, and -continued

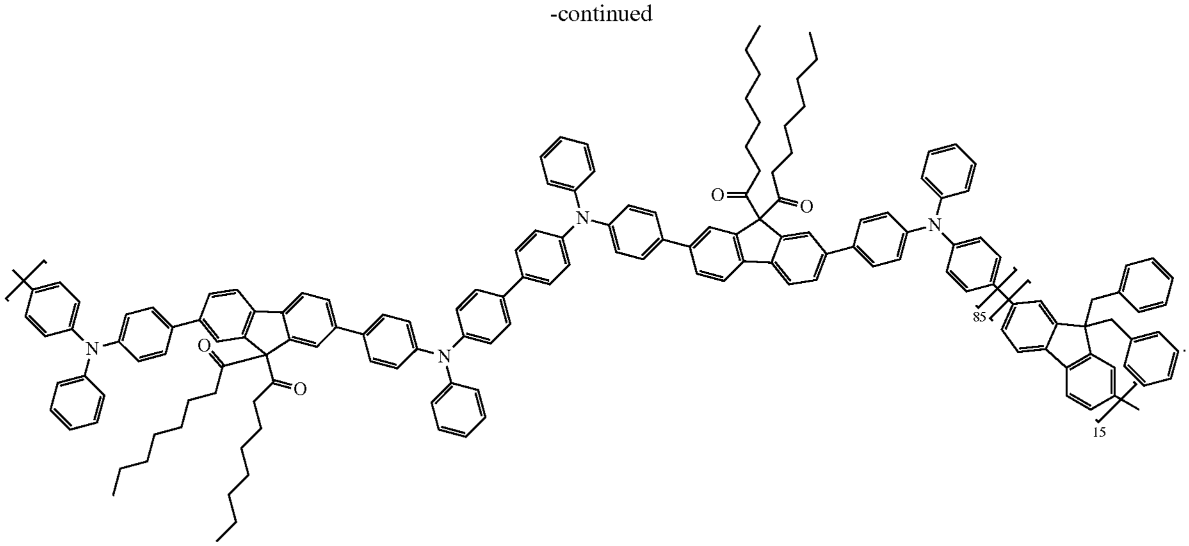

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic el device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

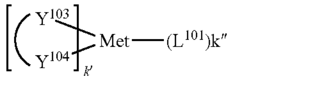

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

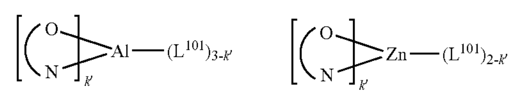

wherein (O—N) is a bidentate ligand, having metal coordinated to atoms O and N.

In another aspect, met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

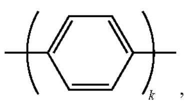
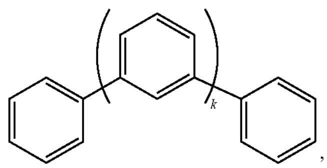
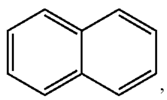
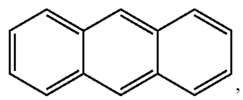
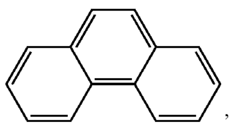
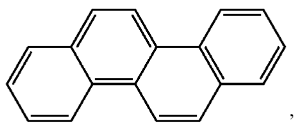
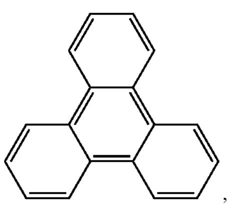
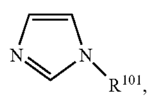
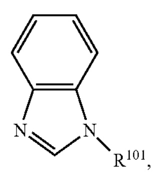
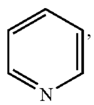
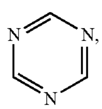
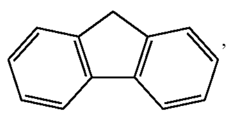
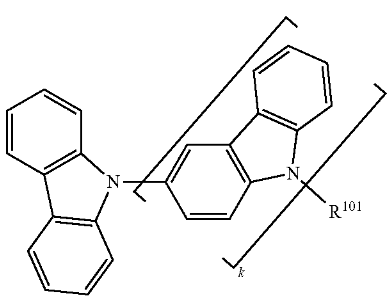
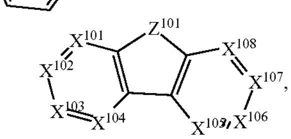
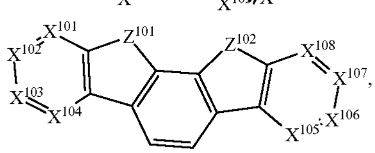
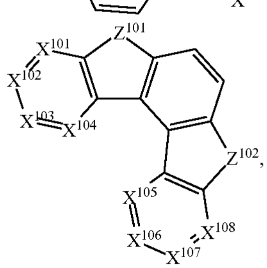

-continued

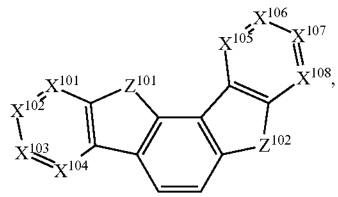
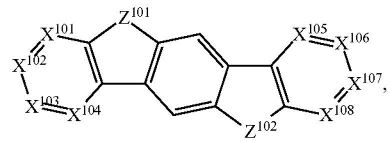
AND
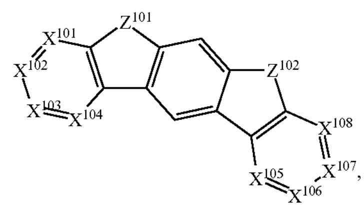

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

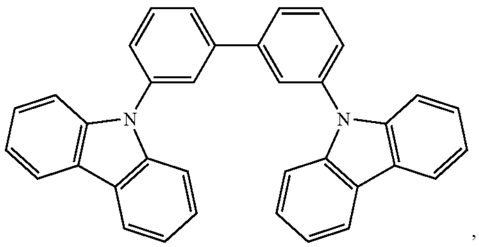
,
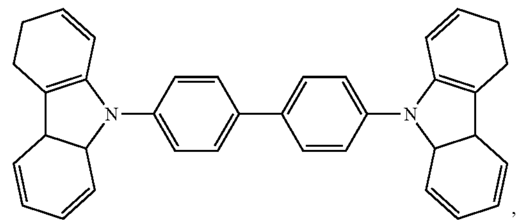
,
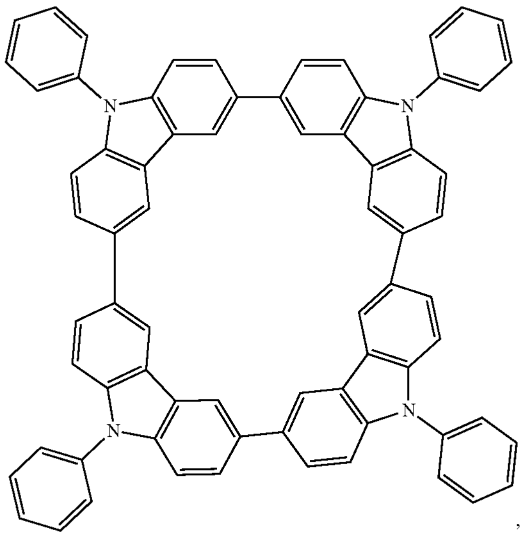
,
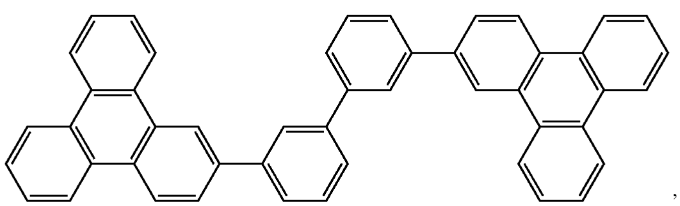
,
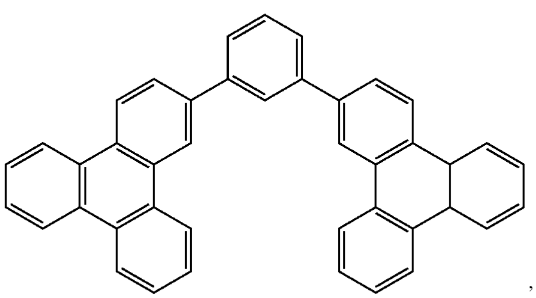
,
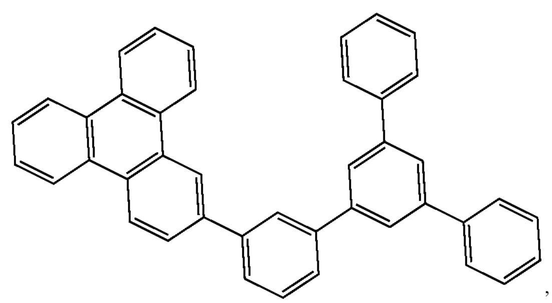
,
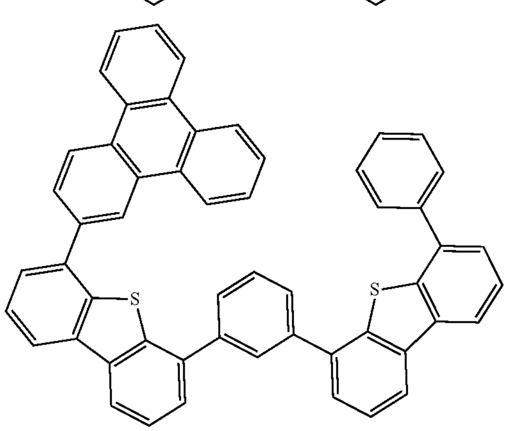
,
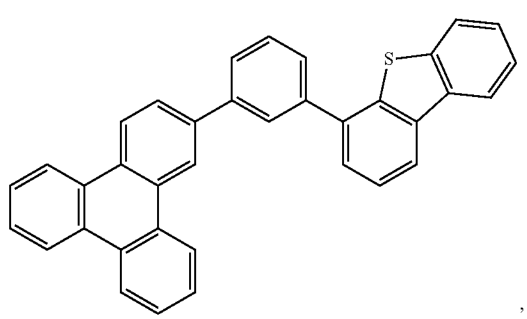
, -continued
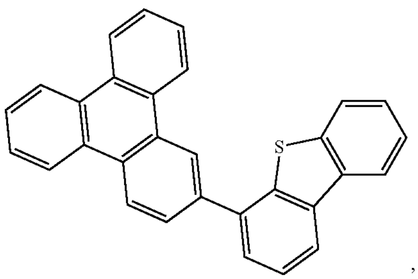
,
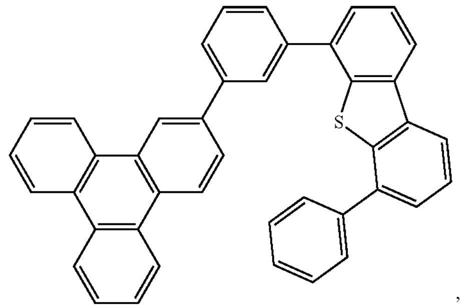
,
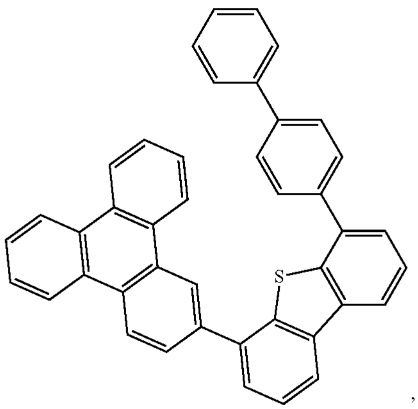
,
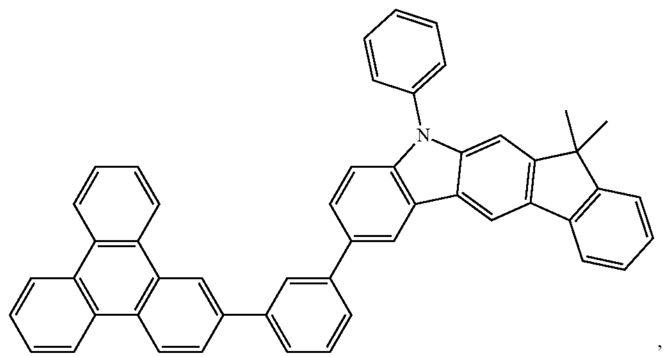
,
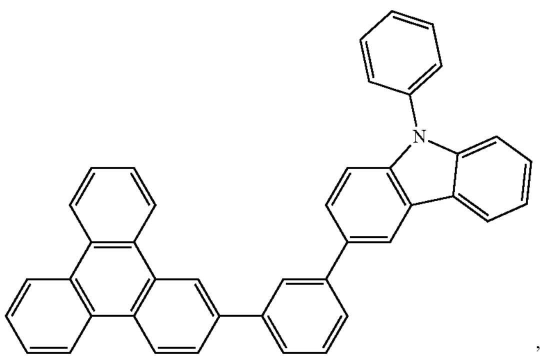
,
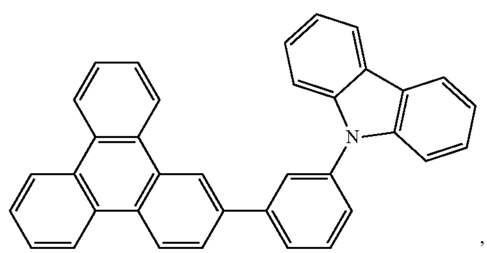
,
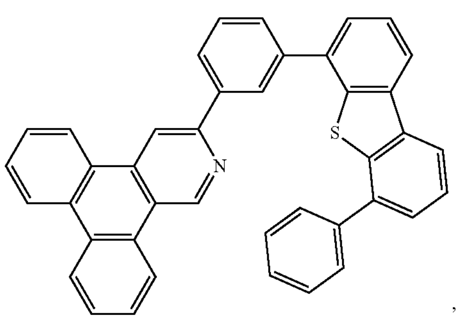
,
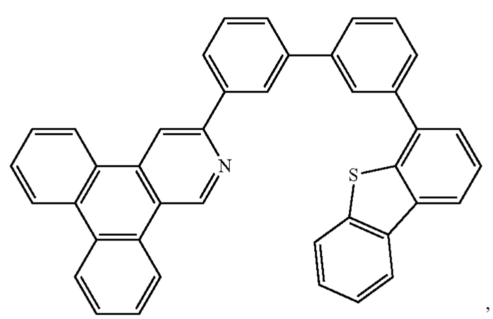
,
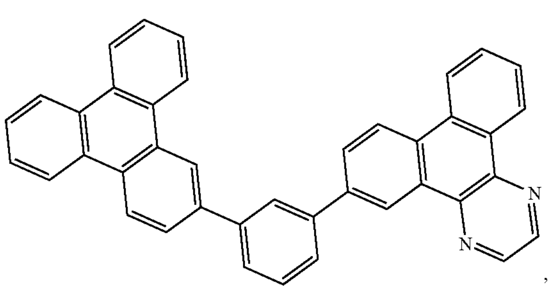
,
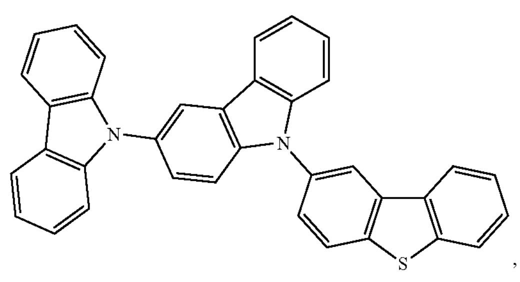
, -continued
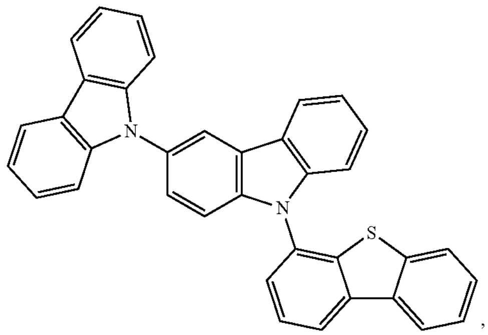
,
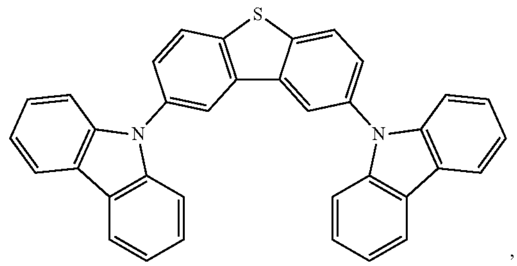
,
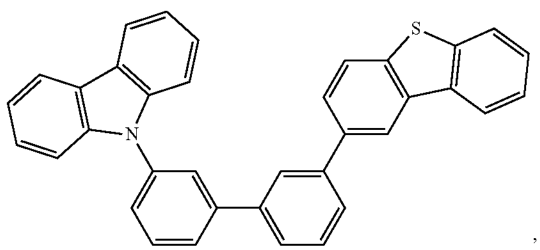
,
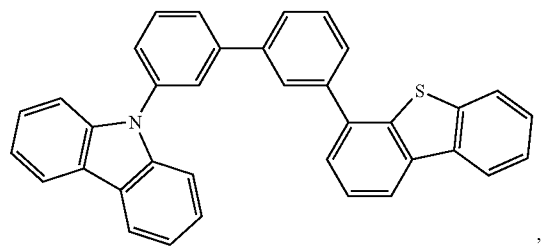
,
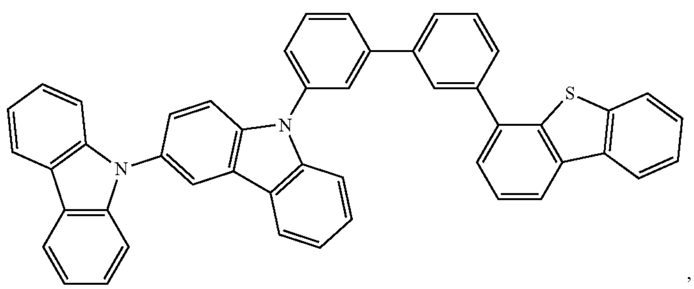
,
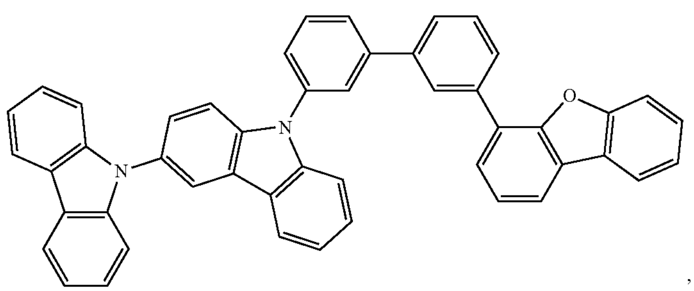
,
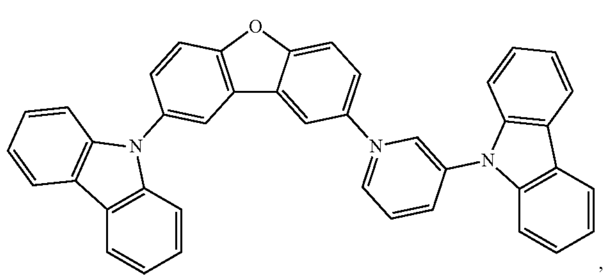
,
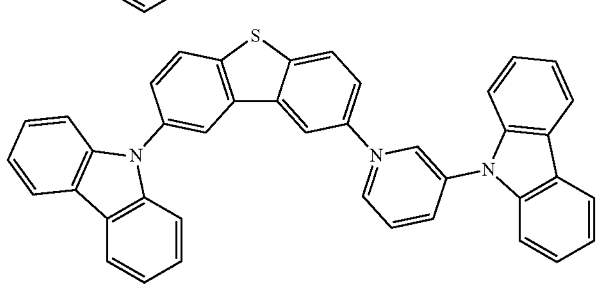
, -continued
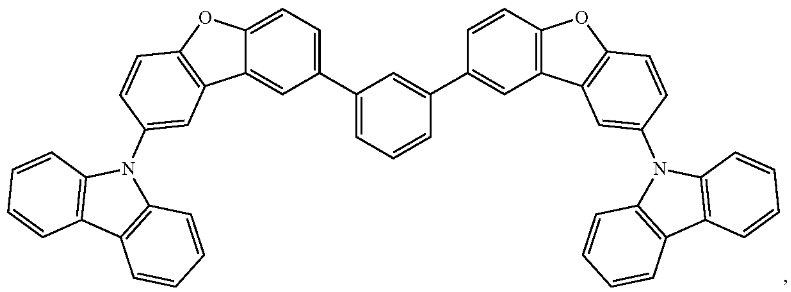
,
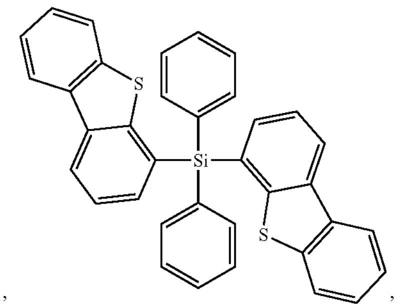
,
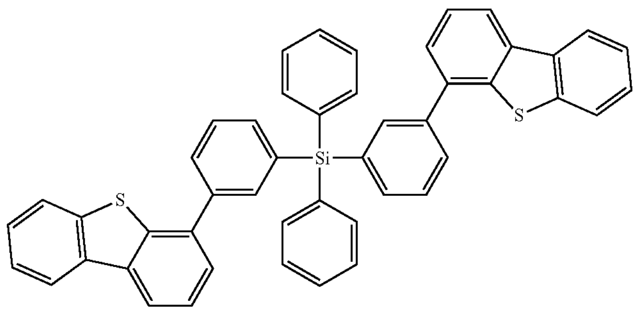
,
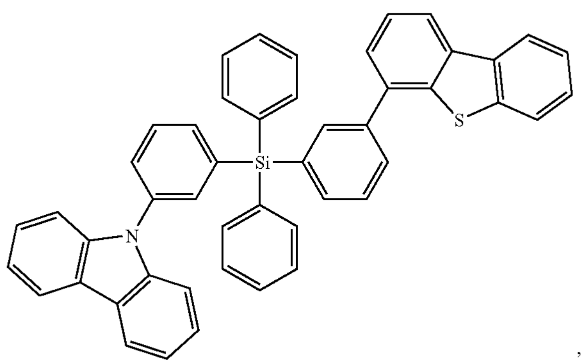
,
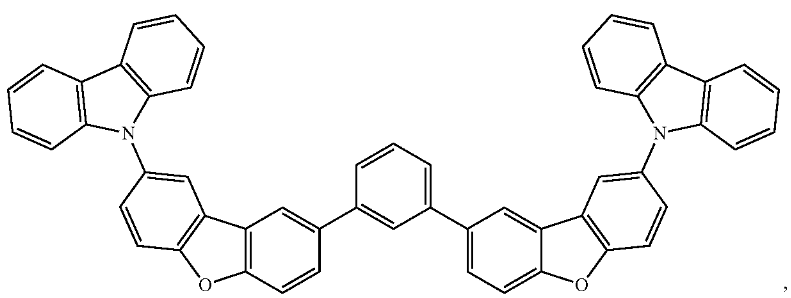
,
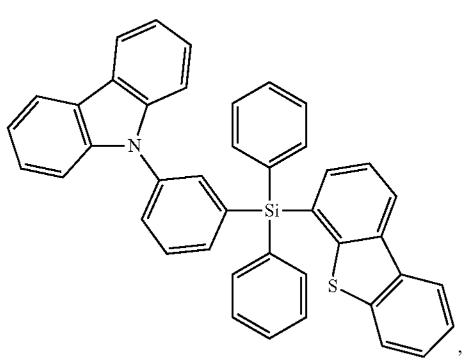
,
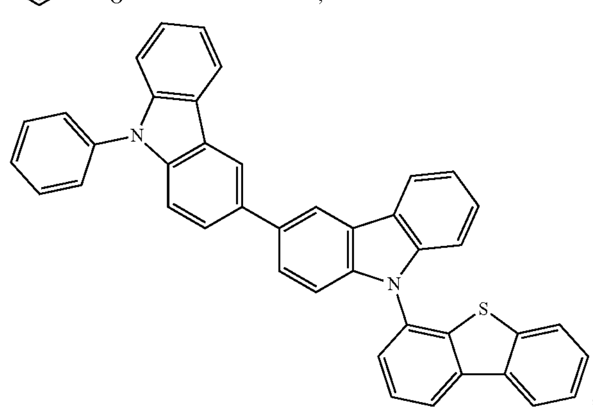
, -continued
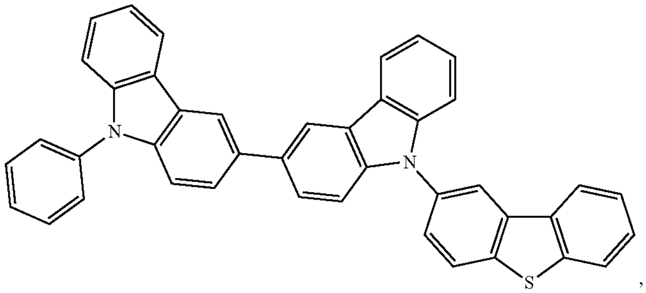
,
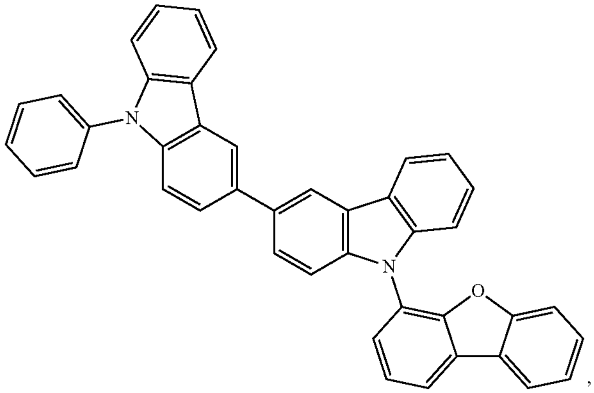
,
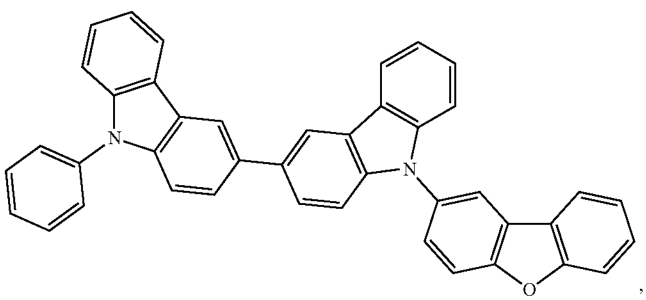
,
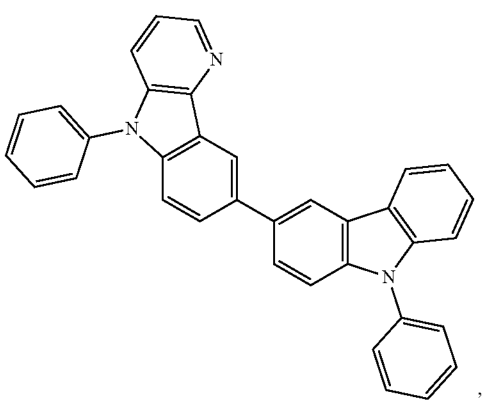
,
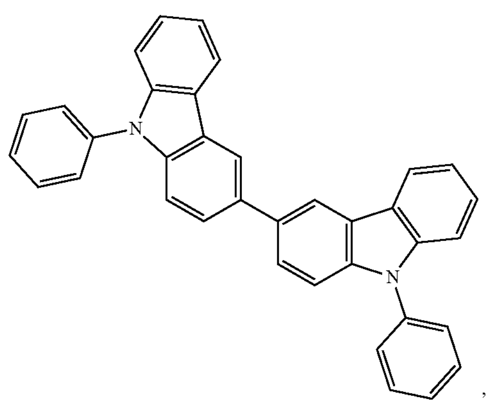
, -continued
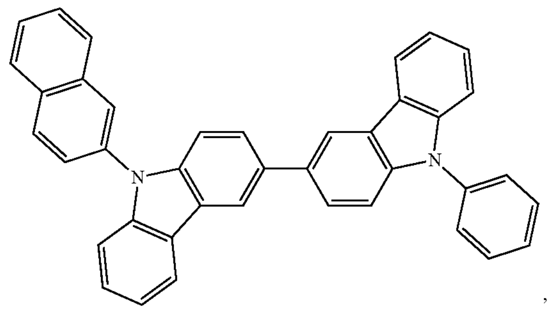
,
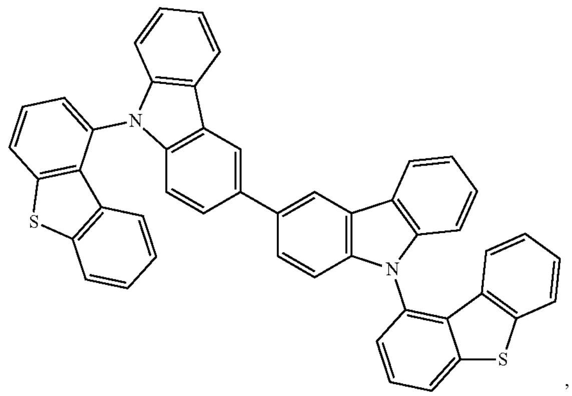
,
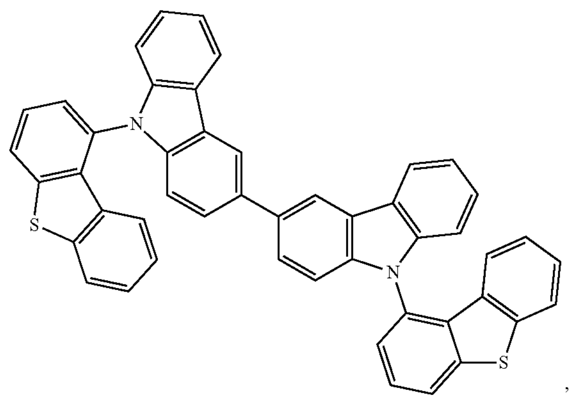
,
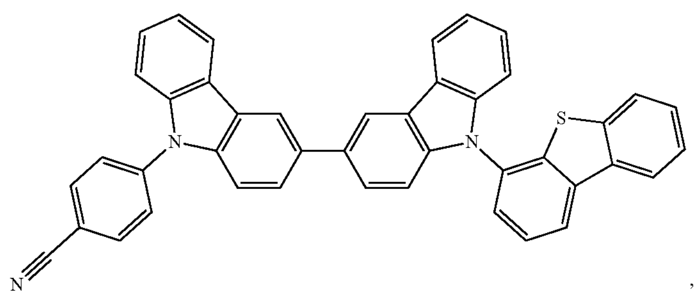
,
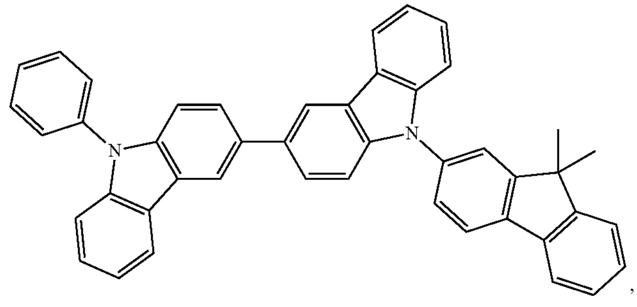
, -continued
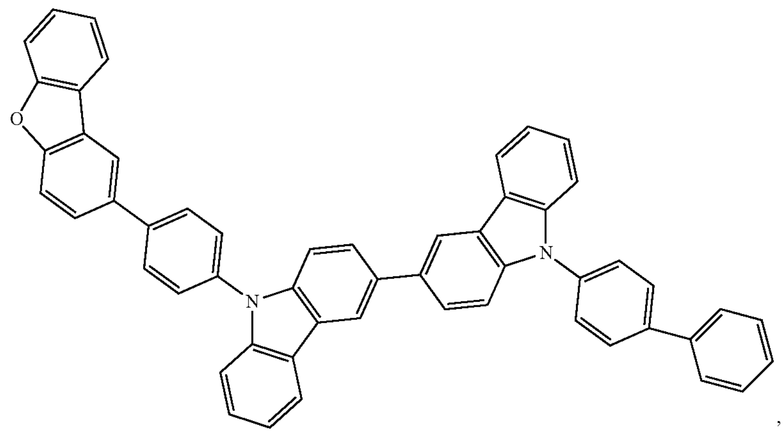
,
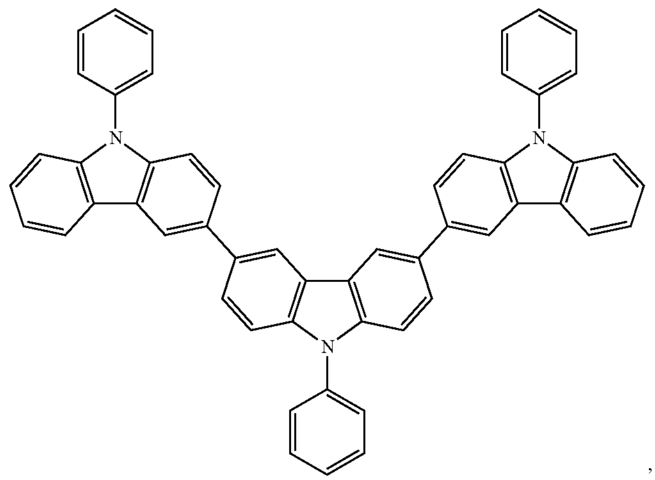
,
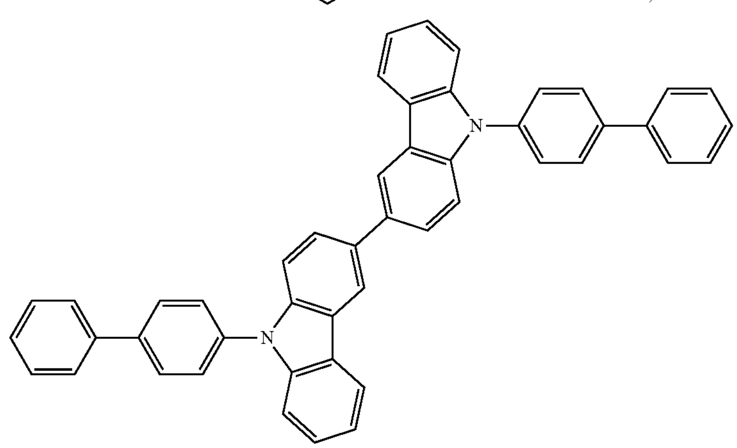
,
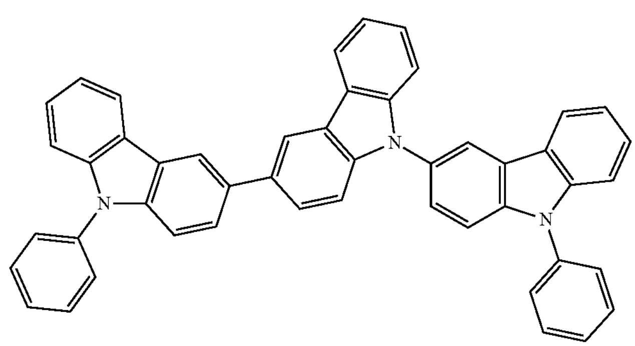
, -continued
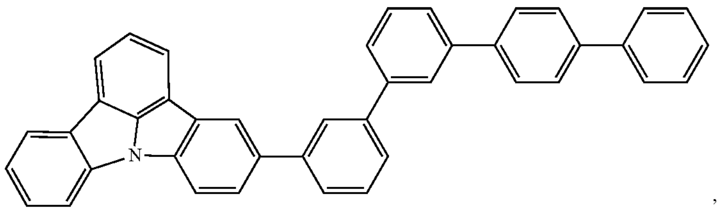
,
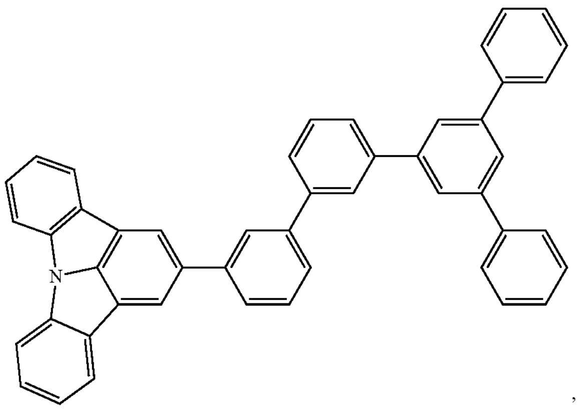
,
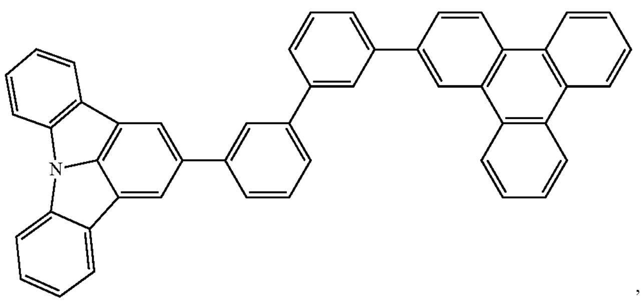
,
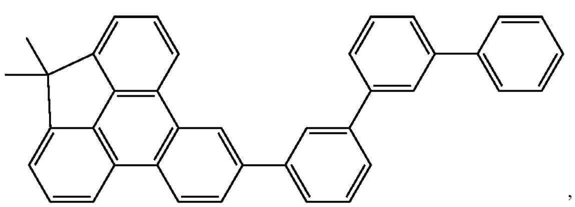
,
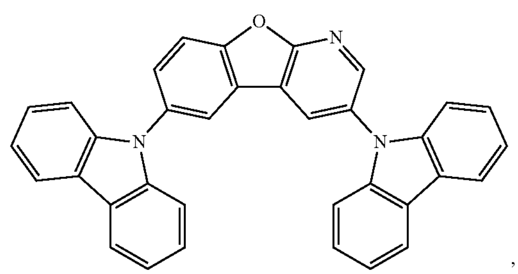
,
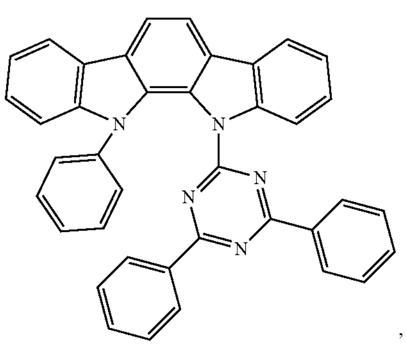
,
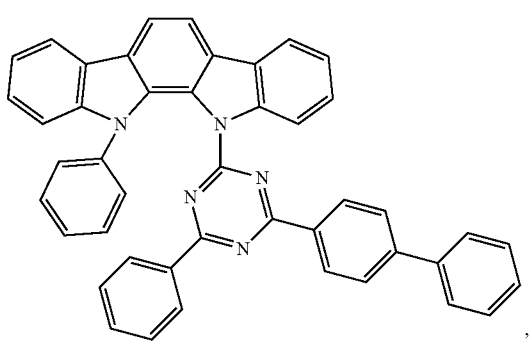
, -continued
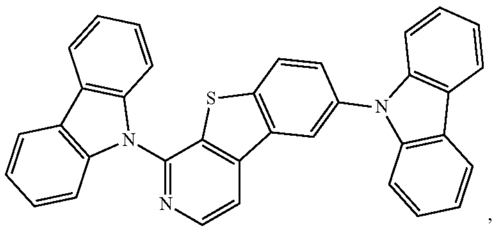
,
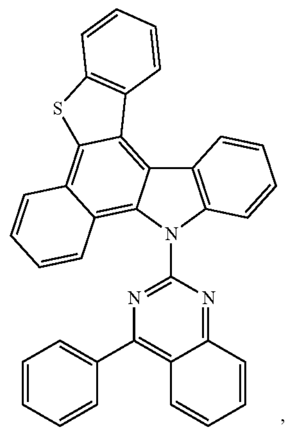
,
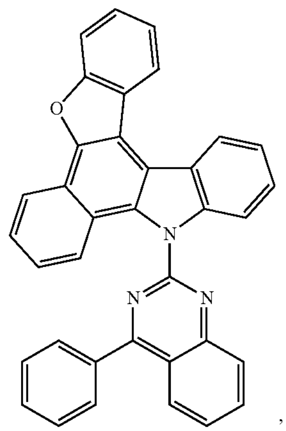
,
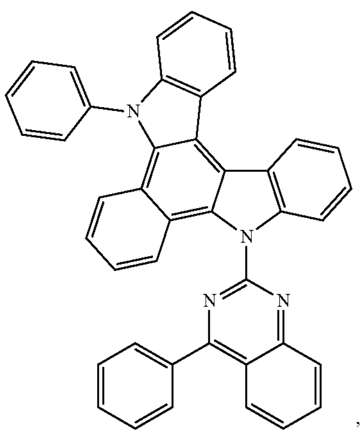
,
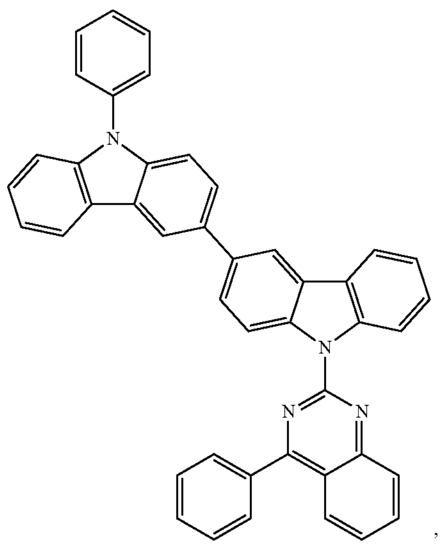
,
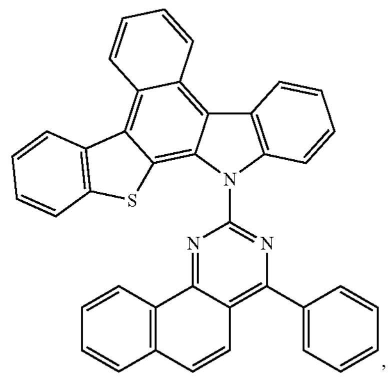
,
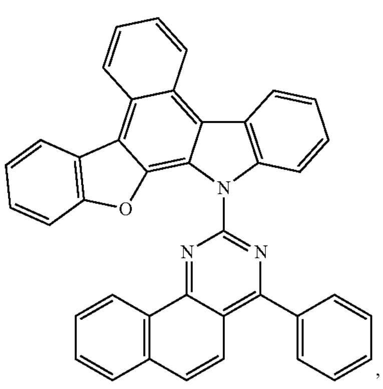
,
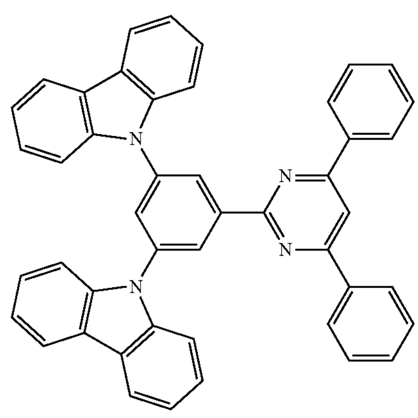
, -continued
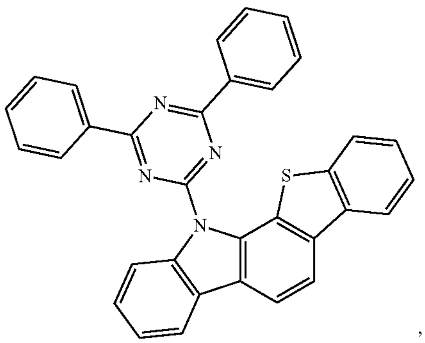
,
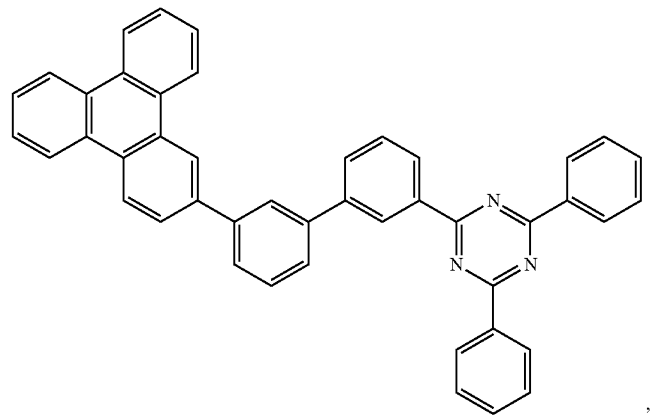
,
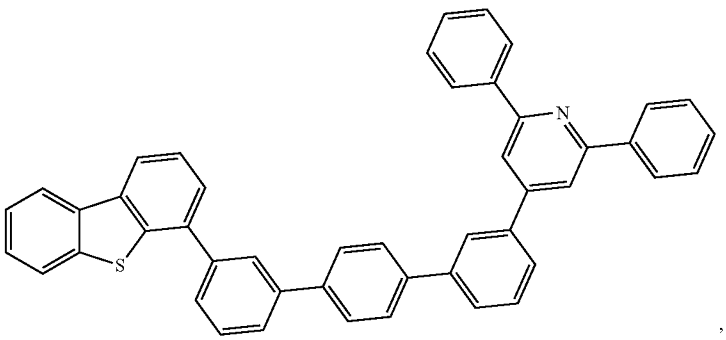
,
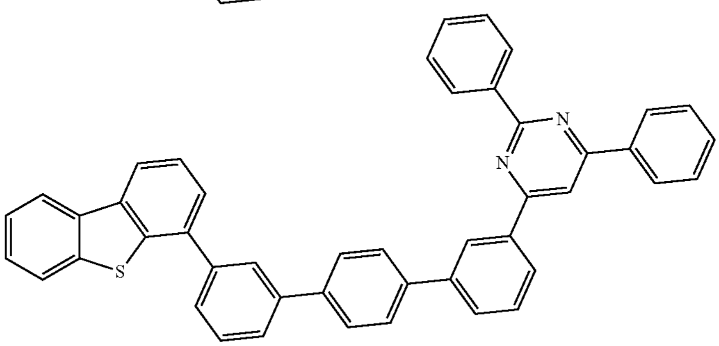
,
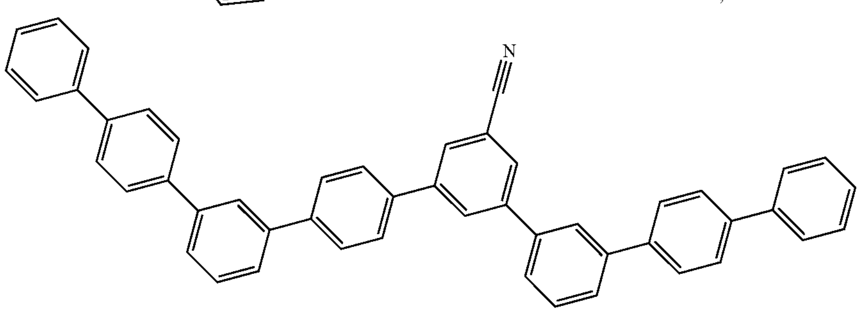
,
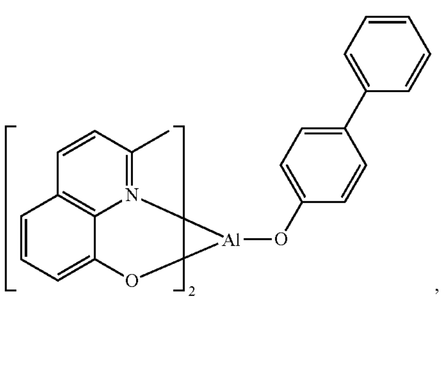
,
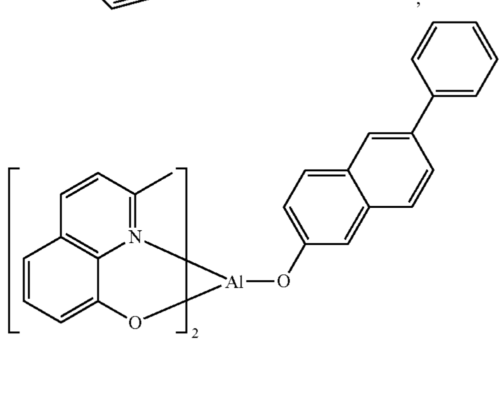
, -continued

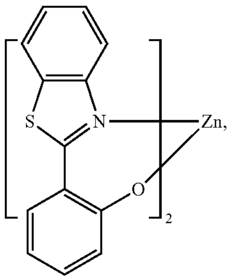

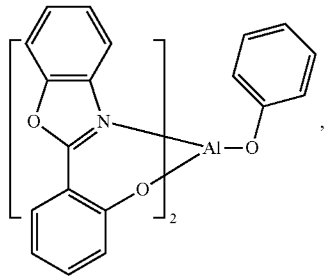

,

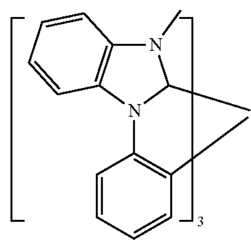

,

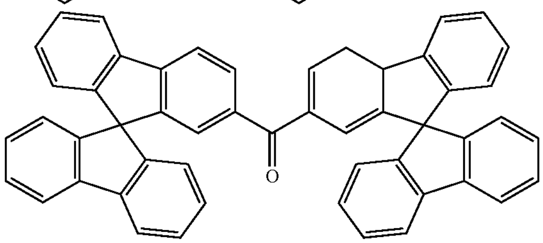

,

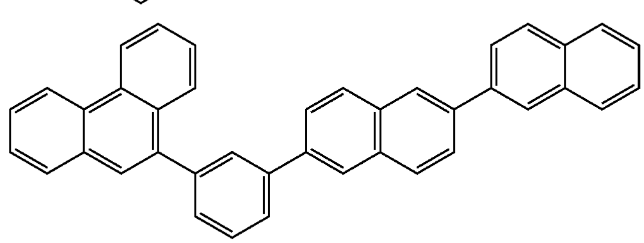

,

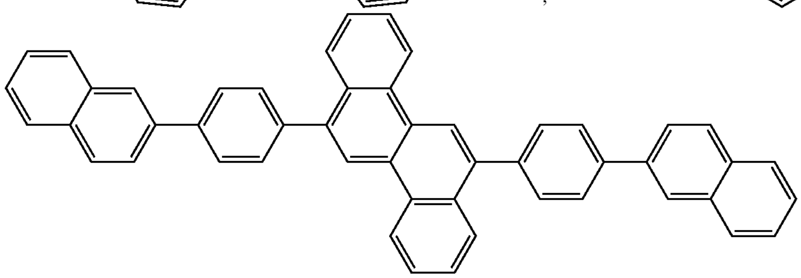

, AND

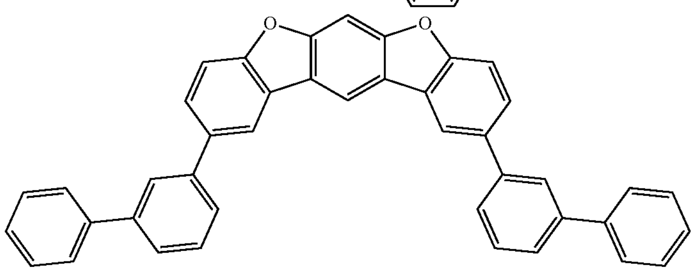

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as e-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
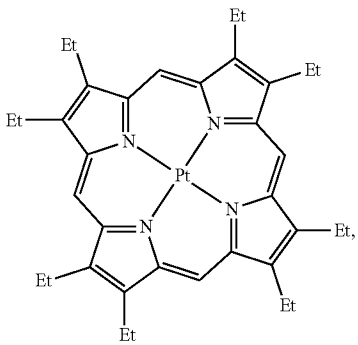
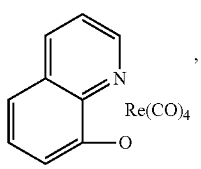
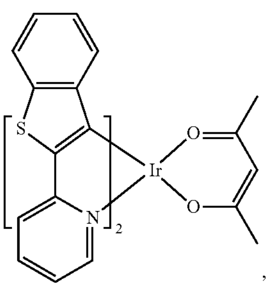
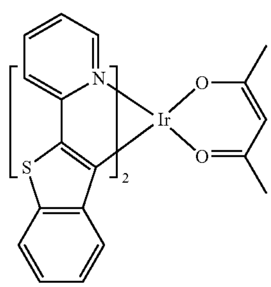
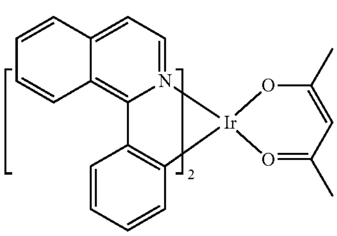
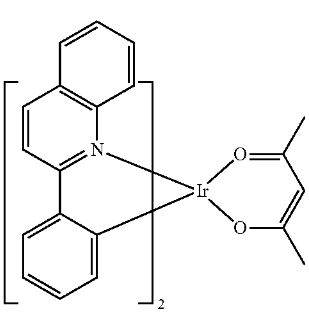
-continued
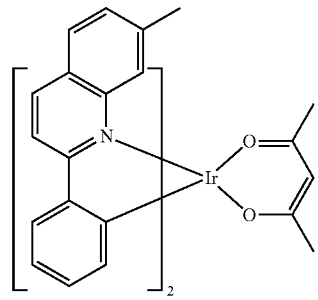
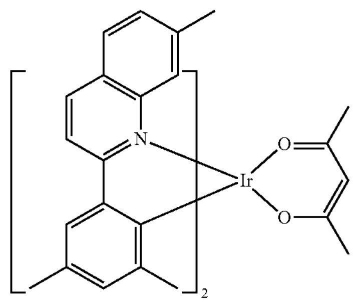
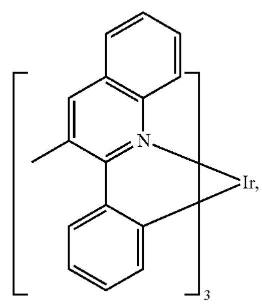
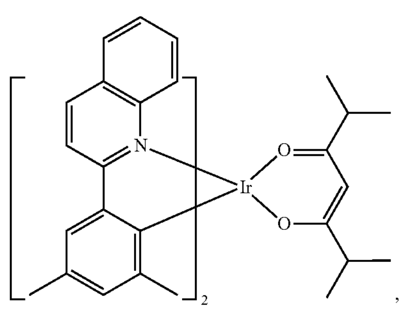
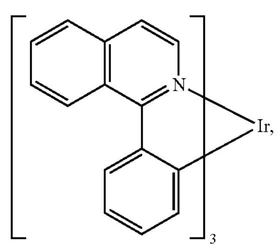

-continued
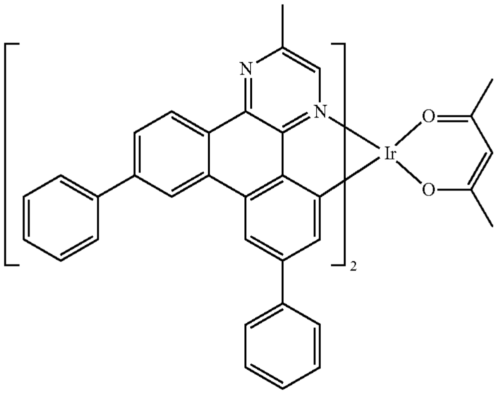
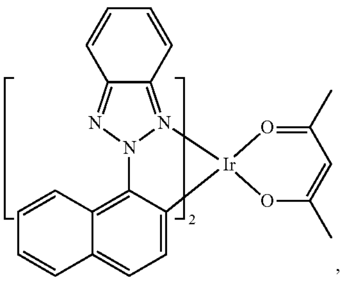
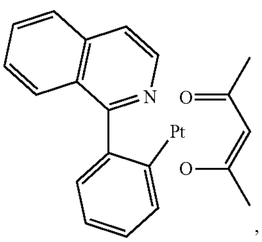
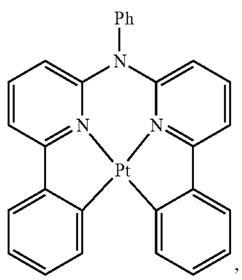
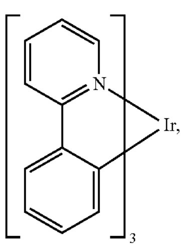
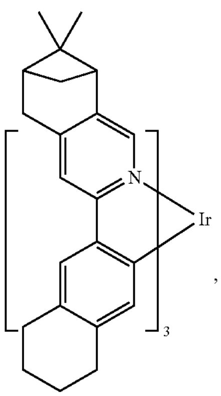
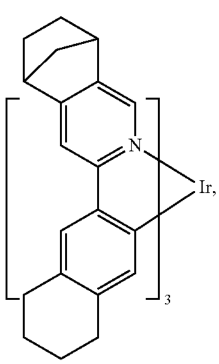
-continued
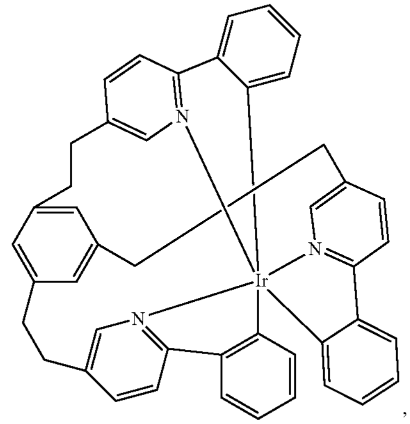
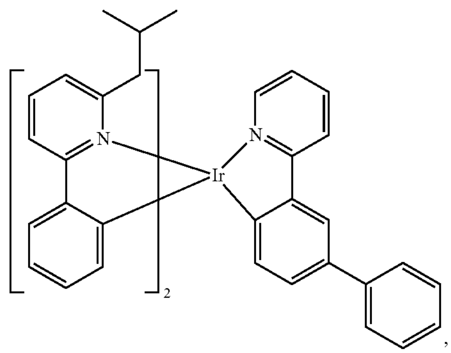
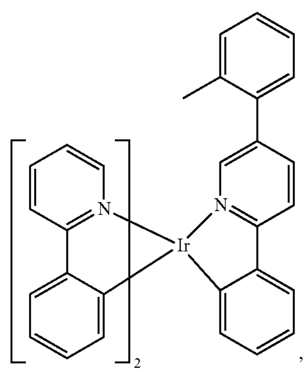
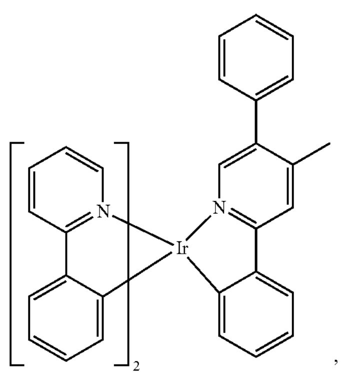

-continued
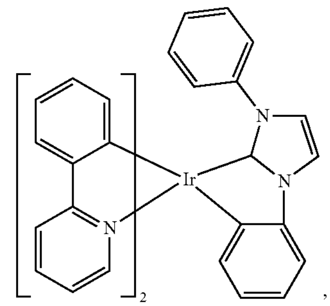
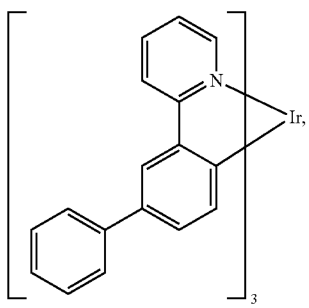
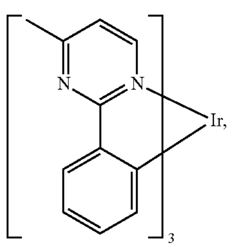
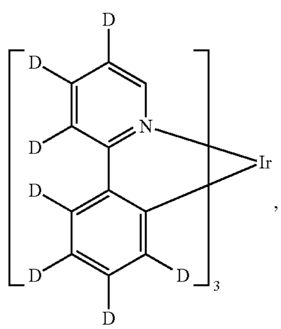
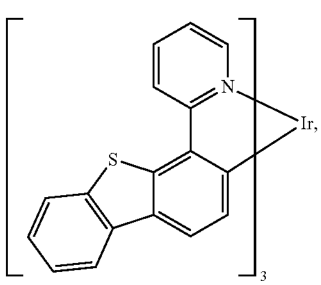
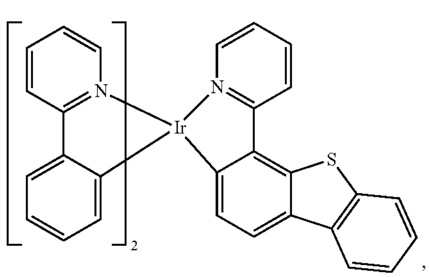
-continued
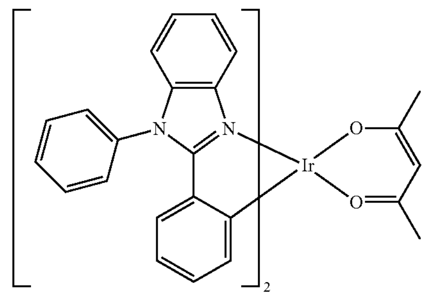
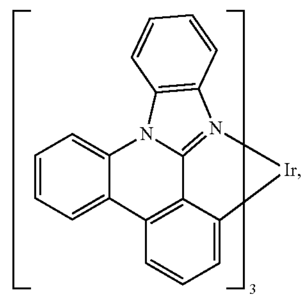
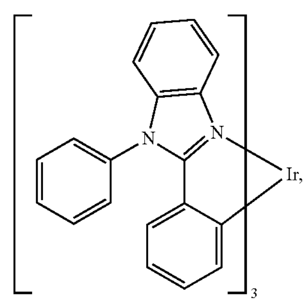
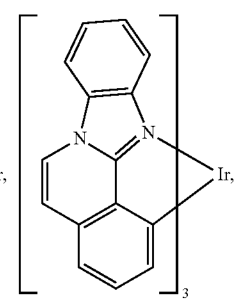
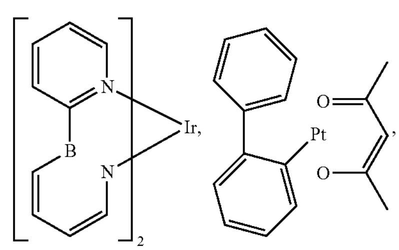
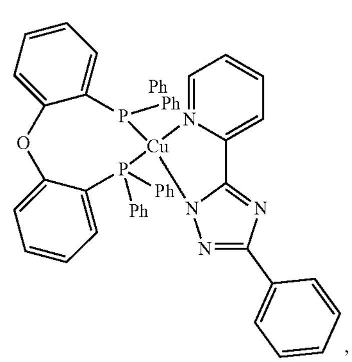

-continued
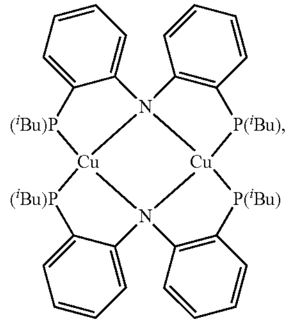
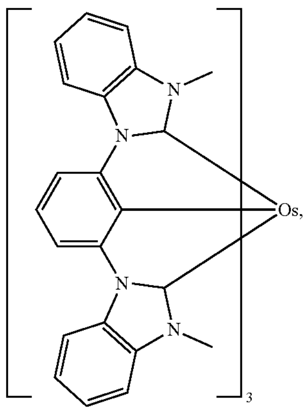
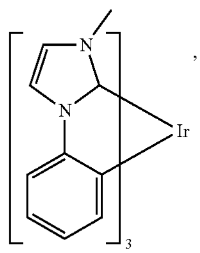
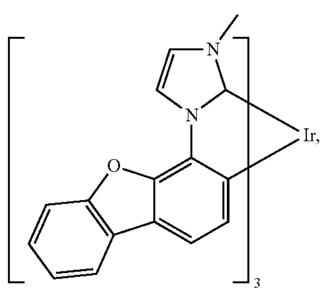
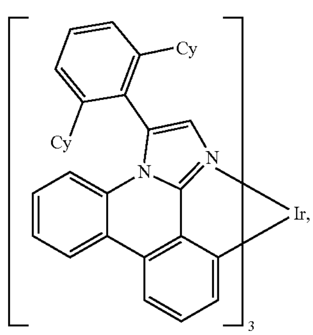
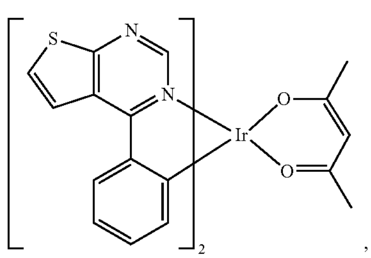
-continued
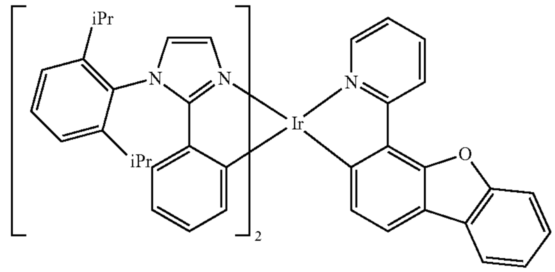
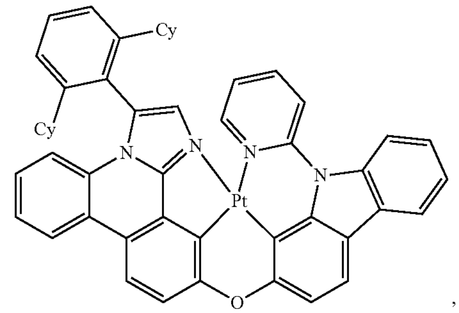
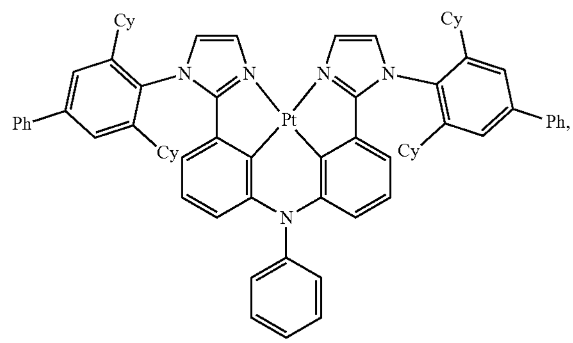
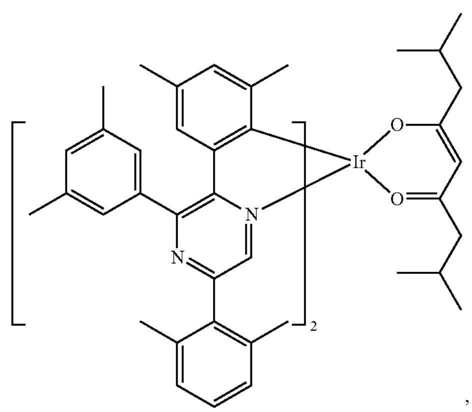
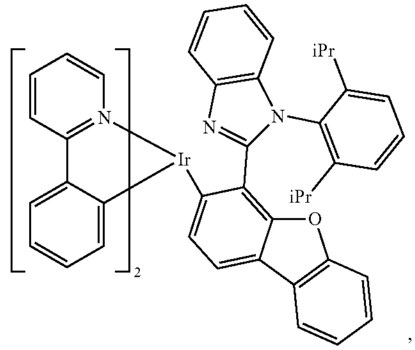

-continued
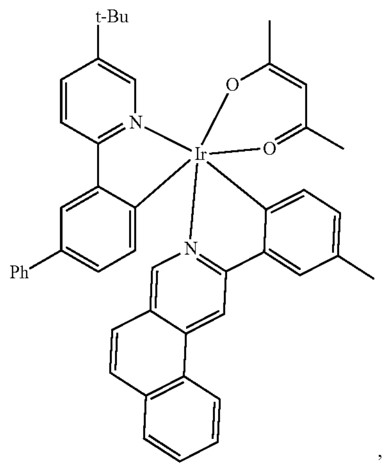
,
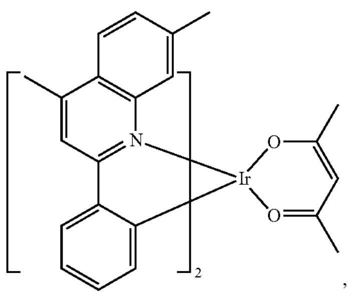
,
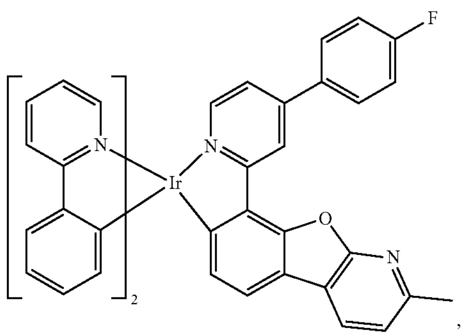
,
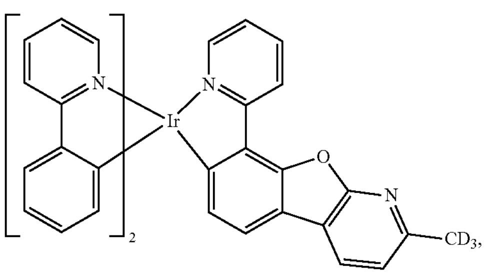
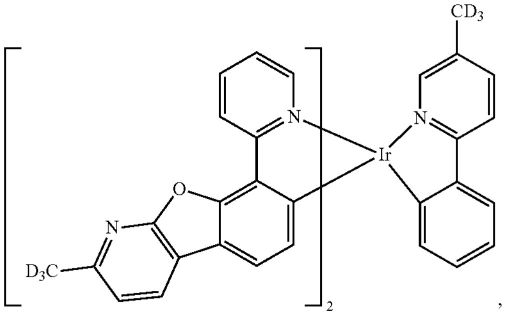
,
-continued
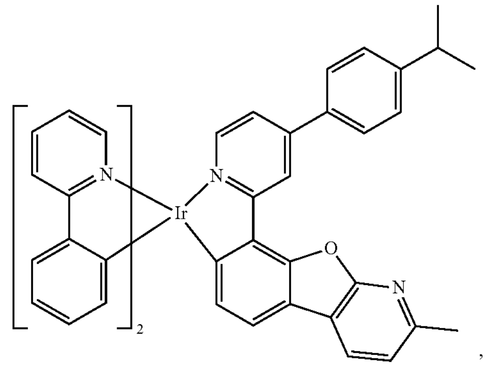
,
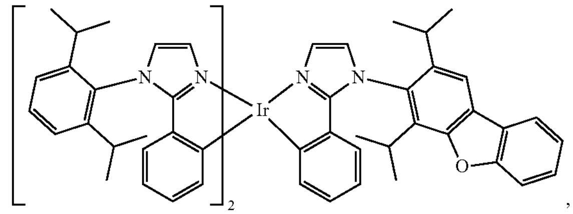
,
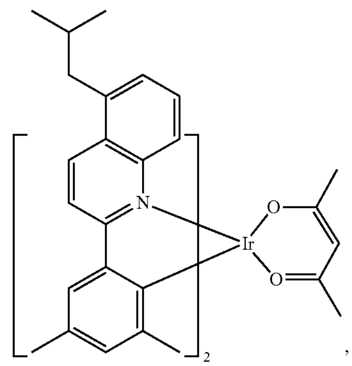
,
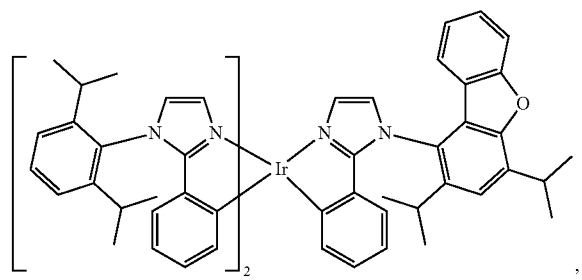
,
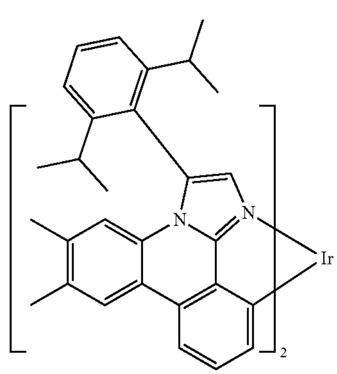

-continued
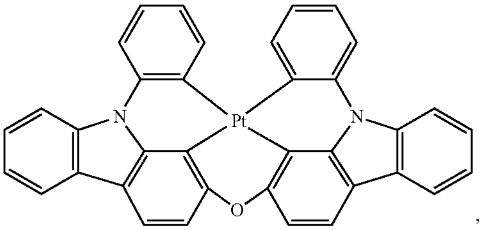
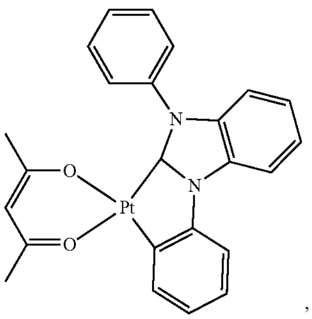
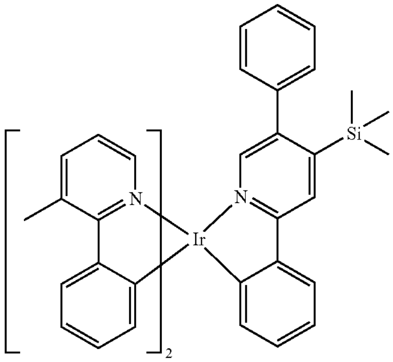
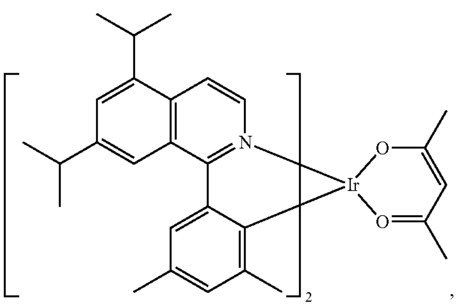
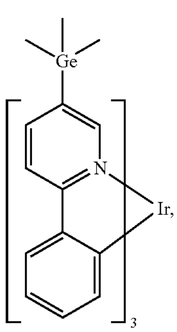
-continued
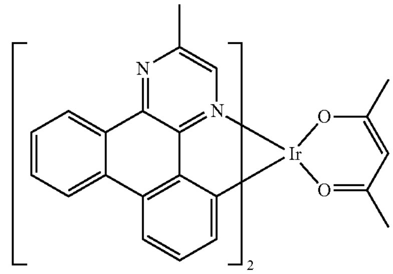
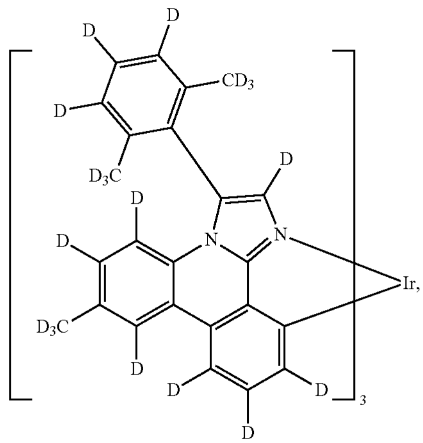
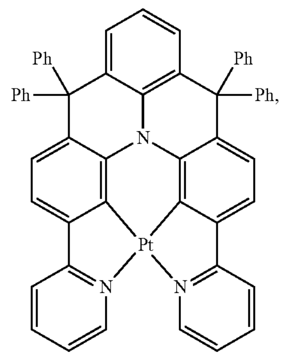
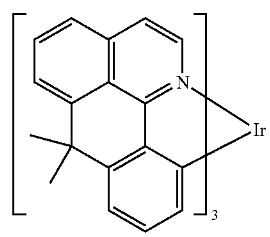
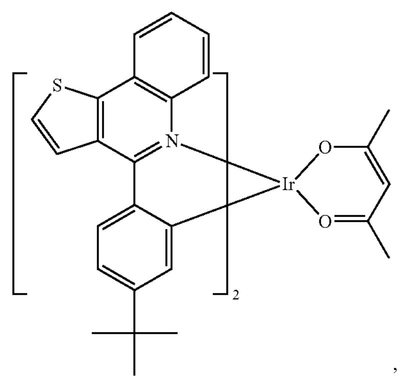
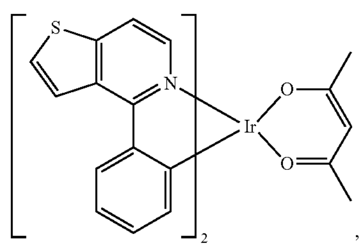

-continued
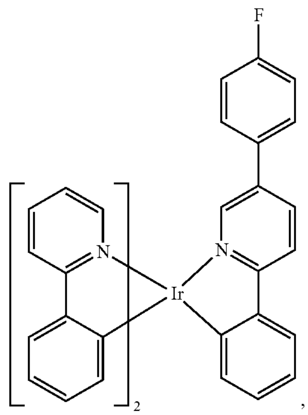
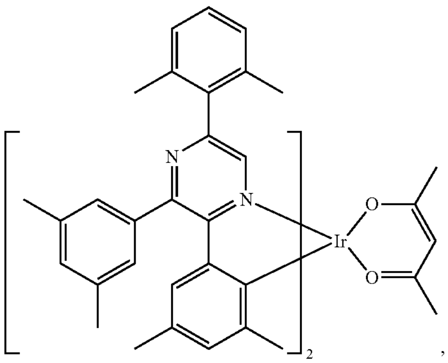
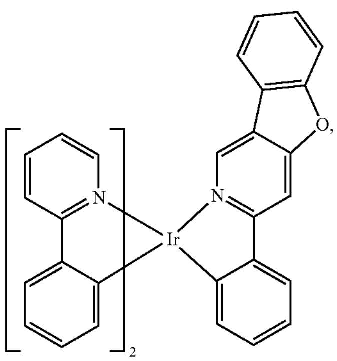
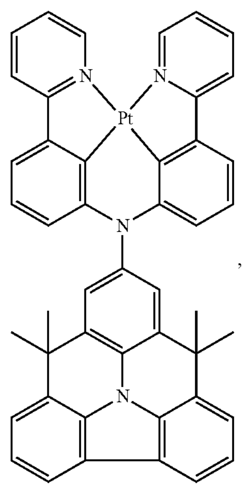
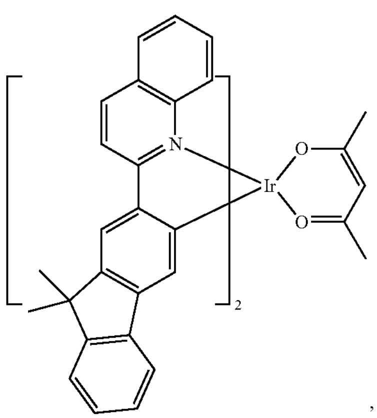
-continued
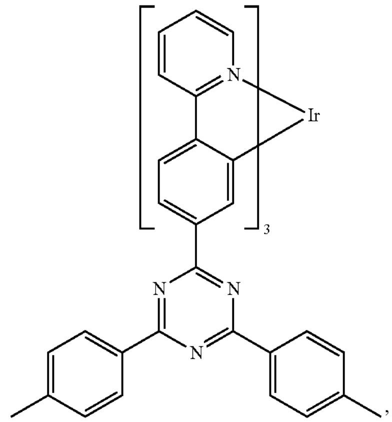
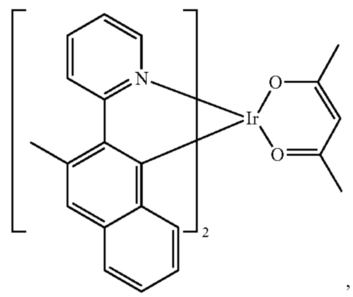
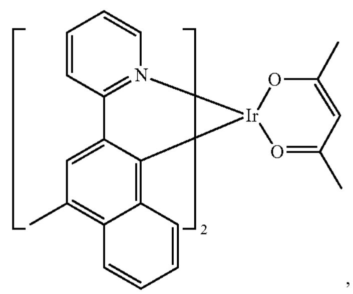
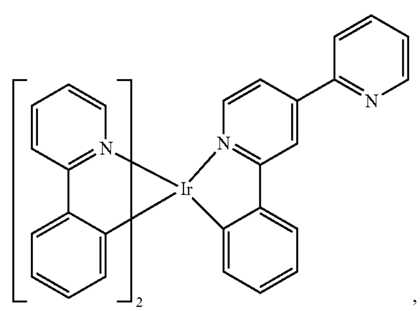
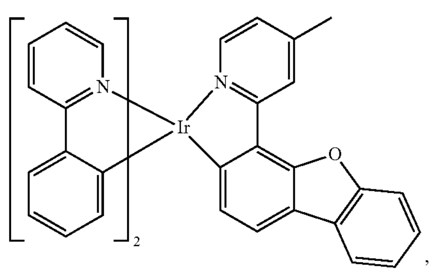

-continued
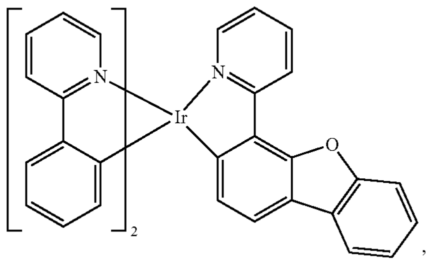
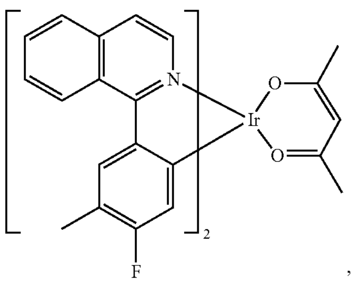
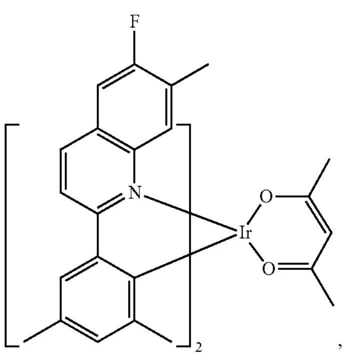
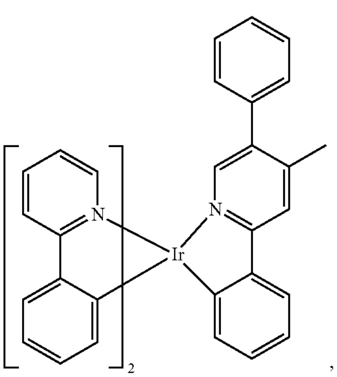
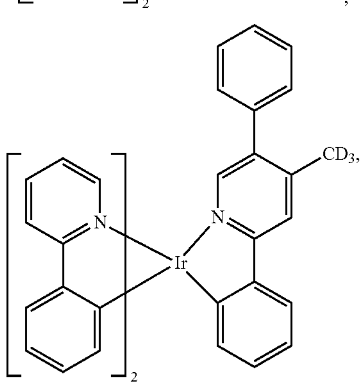
-continued
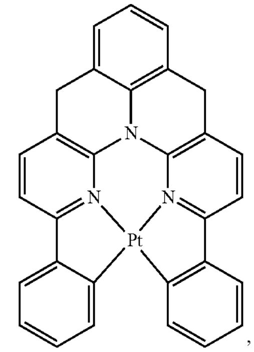
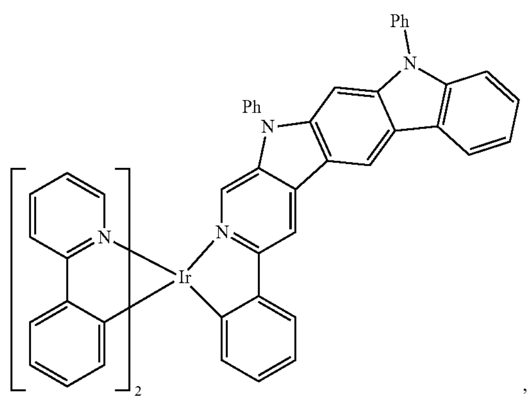
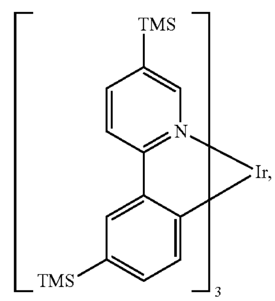
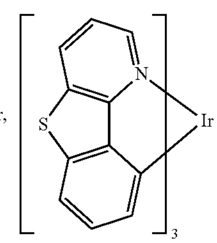
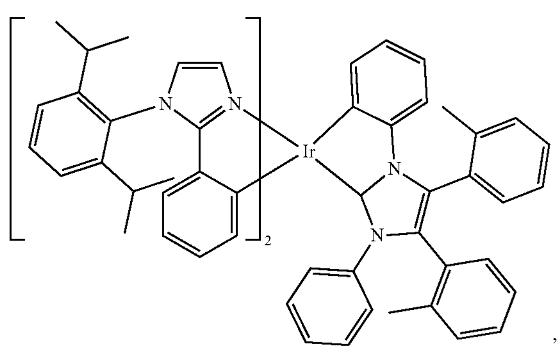
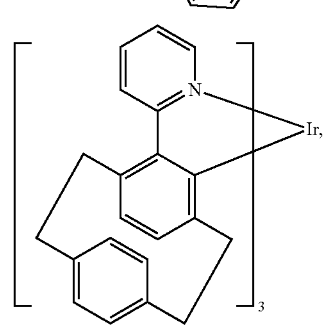

-continued
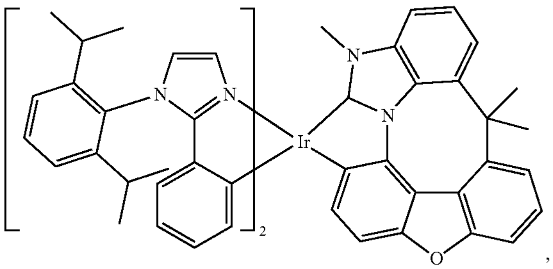
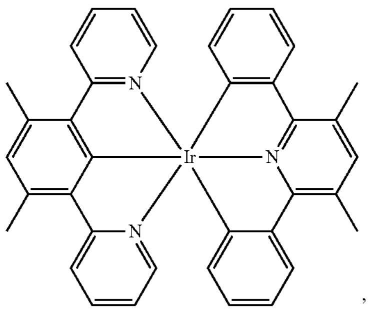
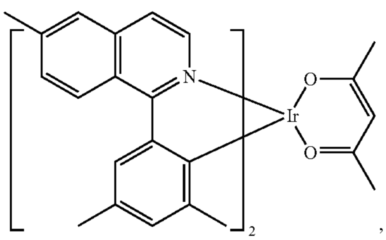
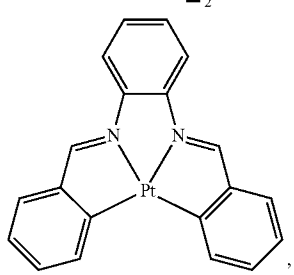
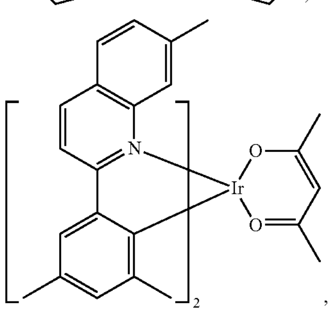
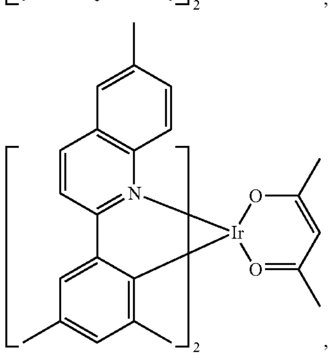
-continued
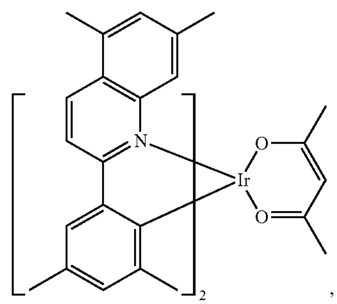
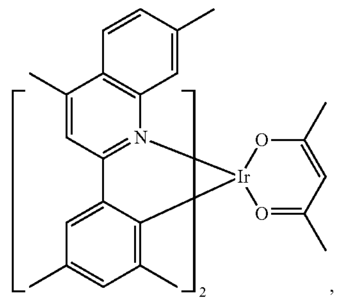
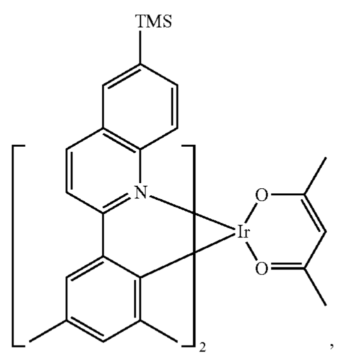
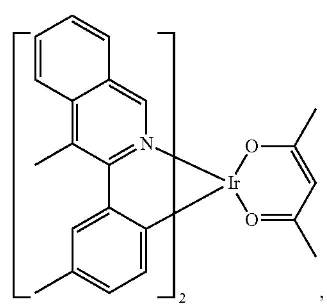
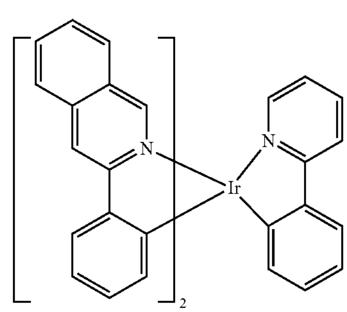

-continued
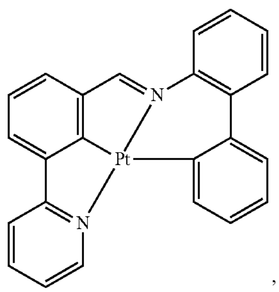
,
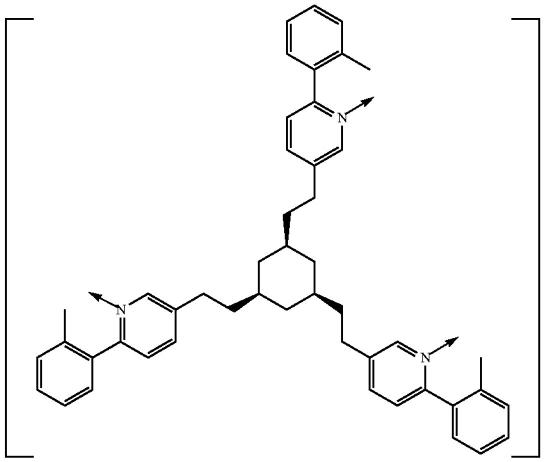
,
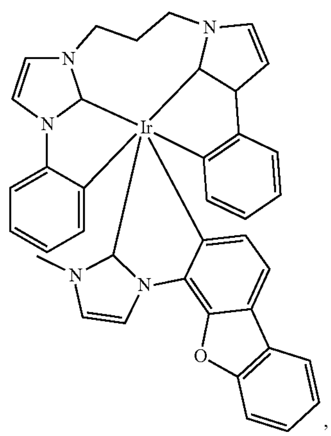
,
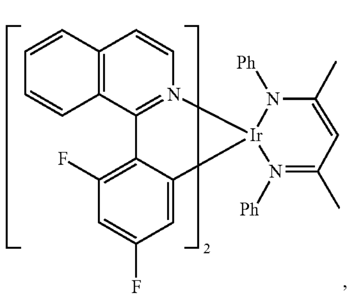
,
-continued
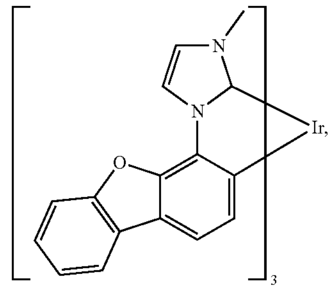
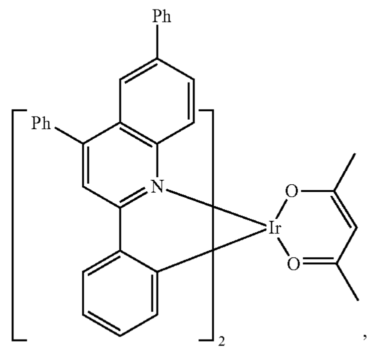
,
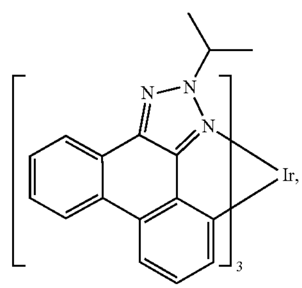
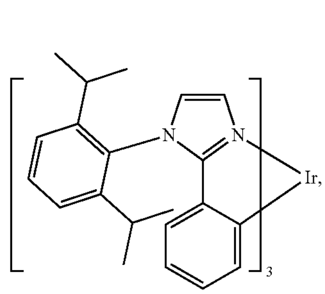
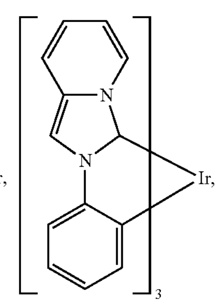
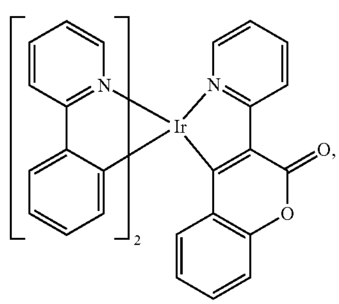

-continued

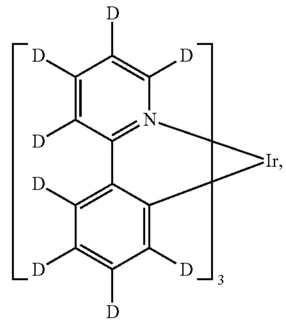

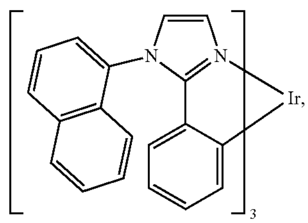

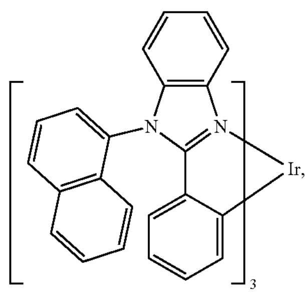

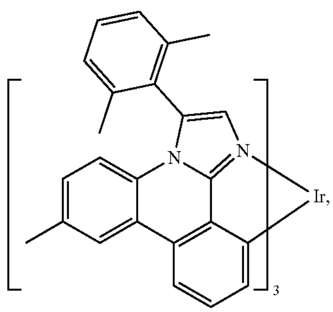

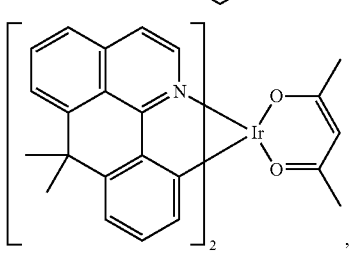

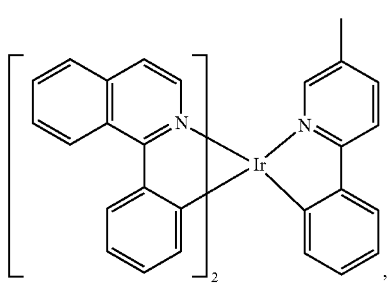

-continued

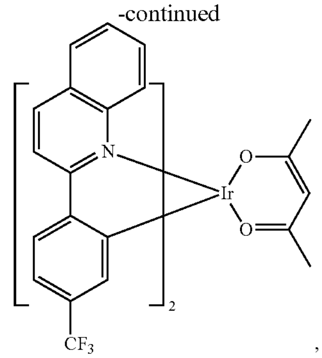

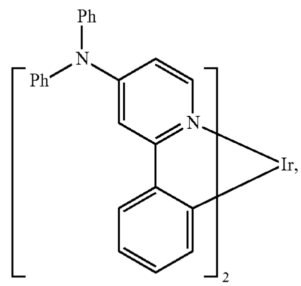

AND

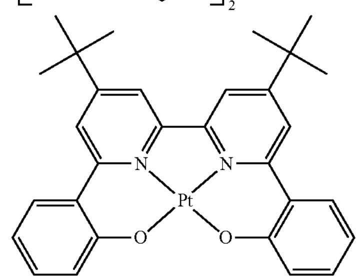

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower homo (further from the vacuum level) and/or higher triplet energy than the emitter closest to the HBL interface. In some embodiments, the HBL material has a lower homo (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

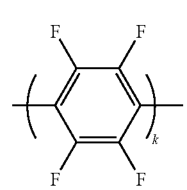

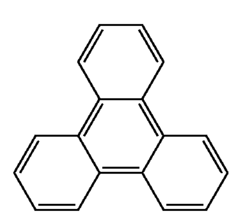

-continued

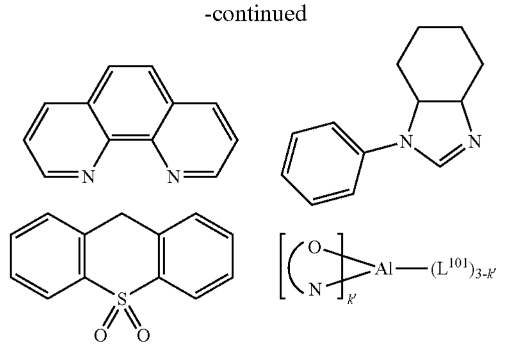

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

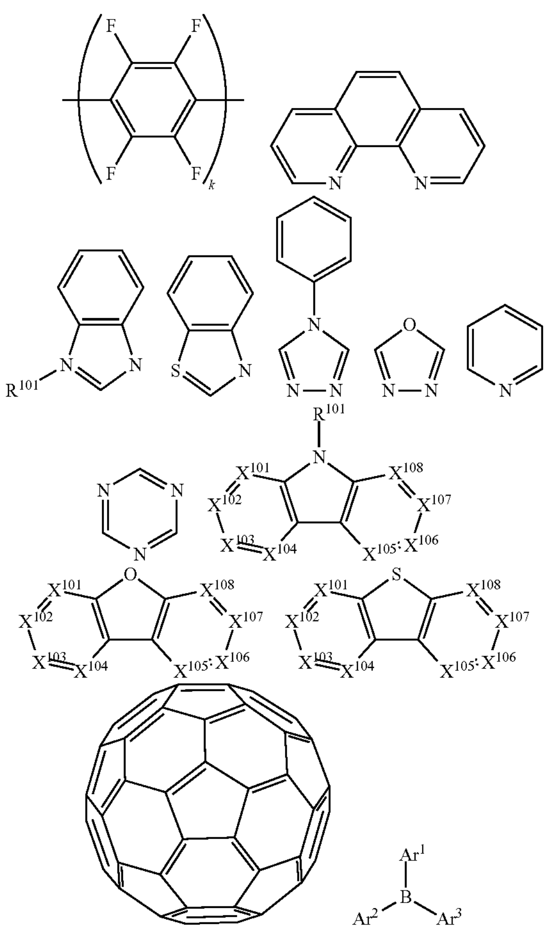

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in etl contains, but not limit to the following general formula:

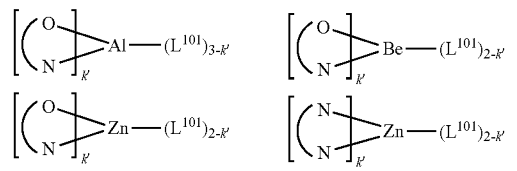

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the etl materials that may be used in an oled in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

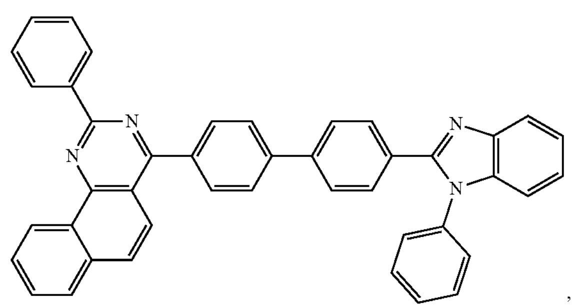

,

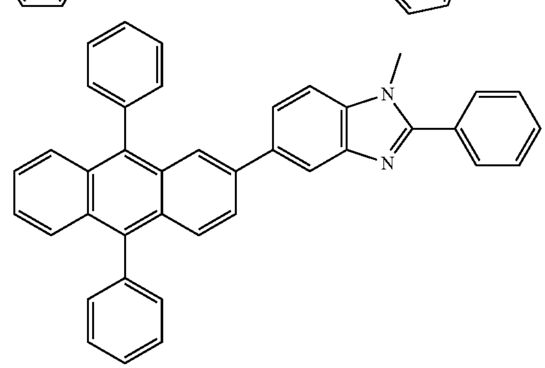

,

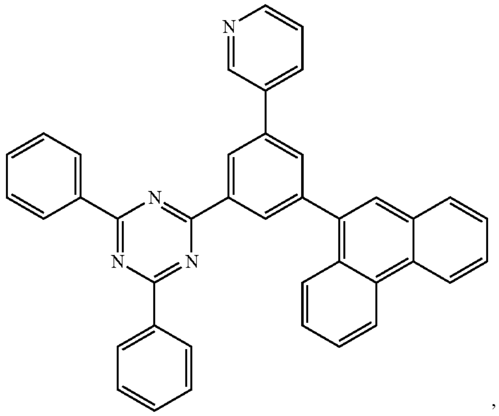
,
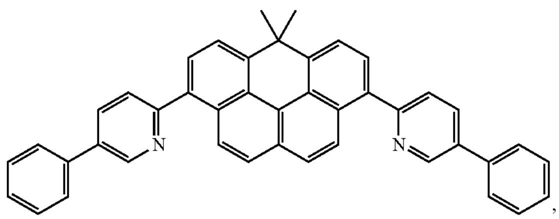
,
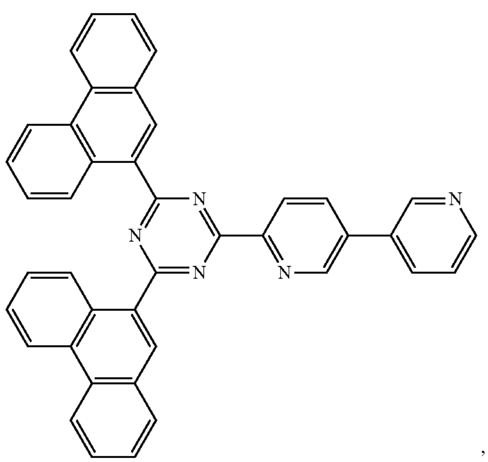
,
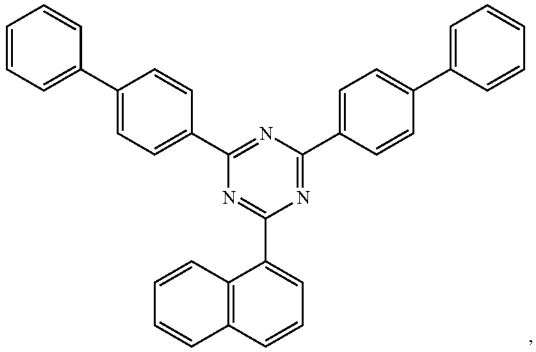
,
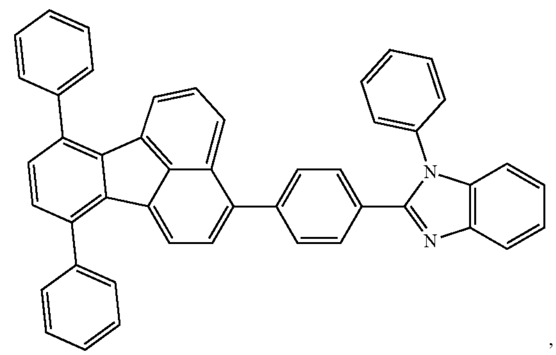
,
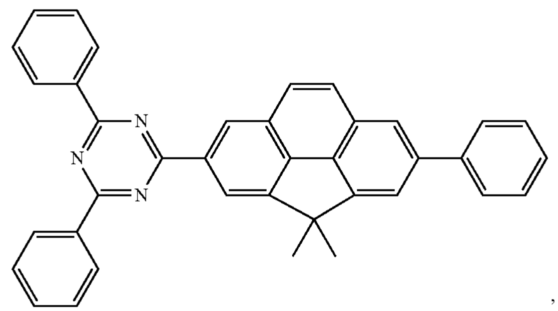
,
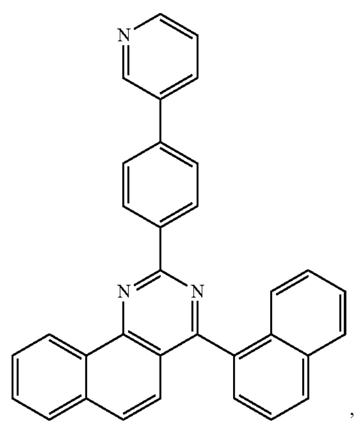
,
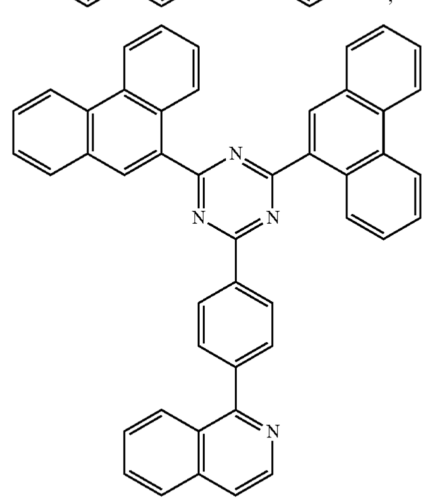
, -continued
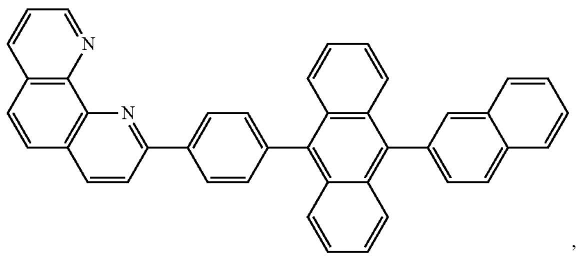
,
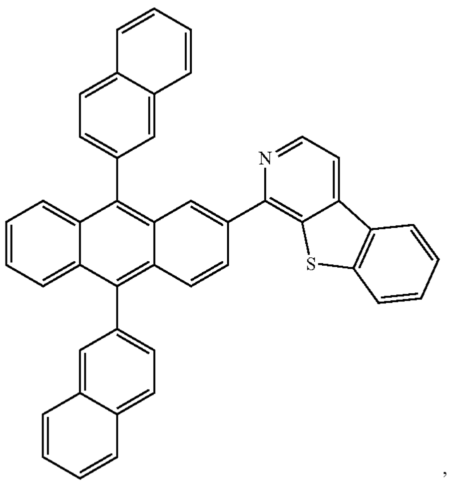
,
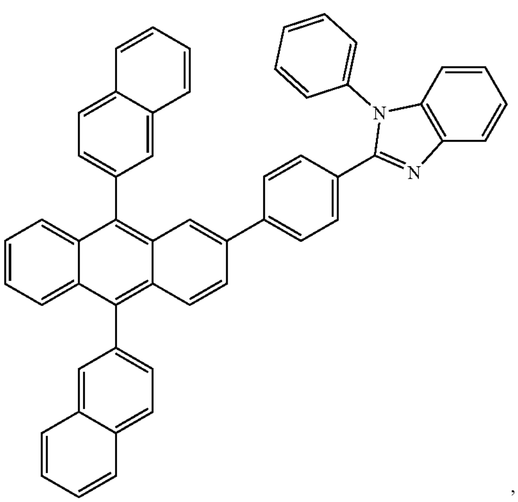
,
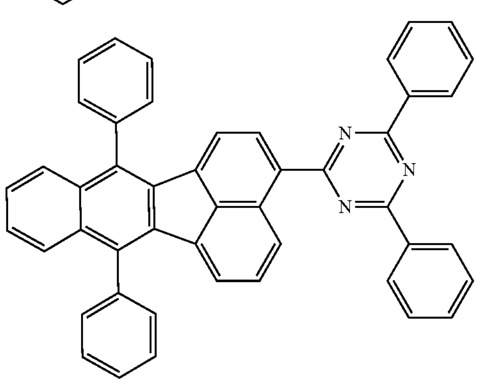
,
-continued
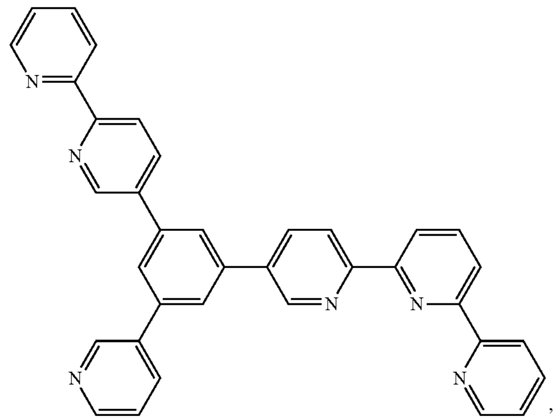
,
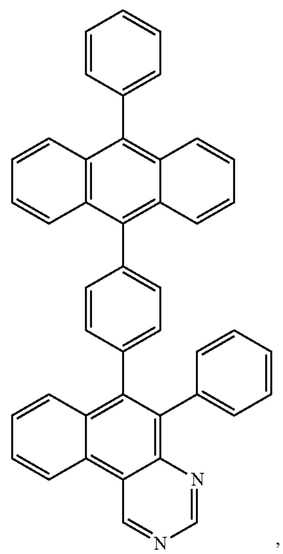
,
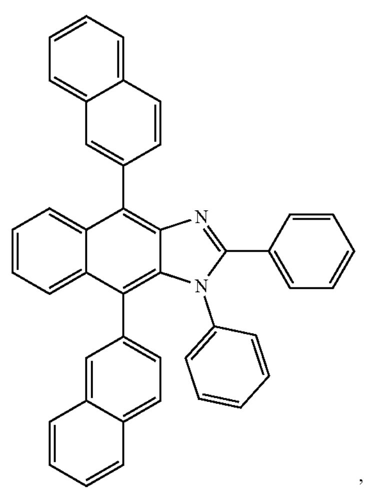
, -continued
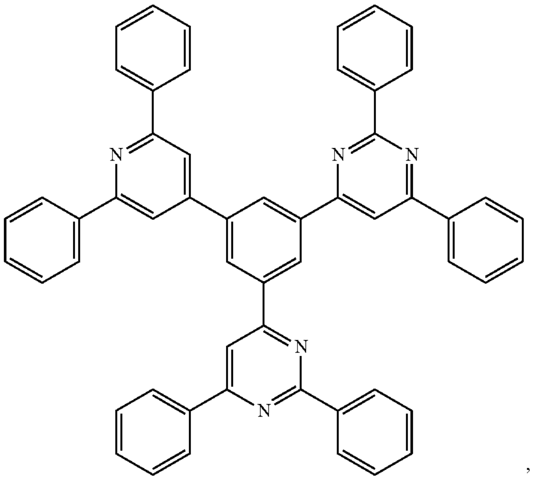
,
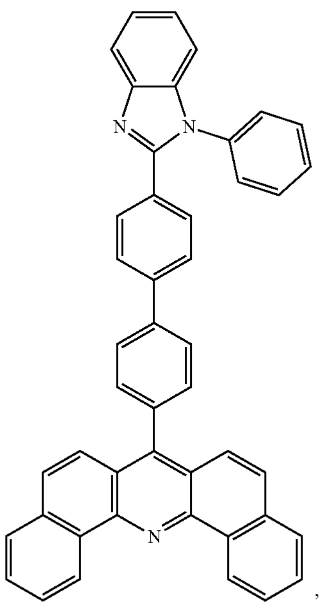
,
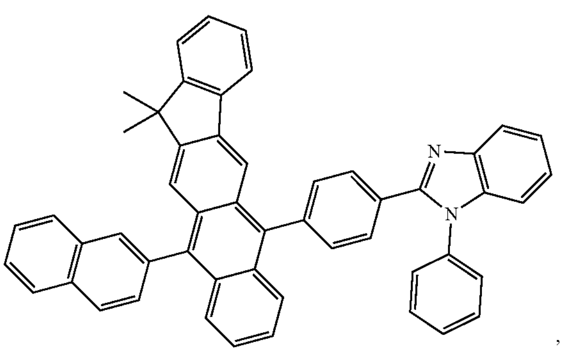
,
-continued
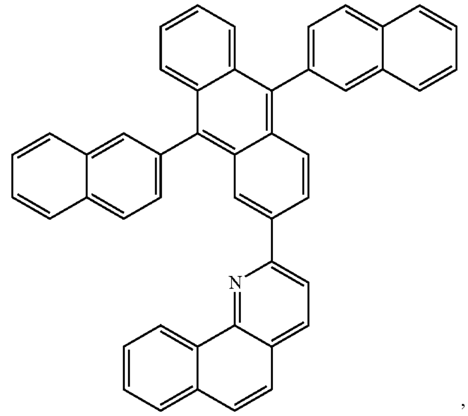
,
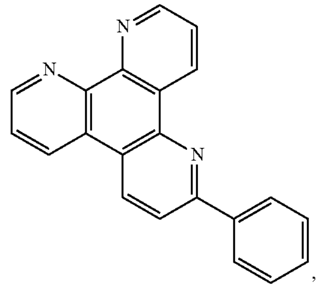
,
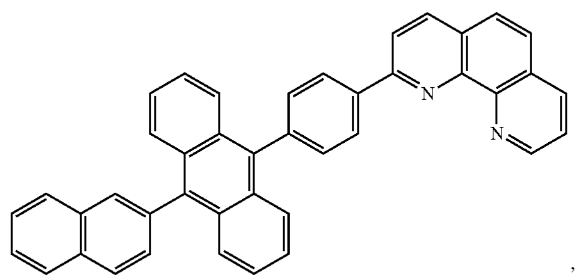
,
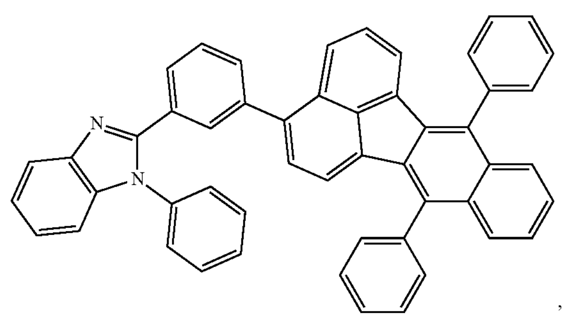
, -continued
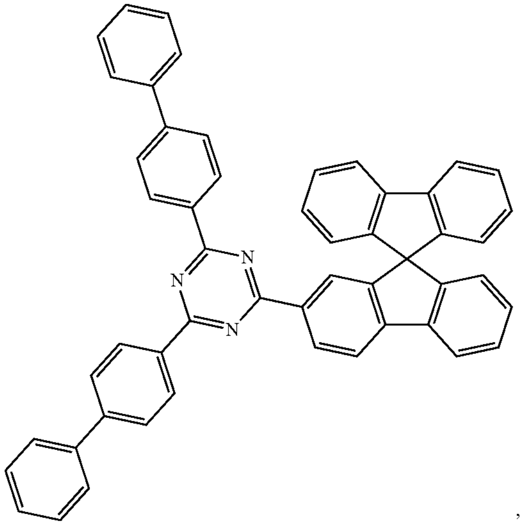
,
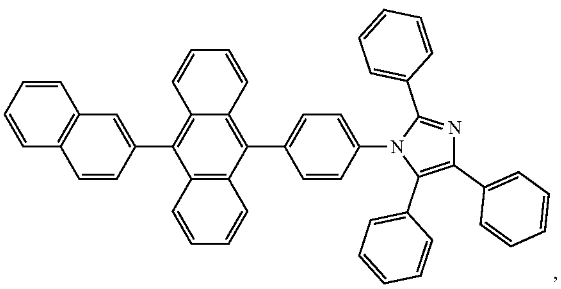
,
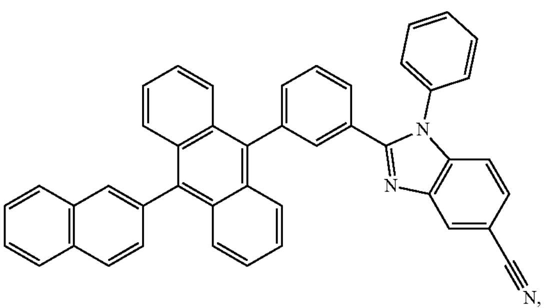
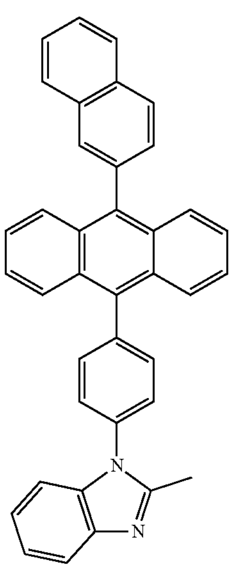
,
-continued
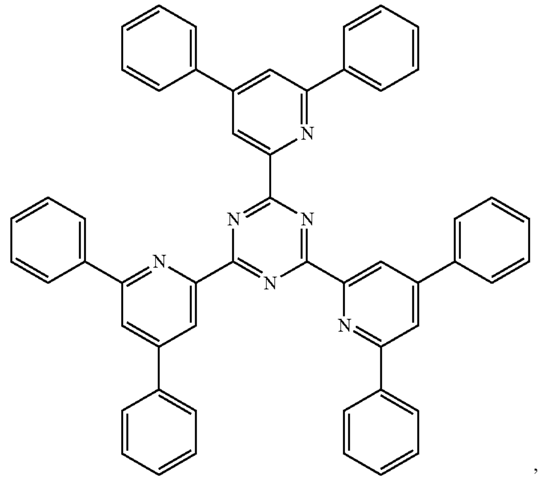
,
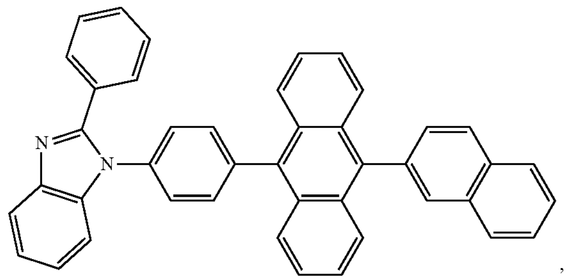
,
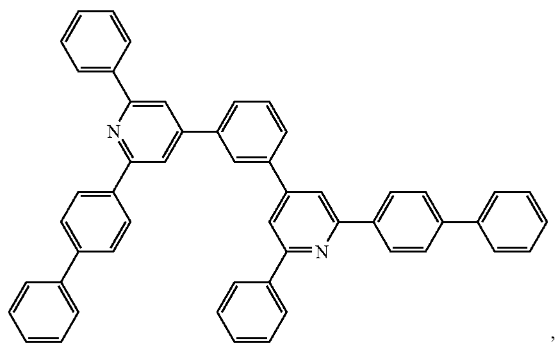
,
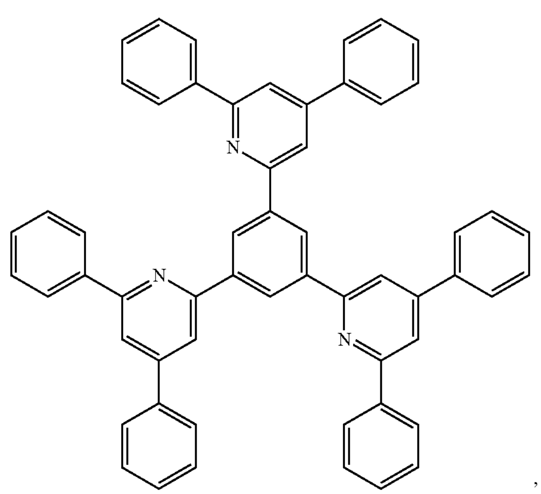
, -continued

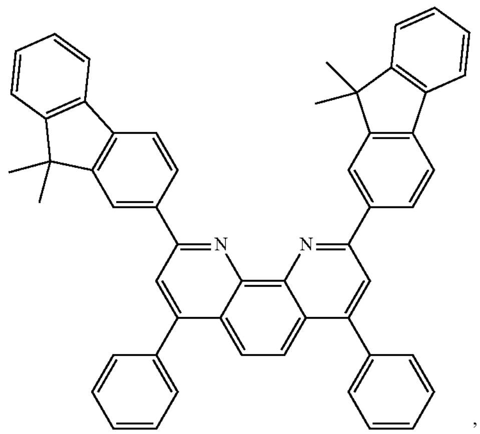

, and

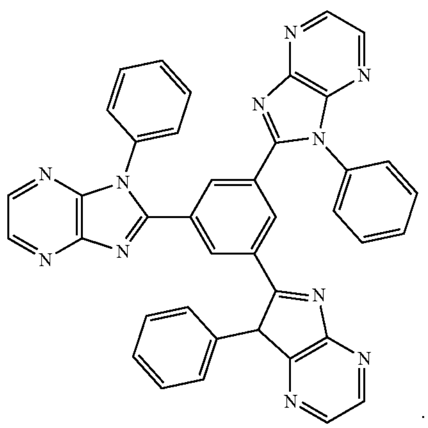

.

A particular emitter host of interest for the green and red/green sublayers of the anode-side, red/green emitting layers is indicated below as Compound A. Compound A is a relatively good hole transport material and balances the green phosphorescent dopant, which is a good electron transport material. An OLED with Compound A as a green dopant host could increase device lifetime by as much as 2× over a corresponding OLED with NPD as a green emitter host.

Compound A

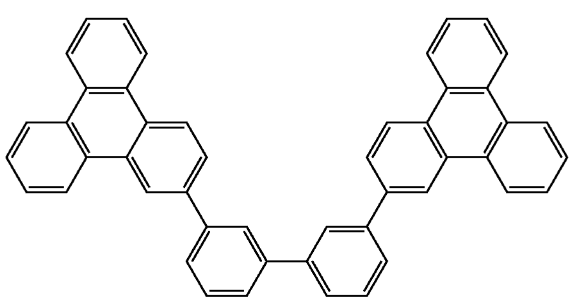

-continued

Compound B

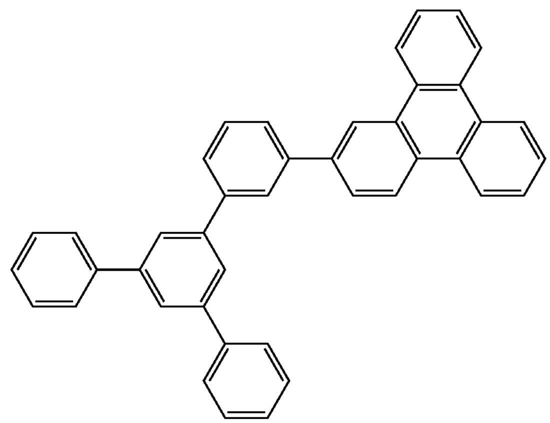

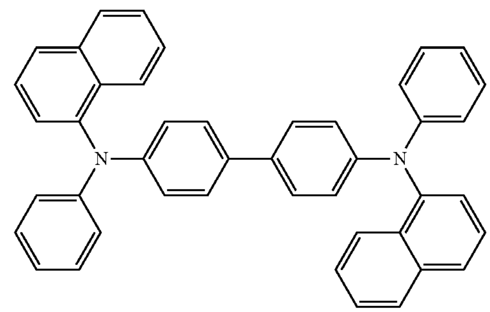

NPD

Compound C

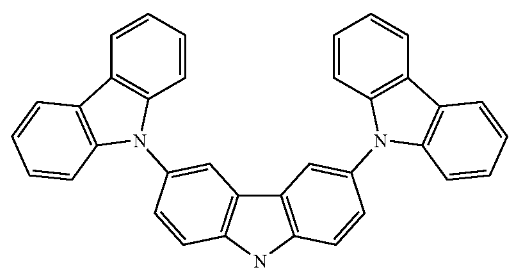

Compound D

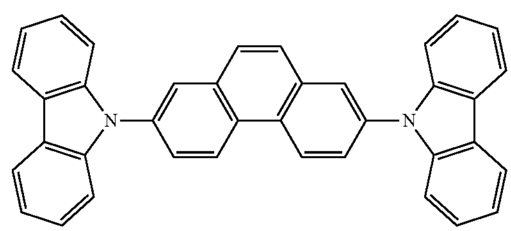

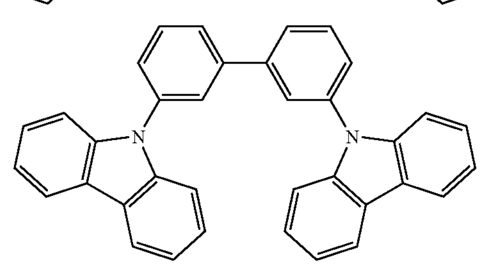

mCBP

-continued

Compound E

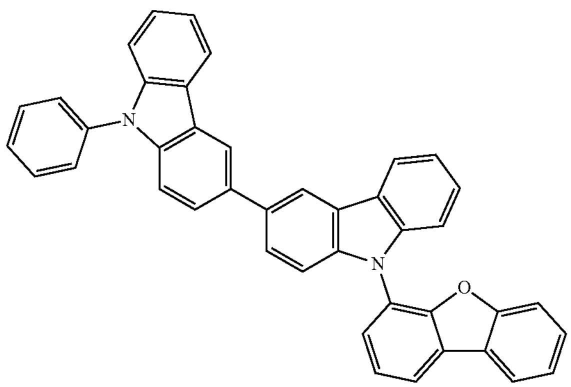

Compound F

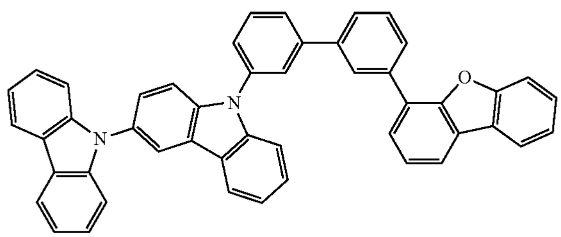

Compound G

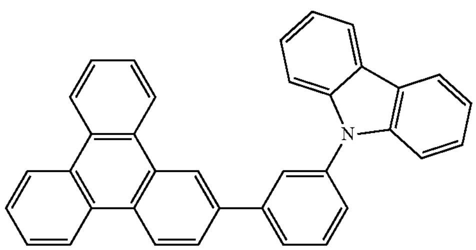

Compound H

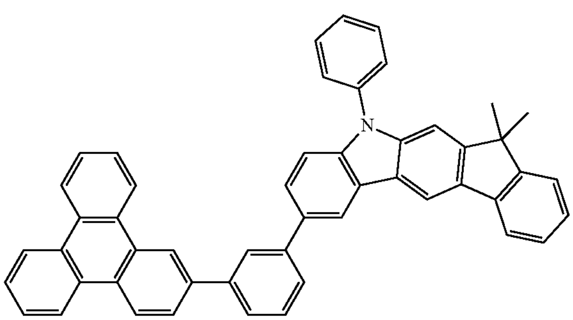

Compound I

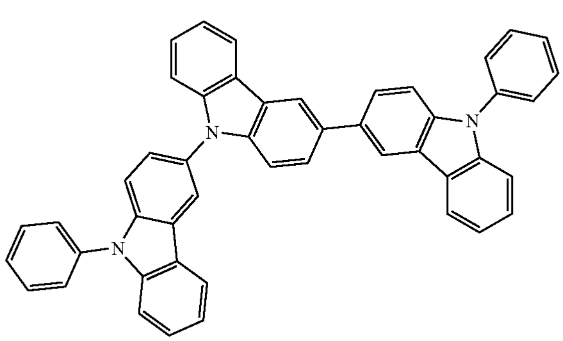

Electron transport compounds are organic compounds with relatively good electron transport properties. Electron transport layers can be intrinsic (undoped) or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-02309890 to Forrest.

The electron transport layer is selected such that electrons can be efficiently injected from the cathode into the LUMO (Lowest Unoccupied Molecular Orbital) energy level of the electron transport layer. The LUMO energy level of an organic compound is generally characterized by the electron affinity of the compound and the relative electron injection efficiency of a cathode may be generally characterized in terms of the work function of the cathode material. This means that the preferred properties of an electron transport layer and the adjacent cathode can be specified in terms of the electron affinity of the charge carrying component of the electron transport compound and the work function of the cathode material. In particular, so as to achieve high electron injection efficiency, the work function of the cathode material is preferably not greater than the electron affinity of the electron transport compound by more than about 0.75 eV, more preferably, by not more than about 0.5 eV. Similar considerations apply to any layer into which electrons are being injected.

Hole transport compounds are organic compounds with relatively good hole transport properties. A hole transport layer can be intrinsic (undoped), or doped. Doping may be used to enhance conductivity, e.g., α-NPD and TPD are examples of intrinsic hole transport layers. An example of a p-doped hole transport layer is m-MTDATA doped with F4-TCNQ at a molar ratio of 50:1, as disclosed in United States Patent Application Publication No. 2003-0230980 to Forrest et al. Preferred hole transporting compounds include aromatic tertiary amines, including but not limited to α-NPD, TPD, MTDATA, and HMTPD.

Blocking layers may be used to reduce the number of charge carriers (electrons or holes) and/or excitons that exit an emissive layer. An electron blocking layer is positioned between an emissive layer and the hole transport layer to block electrons from leaving the emissive layer in the direction of hole transport layer. Similarly, a hole blocking layer is positioned between an emissive layer and electron transport layer to block holes from leaving the emissive layer in the direction of electron transport layer. Blocking layers may also be used to block excitons from diffusing out of the emissive layer. The theory and use of blocking layers is described in more detail in U.S. Pat. No. 6,097,147 and United States Patent Application Publication No. 2003-02309890 to Forrest et al. As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer.

Cathode materials can be any know material or combination of materials known to the art for conducting electrons and injecting them into organic layers of an OLED. A cathode may be transparent or opaque, and may include a reflective layer. Metals and metal oxides are examples of suitable cathode materials. Cathode can have a thin metal (reflective) layer and a thicker conductive metal oxide layer.

In general, the portion of the cathode that is in contact with an adjacent organic layer, e.g., a thin metal layer, is preferably made of a material having a work function lower than about 4 eV (a low work function material). U.S. Pat. Nos. 5,703,436 and 5,707,745, disclose examples of cathodes including compound cathodes having a thin layer of metal such as Mg:Ag with an overlying transparent, electrically-conductive, sputter-deposited ITO layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention can be incorporated into a wide variety of electronic component modules (or units) that can be incorporated into a variety of electronic or lighting products or intermediate components of such products. Examples of such products or intermediate components include display screens, lighting devices such as discrete light source devices or lighting panels. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, a light therapy device, or a sign. Various control mechanisms may be used to control devices fabricated in accordance with the present invention, including passive matrix and active matrix.

EXPERIMENTAL

A WOLED with the following functional layers was made under vacuum ($>10^{-7}$ Torr) by thermal evaporation of the organic compounds (e.g., electron transport, hole transport, and emitter host compounds) and red, green, and blue phosphorescent dopants. The anode electrode is 150 nm of indium tin oxide (ITO). The cathode includes of LiQ, about 2 nm, as electron injection layer (EIL) and Al, 100 nm. All devices were encapsulated with a glass lid sealed with an epoxy resin in a nitrogen glove box (less than 1 ppm of $H_2O$ and $O_2$) immediately after fabrication, and a water absorbent was incorporated inside the package.

Figure 6:
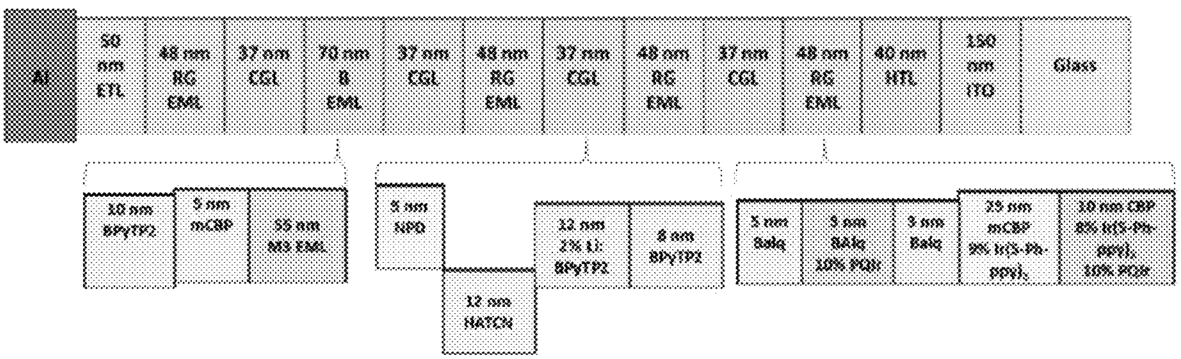
FIG. 6 is a schematic representation of an OLED of the invention.
Figure 7A:
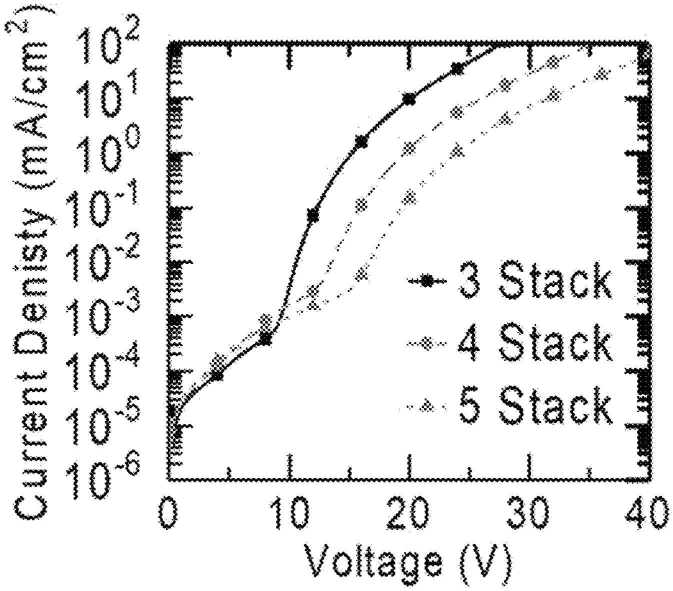
FIG. 7A is a plot of current density-voltage characteristics of an OLED with a stacked emitting layer structure of the FIG. 6 OLED (5 emitting layers, shown) as well a similar inventive OLED stacks with two anode side, hybrid red/green layer (4 emitting layers), and one anode red/green layer (3 emitting layers).
Figure 7B:
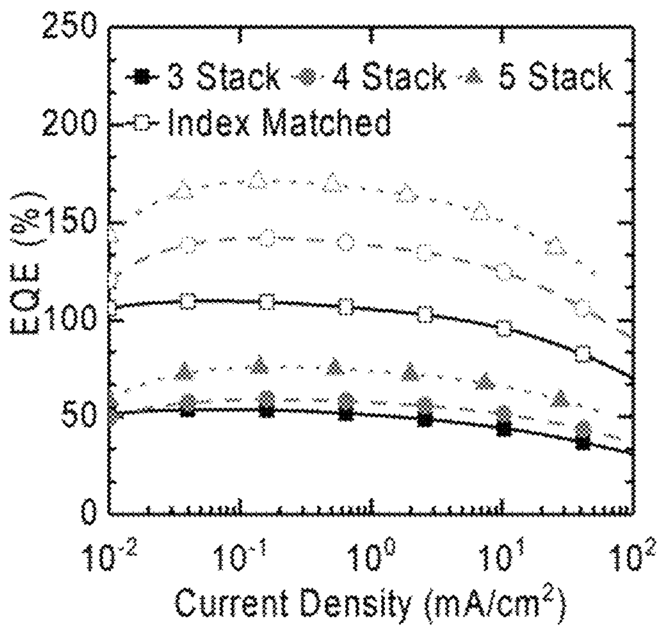
FIG. 7B is a plot of the external quantum efficiency vs. current density with and without index matched outcoupling between the substrate and the detector for the OLEDS of FIG. 7.

The WOLED includes the following functional stacks, sequentially, from the ITO surface: 10 nm HATCN/30 nm NPD (as hole injection and transport layer)/RG/CGL/RG/CGL/RG/CGL/Blue/CGL/RG/50 nm BPyTP2 (as electron transport layer). See FIG. 6. Each of the RG emitting layers is a hybrid red/green emitting layer described herein, and each of the charge generating layers, are identical—having the same functional and compositional sublayers and approximate thickness.

The hybrid red/green emitting layer structure (RG) is as follows (beginning from the anode side): 10 nm of admixed 10% PQIr/8% Ir(5-Ph-ppy)$_3$ in mCBP/25 nm of 9% Ir(5-Ph-ppy)$_3$ in mCBP/3 nm BAlq/5 nm 10% PQIr in BAlq/5 nm BAlq.

The blue emitting layer structure is: 50 nm of gradient profile fac-Ir(dmp)$_3$ (18% to 8% beginning from the anode side) in mCBP, and within this 50 nm layer an approximate 20 nm to 30 nm includes mer-Ir(pmp)$_3$ as manage dopant/5 nm 8% fac-Ir(dmp)$_3$ in mCBP/5 nm mCBP/10 nm BPyTP2. The relatively stable blue phosphorescent dopant, iridium (III)-tris[3-(2,6-dimethylphenyl)-7-methylimidazo[1,2-f] phenanthridine][ft(dmp)$_3$], and the host, 4,4'-bis[N-(1-naphthyl)-N-phenyl-amino]-biphenyl (mCBP) having $T_1$, the lowest triplet state energies of 2.7 eV and 2.8 eV, respectively. The blue emissive dopant is managed by the dopant, mer-Ir(pmp)$_3$.

The charge generating layer structure is: 8 nm BPyTP2/12 nm BPyTP2 in Li 1:1 molar/12 nm HATCN/5 nm NPD. Percentages refer to volume percent.

A second WOLED with two anode-side red/green emitting layers was made as well as a third WOLED with one anode-side red/green emitting layer. See, comparative performance data in FIGS. 7 to 11.

The following performance characteristics are representative of the device described, however some variation in all characteristics (voltage, efficiency, lifetime, etc.) is expected if there is variation or error in layer thicknesses, etc. due to the complexity of the device structure. The current density-voltage and external quantum efficiency characteristics are given in FIGS. 7A and 7B, respectively. As indicated, additional anode side, hybrid red/green emitting layers (two and three anode-side red/green emitting layers) increase the voltage at 1 mA/cm$^2$ by 4.3±0.2 V per layer, which is within error of the voltage of a single anode-side red/green emitting layer device. The voltage data indicates that the charge-generating layer operating voltage is similar to injection from conventional contacts. The maximum EQE of the five emitting layer OLED (three anode-side red/green) is 75% without outcoupling and 172% with substrate mode outcoupling. Moreover, the average EML EQE without outcoupling is 15%. Considering the maximum EQE of the blue emitting layer is approximately 10%, one can estimate the internal quantum efficiency of the stacked hybrid red/green emitting layers to be greater than 80%.

Figure 8A:
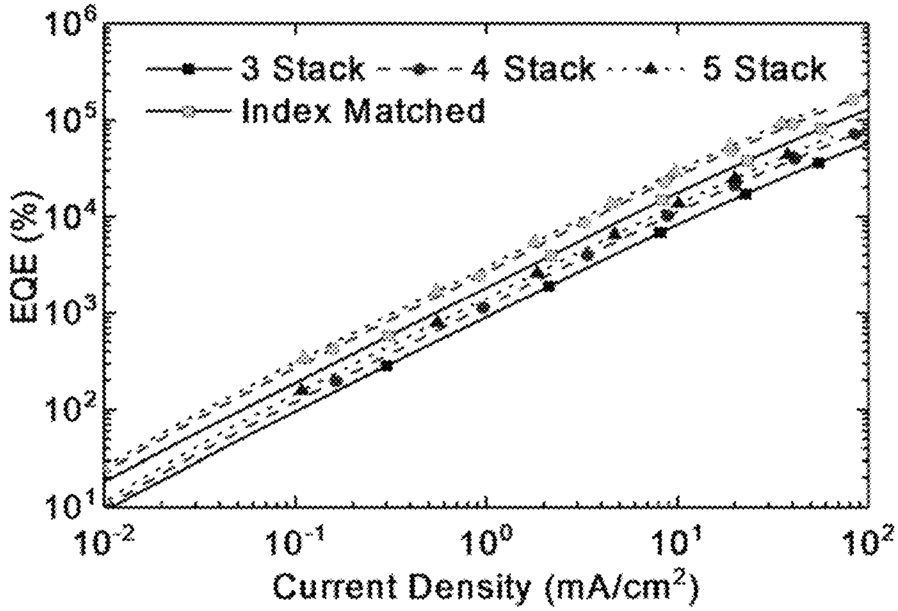
FIG. 8A are plots of current density vs. luminance with and without substrate mode out coupling for the OLEDs of FIG. 7.
Figure 8B:
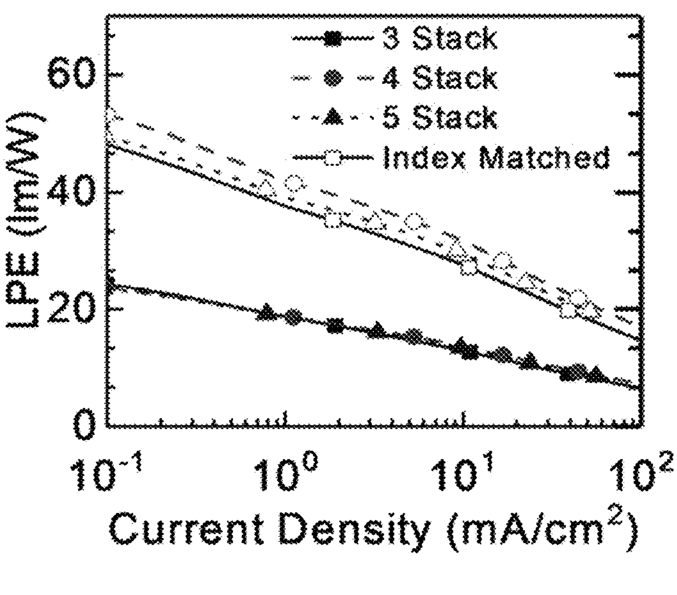
FIG. 8B is a plot of luminous power vs. current density with and without outcoupling for the OLEDs of FIG. 7.

FIGS. 8A and 8B indicate that the inventive OLEDs have a luminance greater than 200,000 cd/m$^2$ are achievable with outcoupling at currents of less than 100 mA/cm$^2$. Moreover, power efficiencies are shown to increase from 3 emitting layers to 4 emitting layers to a maximum of 55 lm/W for the 5 layer device with the use of substrate mode outcoupling.

Figure 9:
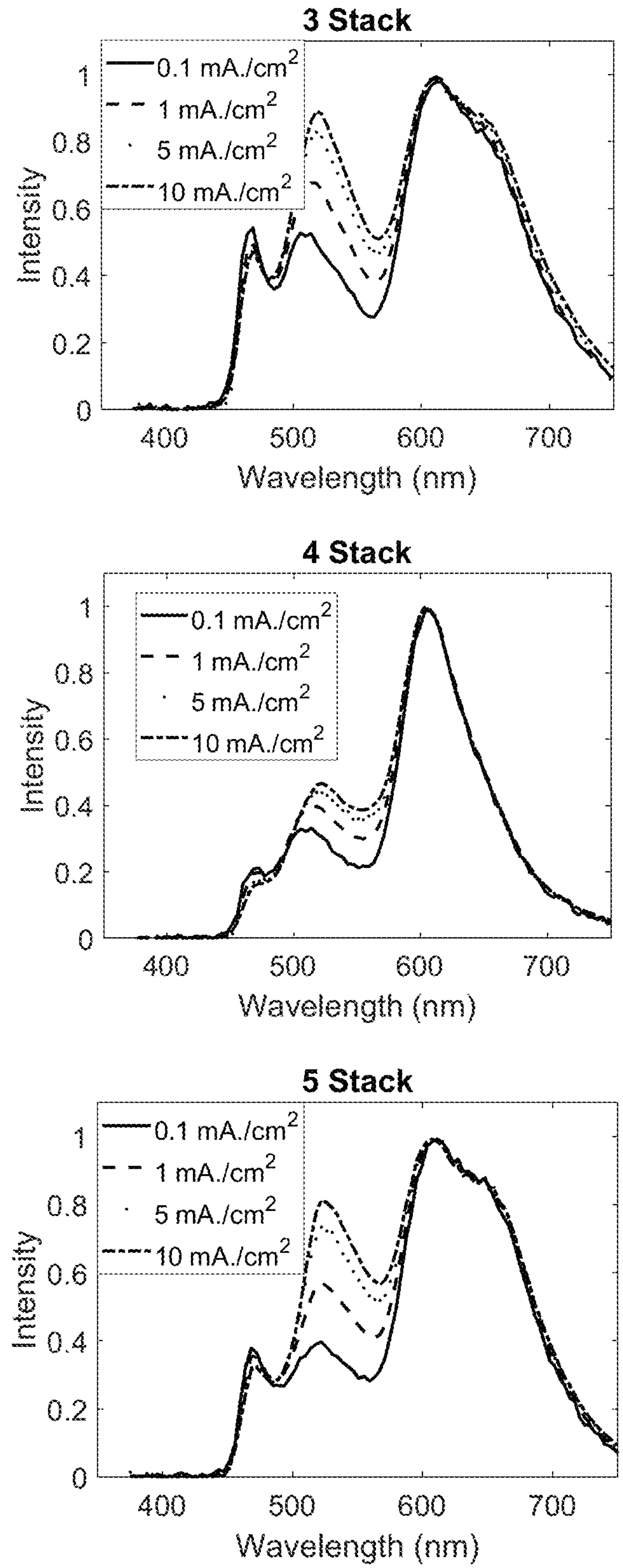
FIG. 9 are the emission spectra of a 3 layer OLED, 4 layer OLED, and 5 layer OLED of FIG. 7.

Emission spectra for OLEDs with 3 emitting layers to 4 emitting layers to 5 emitting layers are shown in FIG. 9 as a function of current density:
J=0.5 mA/cm$^2$ (solid); J=1 mA/cm$^2$ (dash); J=5 mA/cm$^2$ (dot); and J=10 mA/cm$^2$ (dash-dot). As current increases a small shift from red to green emission is observed in the 5 layer device, resulting in higher color temperature and color rendering index (CRI) at higher brightness. Color temperature and color rendering index for each device is given in Table 1 for 0.5 mA/cm$^2$<J<10 mA/cm$^2$.

TABLE 1

| | 3 layer | 4 layer | 5 layer |
|---|---|---|---|
| Color temperature | 2750-3330 | 2171-2619 | 2380-2970 |
| Color Rendering Index | 74-82 | 78-85 | 84-91 |

Figure 10A:
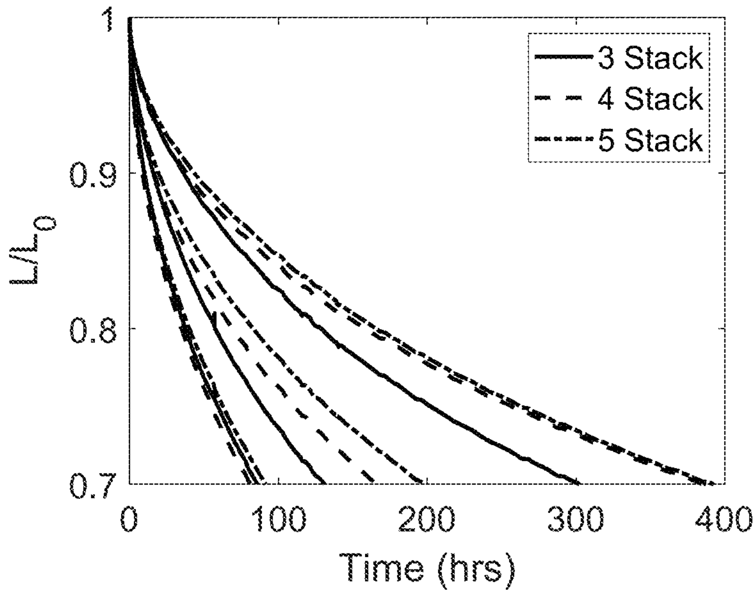
FIG. 10A is an extrapolated plot of accelerated operating lifetime data for OLEDs with 3, 4 and 5 emitting layers of FIG. 7 at different operating currents, J=10, 20, and 30 $mA/cm^2$.
Figure 10B:
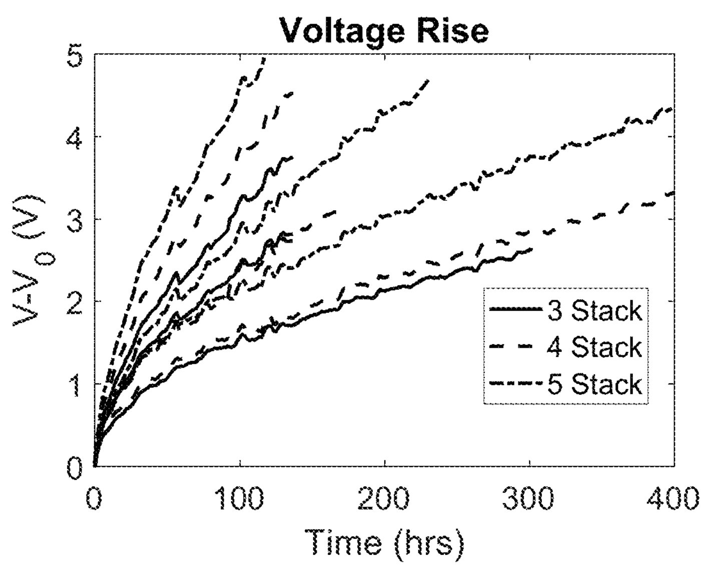
FIG. 10B is a plot of voltage rise vs. time for OLEDs with 3, 4 and 5 emitting layers of FIG. 7 at different operating currents, J=10, 20, and 30 $mA/cm^2$.

Accelerated operating lifetime data is given in FIGS. 10A and 10B. Again, OLEDs with 3, 4 and 5 emitting layers were each tested at different operating currents, J=10, 20, and 30 mA/cm$^2$. The corresponding initial luminance of each device is given in Table 2 without/with index matching outcoupling. As indicated, a decrease in lifetime luminance, and a corresponding voltage rise, is observed for each of the white OLEDs at constant operating currents of 10, 20, and 30 mA/cm$^2$. As expected, each of the devices degrade at an increased rate at higher operating current, however at each operating current the 4 layer (dash) and 5 layer (dash-dot) OLEDs exhibit greater operating lifetime than the corresponding 3 layer (solid) OLED. The dashed lines in FIG. 8A represent fitted lifetime extrapolations using a stretched exponential decay model. The voltage rise at 60 hours is approximately 10% of the operating voltage for the 5 layer device operated at 30 mA/cm$^2$.

TABLE 2

| Current (mA/cm$^2$) | 3 layer (cd/m$^2$) | 4 layer (cd/m$^2$) | 5 layer (cd/m$^2$) |
|---|---|---|---|
| 10 | 6050/13700 | 9150/22300 | 10800/26100 |
| 20 | 11200/25700 | 17100/42100 | 20000/47200 |
| 30 | 15900/36800 | 24500/60300 | 28000/66100 |

Figure 11A:
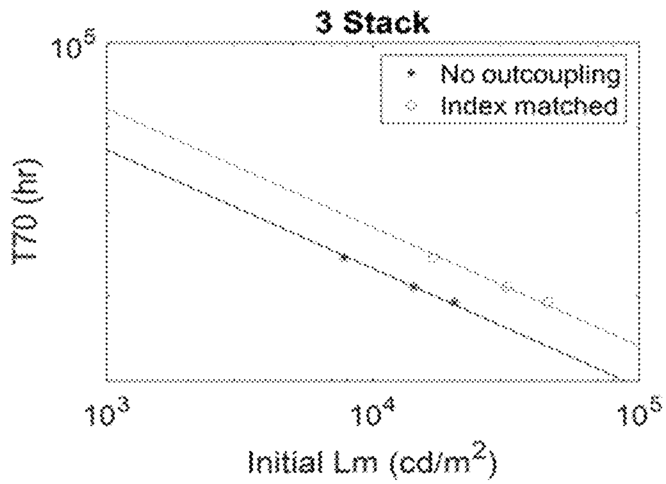
Figure 11B:
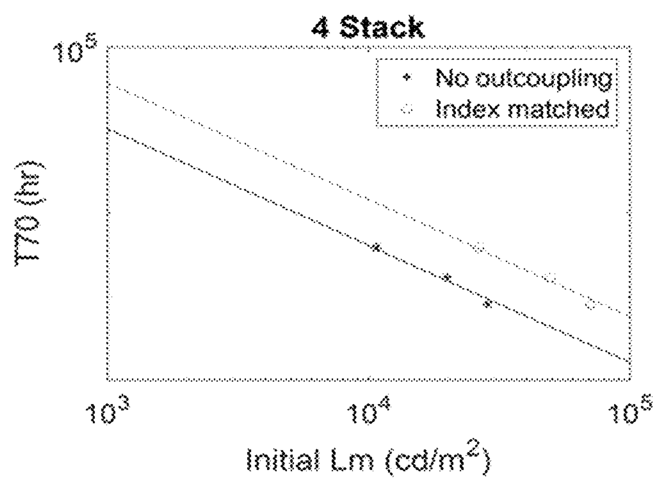
Figure 11C:
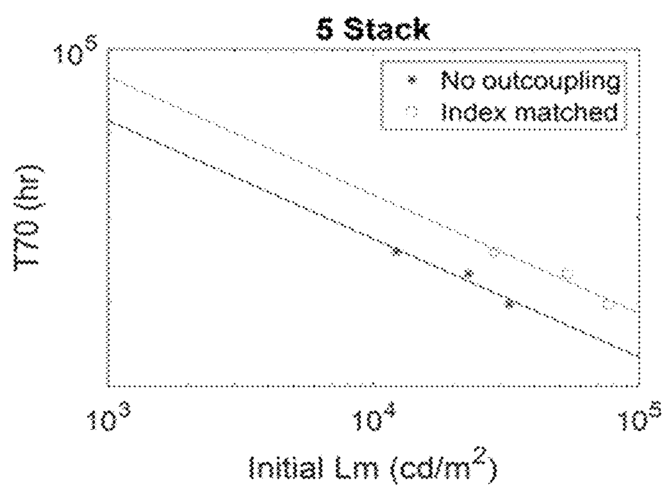

The lifetime values of FIG. 10A are extrapolated to working luminance value of 1000 cd/m$^2$ and plotted in FIGS. 11A to 11C, for each of the 3-layer, 4-layer, and the 5-layer devices, and summarized in Table 3. Extrapolated lifetime at initial luminescence of 1000 cd/m2 and 3000 cd/m$^2$ in thousands of hours for each OLED, and the 4 layer and 5 layer OLED are shown to increase from the 3 layer device.

TABLE 3

| | 3 layer (khr) | 4 layer (khr) | 5 layer (khr) |
|---|---|---|---|
| T70 (1000 cd/m$^2$) | 5.4/17 | 10/37 | 14/47 |
| T90 (3000 cd/m$^2$) | 1.1/3.4 | 2.1/7.6 | 3/10 |

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light emitting device (OLED) comprising:
a cathode and an anode;
a blue emitting layer;
at least two hybrid red/green emitting layers, wherein a first one of the at least two hybrid red/green emitting layers is disposed between the cathode and the blue emitting layer, and the second of the at least two hybrid red/green emitting layers is disposed between the blue emitting layer and the anode, wherein the OLED emits white light; and
an additional one or two hybrid red/green emitting layers disposed between the blue emitting layer and the anode, wherein a red/green charge generating layer separates each of the hybrid red/green emitting layers disposed between the blue emitting layer and the anode.

2. The OLED of claim 1, wherein the red/green charge generating layer has a cathode side with hole transport functionality, an anode side with electron transport functionality, and charge transport functionality disposed between the hole transport functionality and the electron transport functionality.

3. The OLED of claim 2, wherein the charge transport functionality includes an electron transport material doped with a metal cation selected from Group I or Group II, or $Al^{3+}$.

4. An interior or exterior lighting system that comprises the white OLED of claim 1.

5. An organic light emitting device (OLED) comprising:
a cathode and an anode;
a blue emitting layer; and
at least two hybrid red/green emitting layers, wherein a first one of the at least two hybrid red/green emitting layers is disposed between the cathode and the blue emitting layer, and the second of the at least two hybrid red/green emitting layers is disposed between the blue emitting layer and the anode, wherein the OLED emits white light; and
wherein each of the hybrid red/green emitting layers has a cathode side and an anode side, and includes a mixed red/green emitting sublayer and an adjacent green emitting sublayer, wherein the mixed red/green emitting sublayer is proximate to the anode side.

6. The OLED of claim 5, wherein the at least one of the hybrid red/green emitting layers disposed between the anode and the blue emitting layer includes a red dopant blocking sublayer positioned to the cathode side of the green emitting sublayer.

7. The OLED of claim 5, wherein the green emitting dopant is the same in the mixed red/green emitting sublayer and the green emitting sublayer.

8. An organic light emitting device (OLED) comprising:
a cathode and an anode;
a blue emitting layer; and
at least two hybrid red/green emitting layers, wherein a first one of the at least two hybrid red/green emitting layers is disposed between the cathode and the blue emitting layer, and the second of the at least two hybrid red/green emitting layers is disposed between the blue emitting layer and the anode, wherein the OLED emits white light;

further comprising a blue-cathode, charge generating layer positioned between the first hybrid red/green emitting layer and the blue emitting layer, and adjacent to and in contact with a cathode side of the blue emitting layer.

9. An organic light emitting device (OLED) comprising:
a cathode and an anode;
a blue emitting layer; and
at least two hybrid red/green emitting layers, wherein a first one of the at least two hybrid red/green emitting layers is disposed between the cathode and the blue emitting layer, and the second of the at least two hybrid red/green emitting layers is disposed between the blue emitting layer and the anode, wherein the OLED emits white light;
wherein the first hybrid red/green emitting layer has the same functional and compositional sublayers as the second hybrid red/green emitting layer.

10. An organic light emitting device (OLED) comprising:
a cathode and an anode;
a blue emitting layer;
at least two hybrid red/green emitting layers, wherein a first one of the at least two hybrid red/green emitting layers is disposed between the cathode and the blue emitting layer, and the second of the at least two hybrid red/green emitting layers is disposed between the blue emitting layer and the anode, wherein the OLED emits white light; and
wherein the OLED has two hybrid red/green emitting layers disposed between the blue emitting layer and the anode, and
wherein the OLED has a color rendering index of 78-85.

11. An organic light emitting device (OLED) comprising:
a cathode and an anode;
a blue emitting layer; and
at least two hybrid red/green emitting layers, wherein a first one of the at least two hybrid red/green emitting layers is disposed between the cathode and the blue emitting layer, and the second of the at least two hybrid red/green emitting layers is disposed between the blue emitting layer and the anode, wherein the OLED emits white light; and
wherein the OLED has three hybrid red/green emitting layers disposed between the blue emitting layer and the anode, and
wherein the OLED has a color rendering index of 84-91.

12. A stacked white-light emitting OLED comprising an anode, a cathode, and disposed between the anode and the cathode are at least two hybrid red/green emitting layers; wherein each hybrid red/green emitting layer has a cathode side and an anode side, and includes a mixed red/green emitting sublayer and an adjacent green emitting sublayer, the mixed red/green emitting sublayer proximate to the anode side.

13. The stacked white OLED of claim 12, wherein the green emitting dopant is the same in the mixed red/green emitting sublayer and the green emitting sublayer.

14. The stacked white OLED of claim 12, further comprising a blue emitting layer positioned between the two hybrid red/green emitting layers, the blue emitting layer separated from the two red/green emitting layers by charge generation layers.

15. The stacked white OLED of claim 14, wherein the hybrid red/green emitting layer proximate to the anode includes a red dopant blocking sublayer positioned to the cathode side of the green emitting sublayer.

16. The stacked white OLED of claim 14, further comprising a third hybrid red/green emitting layer positioned to the anode-side of the blue emitting layer thereby providing at least two anode side, hybrid red/green emitting layers, the two anode side red green emitting layers separated by a charge-generation layer.

17. The stacked white OLED of claim 14, wherein the blue emitting layer includes a gradient blue emitter concentration profile or a manager dopant, or a gradient blue emitter concentration profile and a manager dopant.

18. An organic light emitting device (OLED) comprising:
a cathode and an anode;
a blue emitting layer, wherein the blue emitting layer includes a gradient blue emitter concentration profile or a manager dopant, or a gradient blue emitter concentration profile and a manager dopant;
at least three hybrid red/green emitting layers, wherein one of the at least three hybrid red/green emitting layers is disposed between the cathode and the blue emitting layer, and two of the at least three red/green emitting layers are disposed between the blue emitting layer and the anode; and
a red/green charge generating layers that separates the at least two hybrid red/green emitting layers disposed between the blue emitting layer and the anode; wherein the OLED emits white light.

19. The OLED of claim 18, wherein each of the red/green emitting layers disposed between the blue emitting layer and the anode include a mixed red/green emitting sublayer, and a green emitting sublayer that is adjacent to and positioned on the cathode side of the mixed red/green emitting sublayer.

20. A stacked white-light emitting OLED comprising an anode, a cathode, and disposed between the anode and the cathode are at least two hybrid red/green emitting layers; wherein each hybrid red/green emitting layer has a cathode side and an anode side, and includes a mixed red/green emitting sublayer and an adjacent green emitting sublayer, the mixed red/green emitting sublayer proximate to the cathode side.

21. A stacked white-light emitting OLED comprising an anode, a cathode, and disposed between the anode and the cathode are at least two hybrid red/green emitting layers including a first hybrid red/green emitting layer and a second hybrid red/green emitting layer; wherein each hybrid red/green emitting layer has a cathode side and an anode side, and includes a mixed red/green emitting sublayer and an adjacent green emitting sublayer,
wherein the mixed red/green emitting sublayer of the first hybrid red/green emitting layer is proximate to the anode side, and
wherein the mixed red/green emitting sublayer of the second hybrid red/green emitting layer is proximate to the cathode side.

* * * * *